United States Patent [19]
Saitoh et al.

[11] Patent Number: 5,160,848
[45] Date of Patent: Nov. 3, 1992

[54] DEVICE FOR DETECTING THE RELATIVE POSITION BETWEEN OPPOSED FIRST AND SECOND OBJECTS

[75] Inventors: Kenji Saitoh, Yokohama; Masakazu Matsugu, Atsugi; Naoto Abe, Isehara, all of Japan

[73] Assignee: Canon Kabushiki Kaisha, Tokyo, Japan

[21] Appl. No.: 832,612

[22] Filed: Feb. 12, 1992

Related U.S. Application Data

[63] Continuation of Ser. No. 714,351, Jun. 12, 1991, abandoned, which is a continuation of Ser. No. 404,220, Sep. 7, 1989, abandoned.

[30] Foreign Application Priority Data

Sep. 9, 1988 [JP] Japan ................. 63-225801
Sep. 9, 1988 [JP] Japan ................. 63-225806
Sep. 9, 1988 [JP] Japan ................. 63-225808

[51] Int. Cl.$^5$ .......................................... G01N 21/86
[52] U.S. Cl. ................................ 250/548; 356/401
[58] Field of Search ............. 250/548, 557, 237 G; 356/400, 401

[56] References Cited

U.S. PATENT DOCUMENTS

| | | | |
|---|---|---|---|
| 4,037,969 | 7/1977 | Feldman et al. | 356/172 |
| 4,326,805 | 4/1982 | Feldman et al. | 356/399 |
| 4,360,273 | 11/1982 | Thaxter | 356/354 |
| 4,514,858 | 4/1985 | Novak | 378/34 |
| 4,539,482 | 9/1985 | Nose | 250/578 |
| 4,779,001 | 10/1988 | Makosch | 250/548 |
| 4,815,854 | 3/1989 | Tanaka et al. | 356/401 |
| 4,870,289 | 9/1989 | Sato et al. | 250/548 |

FOREIGN PATENT DOCUMENTS

56-157033 12/1981 Japan.
61-111402 6/1986 Japan.

OTHER PUBLICATIONS

Kinoshita, et al., "A Dual Grating Alignment Technique for X-Ray Lithography", J. Vac. Sci. Technol. B1(4), Oct.-Dec. 1983, pp. 1276-1279.
Itoh, et al., "Optical-Heterodyne Detection of Mask-to-Wafer Displacement for Fine Alignment", 362 Japanese Journal of Applied Physics No. 8, Parts 2, pp. L684-L686, Aug. 1986.

Primary Examiner—David C. Nelms
Attorney, Agent, or Firm—Fitzpatrick, Cella, Harper & Scinto

[57] ABSTRACT

A device, usable with first and second opposed objects each having at least one diffraction grating, for detecting a positional relationship between those objects in a direction perpendicular to the direction in which they are opposed, is disclosed. The device includes a light source for projecting light to a diffraction grating of one of the first and second objects and a first detecting system for detecting, in a first plane, first light diffracted by diffraction gratings of the first and second objects. The position of incidence of the first light on the first plane is changeable with a change in the relative position of the first and second objects in the perpendicular direction. A second detecting system detects, in a second plane, second light diffracted by a diffraction grating of the first and second objects, wherein a change in the position of incidence of the second light on the second plane due to a change in the relative position of the first and second objects in the perpendicular direction is different from the change in the position of incidence of the first light. A position detecting system detects the relative position of the first and second objects, in accordance with the detection by the first and second detecting systems; wherein the first and second lights are those lights having been diffracted, at different orders, by the same diffraction grating of one of the first and second objects.

21 Claims, 48 Drawing Sheets

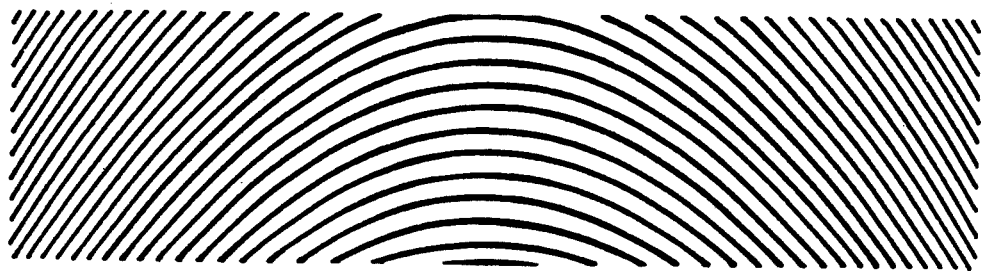
FIG. 5G
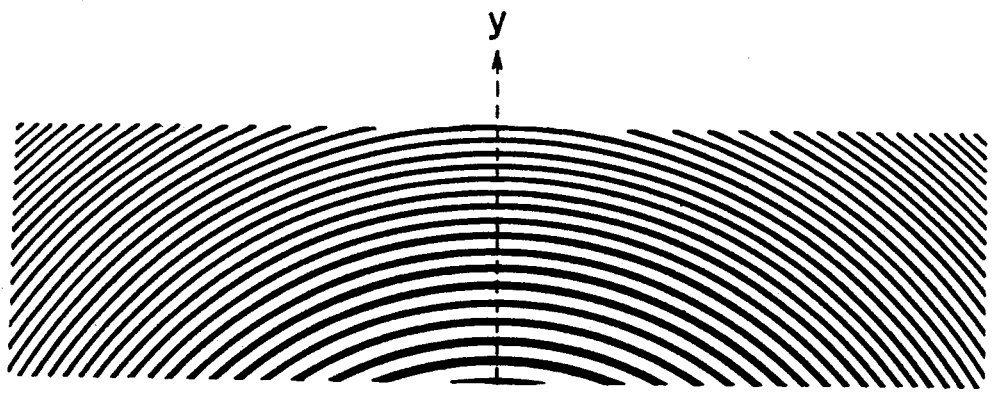
FIG. 5H
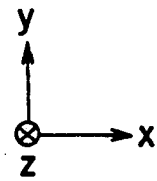

DEVICE FOR DETECTING THE RELATIVE POSITION BETWEEN OPPOSED FIRST AND SECOND OBJECTS

This application is a continuation of prior application, Ser. No. 07/714,351 filed Jun. 12, 1981, which application is a continuation of prior application, Ser. No. 07/404,220 filed Sep. 7, 1989, both now abandoned.

FIELD OF THE INVENTION AND RELATED ART

This invention generally relates to a position detecting method and apparatus suitably usable, for example, in a semiconductor microcircuit device manufacturing exposure apparatus for lithographically transferring a fine electronic circuit pattern formed on the surface of a first object (original) such as a mask or reticle (hereinafter simply "mask") onto the surface of a second object (workpiece) such as a wafer, for relatively positioning or aligning the mask and the wafer two-dimensionally or three-dimensionally, for example.

In exposure apparatuses for use in the manufacture of semiconductor devices the relative alignment of a mask and a wafer is one important factor in respect to ensuring improved performance. Particularly, as for alignment systems employed in recent exposure apparatuses, submicron alignment accuracies or more strict accuracies are required in consideration of the demand for a higher degree of integration of semiconductor devices.

In many types of alignment systems, features called "alignment patterns" are provided on a mask and a wafer and, by utilizing positional information obtainable from these patterns, the mask and wafer are aligned. As for the manner of executing the alignment, an example is a method wherein the amount of relative deviation of these alignment patterns is detected on the basis of image processing. Another method is proposed in U.S. Pat. Nos. 4,037,969 and 4,514,858 and Japanese Laid-Open Patent Application, Laid-Open No. Sho 56-157033, wherein so-called zone plates are used as alignment patterns upon which light is projected and wherein the positions of light spots formed on a predetermined plane by lights from the illuminated zone plates are detected.

Generally, an alignment method utilizing a zone plate is relatively insensitive to any defect of an alignment pattern and therefore assures relatively high alignment accuracies, as compared with an alignment method simply using a traditional alignment pattern.

FIG. 1 is a schematic view of a known type alignment system utilizing zone plates.

In FIG. 1, a parallel light emanating from a light source 72 passes through a half mirror 74 and is focused at a point 78 by a condensing lens 76. Thereafter, the light illuminates a mask alignment pattern 68a on a mask 68 and an alignment pattern 60a on a wafer 60 which is placed on a support table 62. Each of these alignment patterns 68a and 60a is provided by a reflection type zone plate and functions to form a spot of focused light on a plane perpendicular to an optical axis which contains the point 78. The amount of relative deviation of the positions of these light spots formed on that plane is detected, by directing the focused beams to a detection plane 82 by means of the condensing lens 76 and another lens 80.

In accordance with an output signal from the detector 82, a control circuit 84 actuates a driving circuit 64 to relatively align the mask 68 and the wafer 60.

The zone plates 68a and 60a of the mask 68 and the wafer 60 have focal lengths which are different from each other by an amount equal to a predetermined gap value between the mask 68 and the wafer 60, and usually the zone plate 60a of the wafer 60 has a larger focal length.

FIG. 2 illustrates an imaging relationship of lights from the mask alignment pattern 68a and the wafer alignment pattern 60a shown in FIG. 1.

In FIG. 2, a portion of the light divergently advancing from the point 78 is reflectively diffracted by the mask alignment pattern 68a and forms a spot 78a of focused light at or adjacent to the point 78, the spot representing the mask position. Another portion of the light passes through the mask 68 in the form of a zero-th order transmission light and is projected upon the wafer alignment pattern 60a on the wafer 60 surface with its wavefront being unchanged. The incident light is reflectively diffracted by the wafer alignment pattern 60a and then passes again through the mask 68 in the form of a zero-th order transmission light, and finally is focused in the neighborhood of the point 78 to form a spot 78b of focused light, representing the wafer position. In the illustrated example, when the light diffracted by the wafer 60 forms a spot, the mask 68 functions merely as a transparent member.

The position of the spot $78b$ formed by the wafer alignment pattern $60a$ in the described manner represents a deviation $\Delta\sigma$, in the plane perpendicular to the optical axis containing the point 78, of an amount corresponding to the amount of deviation $\Delta\sigma$ of the wafer 60 with respect to the mask 68.

The inventors of the subject application have found a specific problem peculiar to this alignment method. Namely, in this method, if a wafer surface is inclined with respect to a mask surface, in a certain reference surface such as the surface of a mask holder in a semiconductor device manufacturing exposure apparatus, or a ground surface on which the exposure apparatus is placed, there occurs shift of the position of center of gravity of light incident upon a sensor. Such a shift results in an alignment error.

FIG. 3 shows such a shift of the position of the center of gravity of light upon a detecting surface 127 on an occasion when a wafer 60 is inclined by an angle $\theta$. Assuming now that an alignment light passing through a mask is incident on the wafer 60 in the manner as shown in FIG. 3, and if there is an average surface inclination of an angle $\theta$ at the location of a wafer alignment mark 60', then the position of the center of gravity of light on the detecting surface 127 is at a point $P\theta$ which is displaced by an amount $\Delta\delta\theta$ from the point Po of a spot of focused light to be defined where no inclination occurs. This can be expressed by an equation:

$$\Delta\delta\theta = bw \cdot \tan 2\theta$$

Assuming now that $$\theta \approx 10^{-4} \text{ (rad)} \tag{i}$$

(a change of 100Å per a size 100 microns of a mark)

$$bw = 18.7 \text{ mm,} \tag{ii}$$

then, $$\Delta\delta\theta = 18.7 \times 10^{+3} \times 2 \times 10^{-4} = 3.74 \text{ (micron)}$$

Namely, there occurs an alignment error of 3.74 microns, and this means that the mask and the wafer cannot be aligned with a precision higher than that value.

In addition to the alignment error factors resulting, for example, from the inclination of a wafer surface having warp, distortion or the like, generally the provision of an absolute coordinate system on a sensor accompanied by setting its reference origin involves an inconvenience of great difficulty in setting such an origin with high precision. This is because of, e.g., a shift of the position of the center of gravity of light due to an uneven application of a resist, a change in the produced wavelength or output of an alignment light source or in the angle of emission of light therefrom, a change in the characteristic of a sensor used, and a change in the position of an alignment head resulting form repeated use thereof.

SUMMARY OF THE INVENTION

It is an object of the present invention to provide a position detecting method and apparatus in accordance with which error factors during detection of positional deviation in a process of aligning a first object such as a mask with a second object such as a wafer, can be removed to thereby ensure high-precision alignment of these objects.

It is another object of the present invention to provide a position detecting method and apparatus in accordance with which a signal light can be produced with a good efficiency from a light emanating from a light source and, additionally, there is no necessity of enlarging an alignment pattern region to be defined on the first or second object.

In the later part of this Specification, a term "center of gravity of light" is referred to. This term means such a point on a light receiving surface that, when in the light receiving surface a position vector of each point on that surface is multiplied by the light intensity on that point and the thus obtained products are integrated over the entire light receiving surface, the integrated value has a "zero vector". In an alternative form, the position of a peak of the light intensity may be detected as being representative.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 5G and 5H are enlarged views showing examples of patterns of physical optic elements.

FIGS. 8A-8C show a major part of a semiconductor device manufacturing exposure apparatus into which the first embodiment of the present invention is incorporated, wherein FIG. 8A is a side view and FIGS. 8B and 8C are perspective views.

DESCRIPTION OF THE PREFERRED EMBODIMENTS

Figure 1:
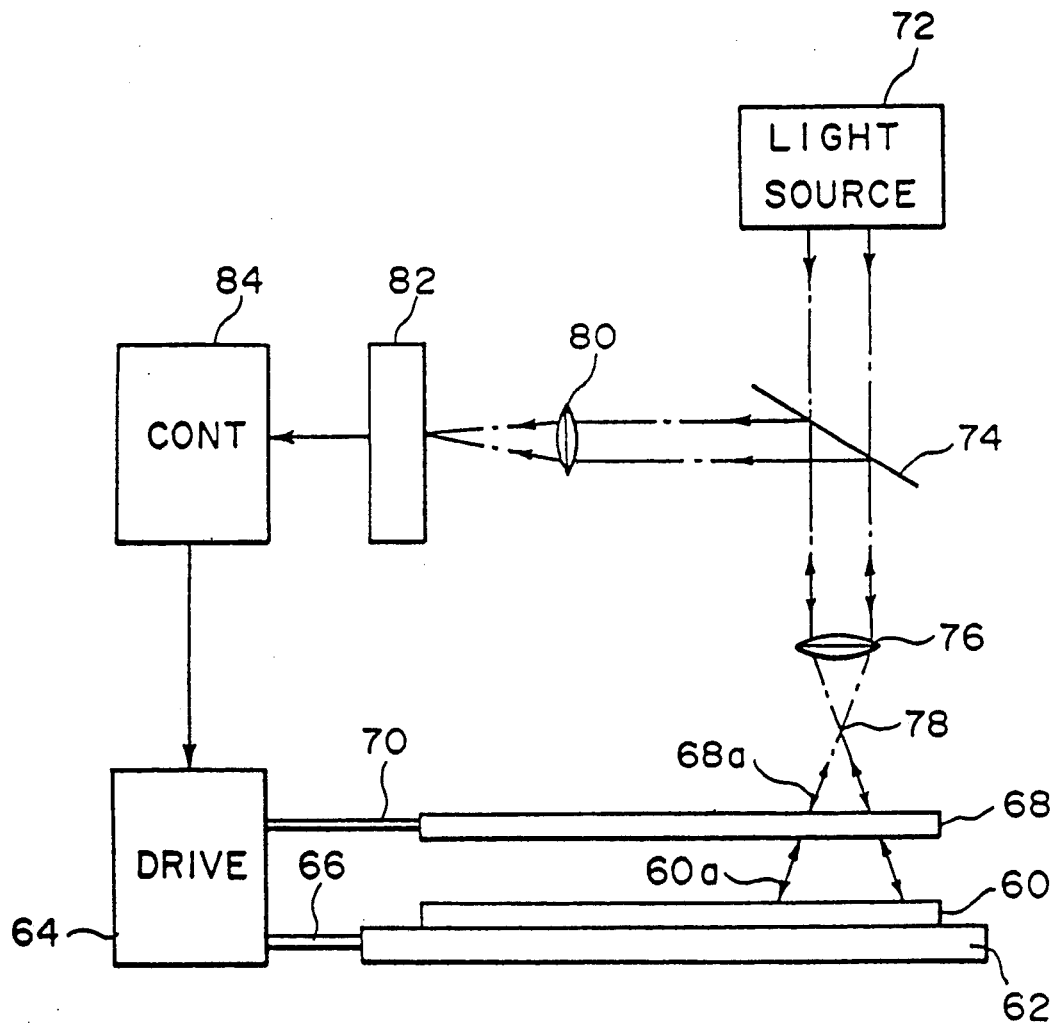
FIGS. 1-3 are schematic representations, illustrating the principle of a known type alignment system.
Figure 2:
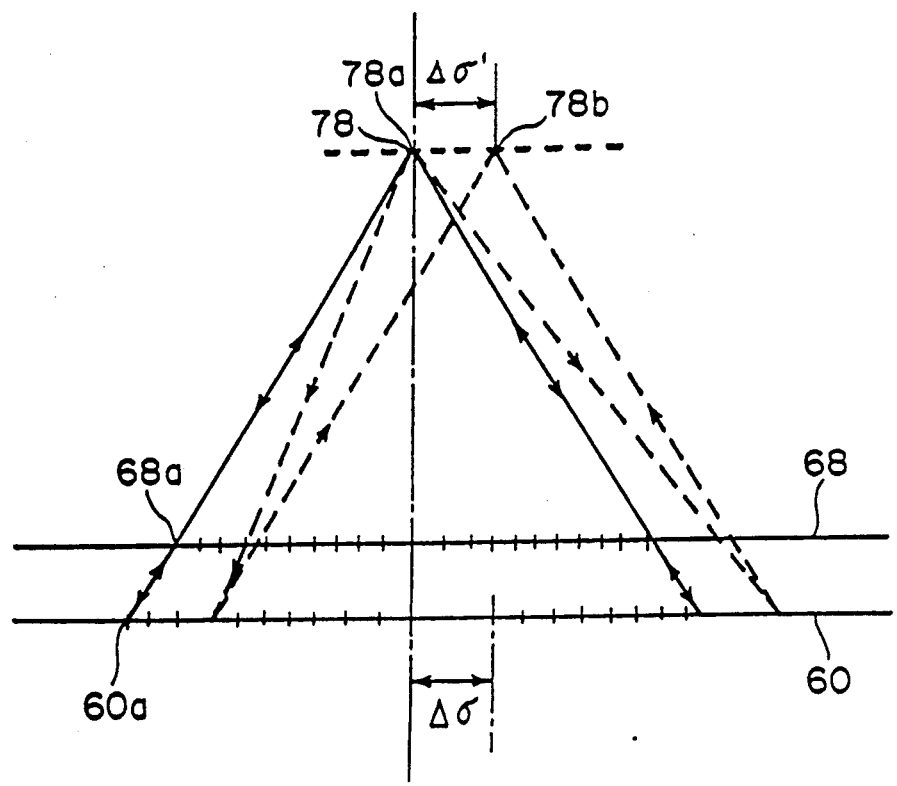
Figure 3:
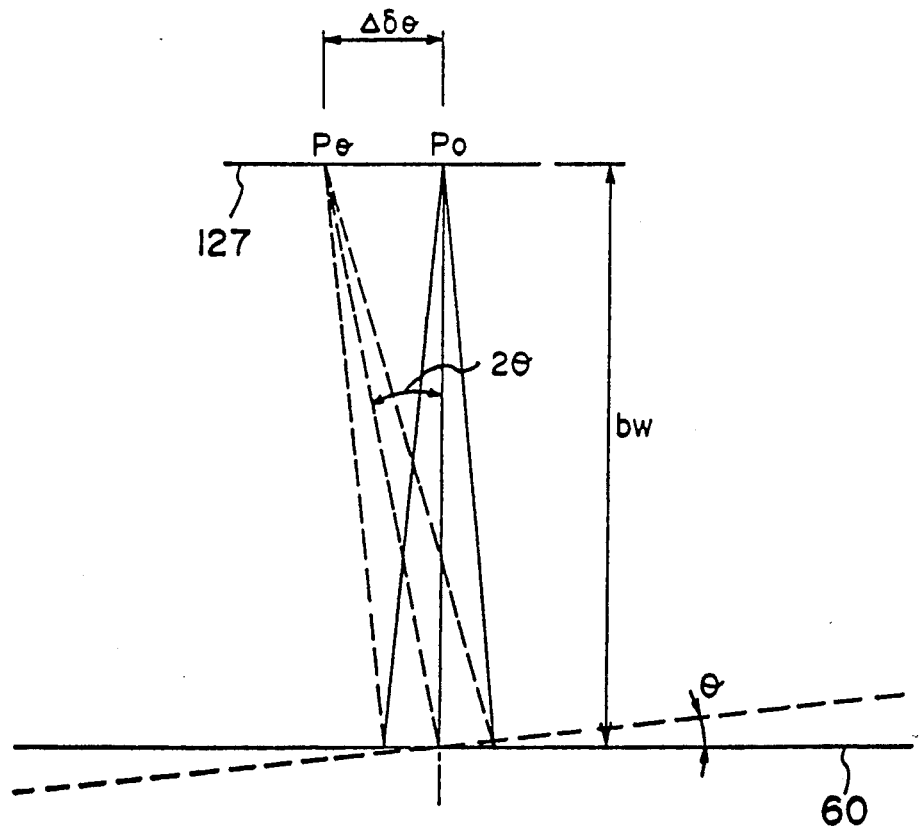
Figure 4A:
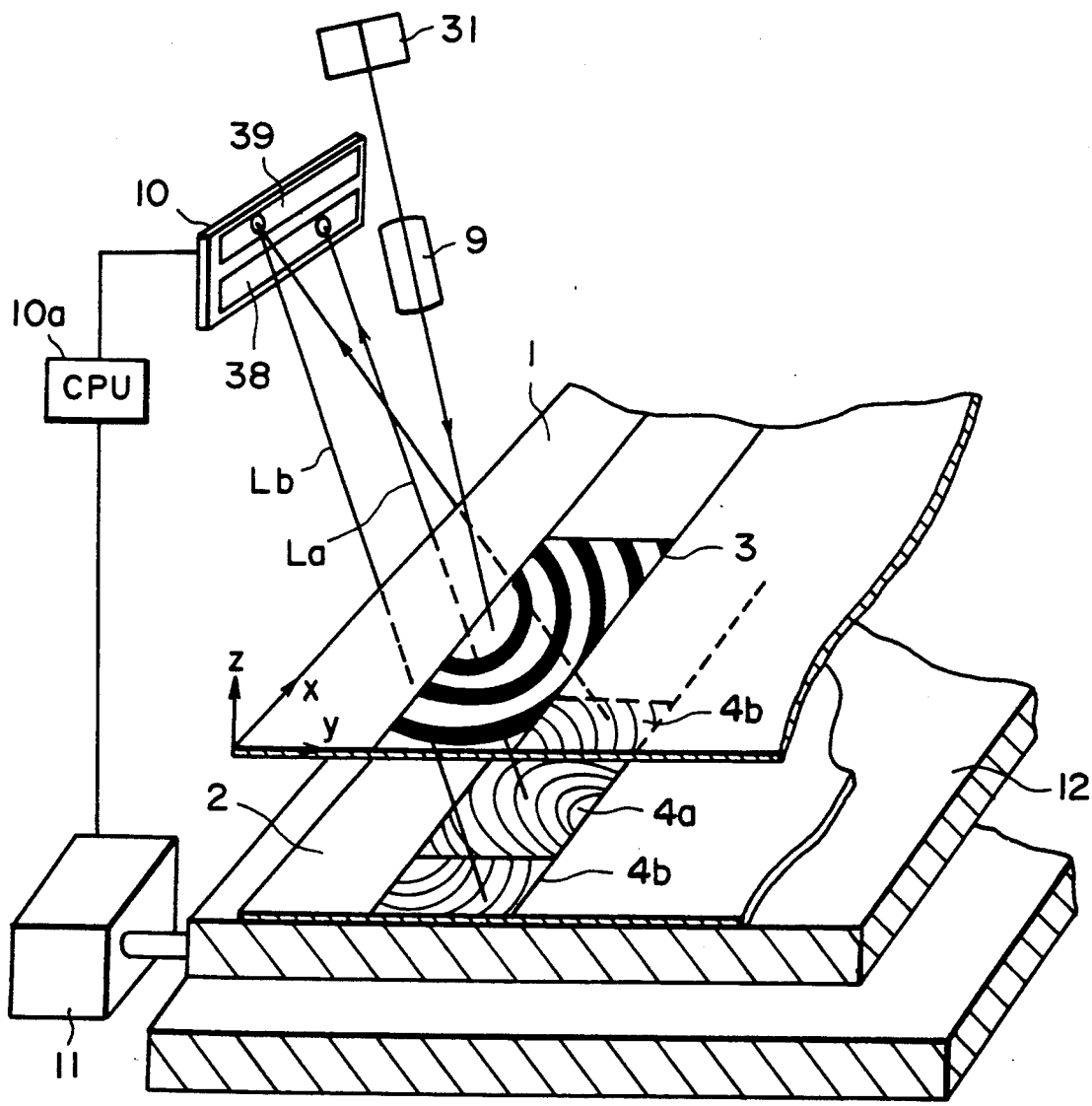
FIG. 4A is a schematic representation of a major part of a first embodiment of the present invention.

Referring now to FIG. 4A which is a schematic view showing a major part of a first embodiment of the present invention, a first object 1 is a mask, for example, and a second object 2 is a wafer, for example, which is to be aligned with the mask 1. First and second physical optic elements 3 and 4 are provided on the mask 1 surface and the wafer 2 surface, respectively, for an alignment purpose.

In this embodiment, light emanating from a light source 31 enters a light projecting optical system (collimator lens system) 9 so that it is transformed into a parallel light. The parallel light is projected on the first physical optic element 3 on the first object 1, with inclination by a predetermined angle $\alpha$ with respect to a normal to the surface of the first object.

The first physical optic element 3 is formed by a lens element such as, for example, an amplitude type grating lens, in the form of a single mark figure. As illustrated, the element 3 has a transmitting portion and a non-transmitting portion with respect to an alignment light to be incident thereupon. The mark figure (mark pattern) of this grating lens 3 has been set so as to be coordinated with a hologram pattern to be formed on the physical optic element 3 surface by predetermined light emanating from an object point (light source) and an image point, with the imaging relationship being designated in preparation.

Figure 6:
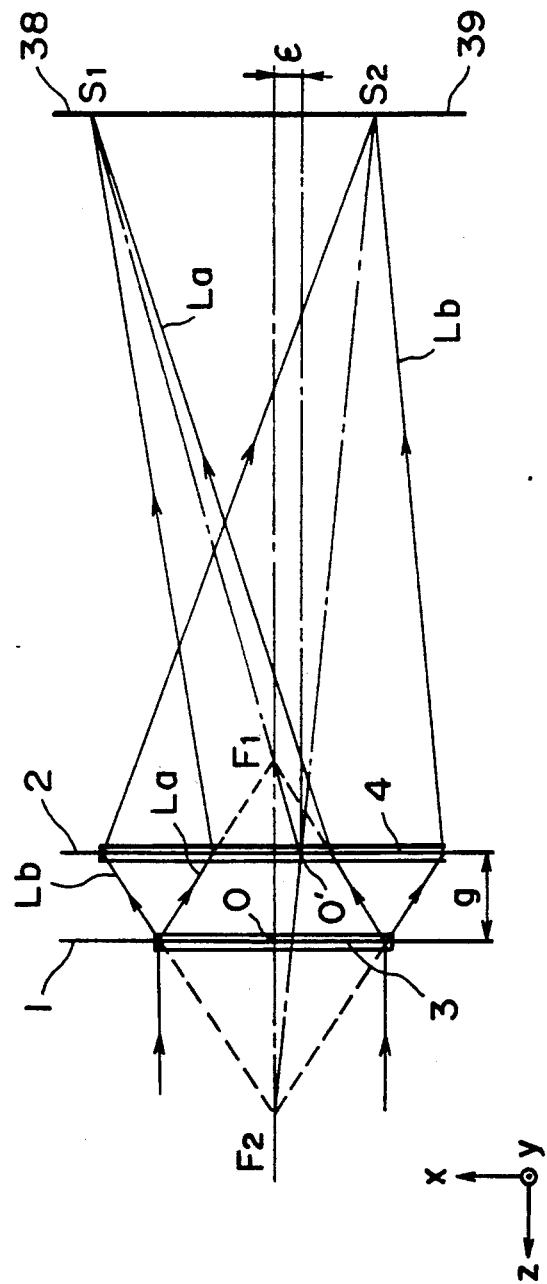
FIG. 6 is a schematic representation of a positional deviation magnifying system.

The light diffracted at a predetermined order or orders by the first physical optic element 3 is influenced by the lens function (converging or diverging function) such that, as shown in FIG. 6, the light influenced by the positive first order diffraction, for example, is influenced by the convex lens function (converging function) to form an image point F1 at a position (0, 0, z1). On the other hand, the light influenced by the negative first order diffraction is subjected to a concave lens function (diverging function) so as to produce a virtual image point F2 at a position (0, 0, −z1).

The thus produced two lights, i.e., a convergent light La and a divergent light Lb, are diffracted again by the second physical optic element 4 disposed at a predetermined spacing g, so that they are influenced by a lens function thereof.

Figure 5A:
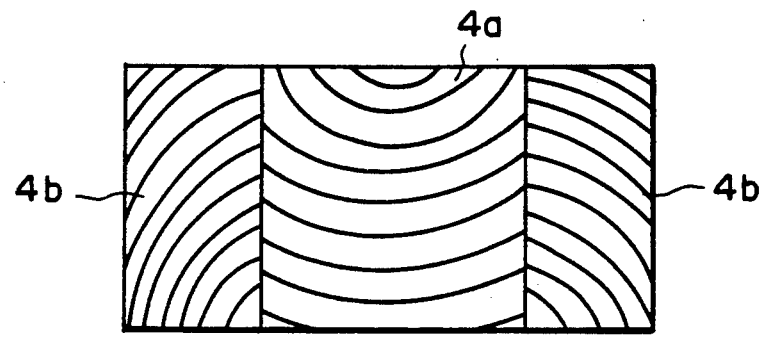
FIGS. 5A-5F illustrate examples of the disposition of second physical optic elements.

The second physical optic element 4 is formed by a lens element having a plurality of mark figures. By way of example, it comprises two different grating lenses 4a and 4b having patterns such as shown in FIG. 5A.

In this embodiment, the second physical optic element 4 is provided by a grating lens element of a combined amplitude and phase type and has an irregular surface height (recessed and protruded) pattern in its sectional structure, and usually the amplitude reflection factor is different at a trough and at a crest. Of the rays diffracted by the second physical optic element 4 at predetermined orders, those rays of the convergent light having been diffracted by the first physical optic element 4 and diffracted again, at the first order, by the grating lens 4a of the second physical optic element 4 and thus influenced by a concave lens function thereof (whereby a light flux La is produced), are used as first alignment signal light.

On the other hand, those rays of the divergent light having been diffracted by the first physical optic element 3 and diffracted again, at the first order, by the grating lens 4b of the second optic element 4 and thus influenced by a convex lens function thereof (whereby a light flux Lb is produced), are used as second alignment signal light Lb.

The first and second alignment signal lights diffracted by the second physical optic element 4 emanate from the surface of the second object 2 and are transmitted at the zero-th order through the first object 1, and they impinge on sensors 38 and 39, respectively, which are set in a predetermined plane. Each of these sensors 38 and 39 comprises a linear CCD sensor having sensing elements arrayed in the position detecting direction (the direction with respect to which the position should be detected) which is in the X direction in this embodiment. Denoted at 10a is a central processing unit (CPU); and at 11 is a driver for moving a stage 12 in response to an instruction signal supplied from the CPU.

Examples that can be used as a light source in this embodiment are: a light source such as a semiconductor laser (LD), a He-Ne laser and the like that can emit light of high coherency; and a light source such as a light emitting diode (LED), an Xe lamp, an Hg lamp and the like that can emit light of low coherency.

Figure 4B:
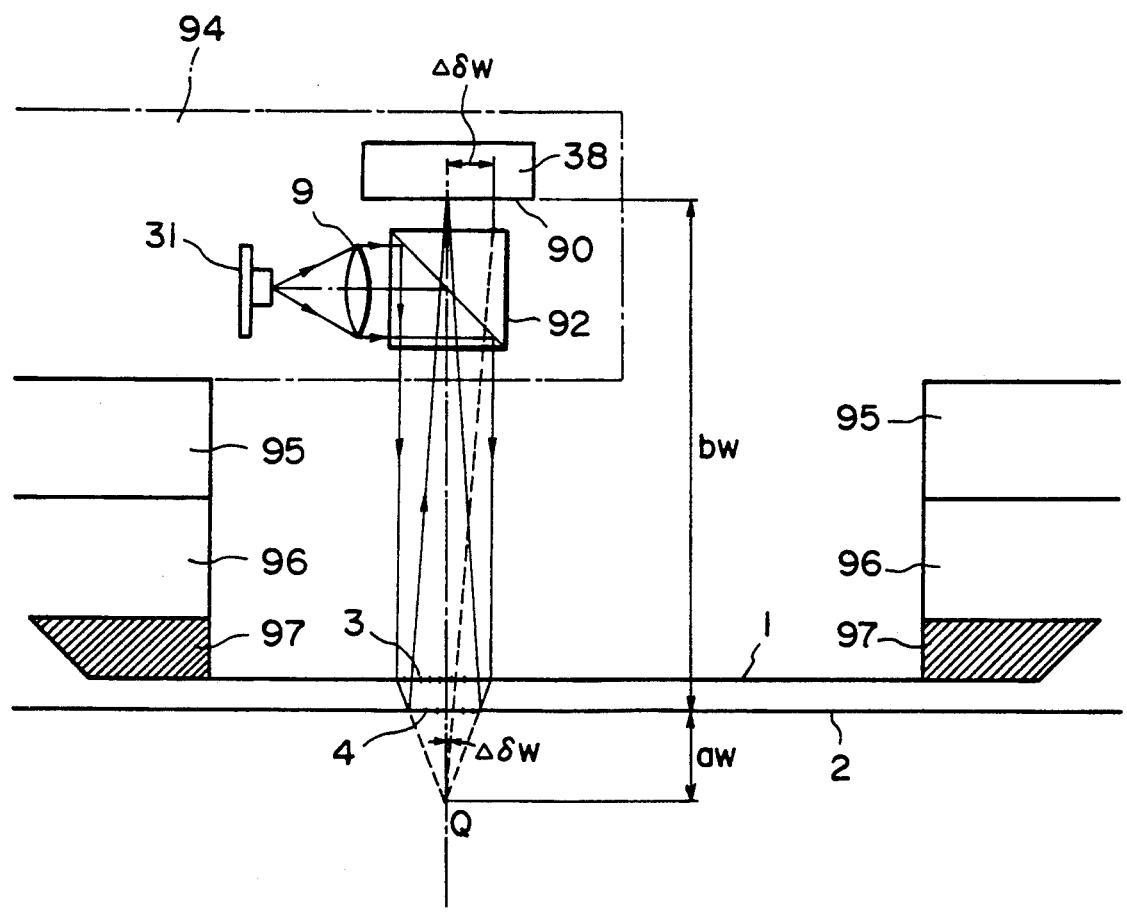
FIG. 4B is a schematic illustration, for explaining the principle of a positional deviation detecting system of the first embodiment.

FIG. 4B is a schematic representation, for illustrating the principle of the detecting system wherein the amount of positional deviation is magnified, when detected, by the grating lens system. For convenience, in FIG. 4B, light is illustrated as being projected perpendicularly to the first object.

The first object 1 is attached to a membrane 97 which is supported by a main frame 95 of the aligner through a chuck 96. Disposed above the main frame 95 is an alignment head 94 for the first and second objects. In order to allow alignment of the first and second objects 1 and 2, they are provided with alignment marks and 4, respectively.

A light beam emanating from a light source 31 is transformed by a light projecting lens 9 into a parallel light which passes a beam splitter 92 and impinges on the alignment mark 3. The alignment mark 3 is formed by a transmission type zone plate having a convex lens function for collecting the received light at a point Q. The wafer alignment mark 4 is formed by a reflection type zone plate having a convex mirror function for imaging the received light on a detection surface 90 of a sensor 38.

If in this arrangement the second object is laterally shifted by $\Delta \delta w$ relatively to the first object, there occurs a change in the angle of emission of the emanating light, like a case where axial alignment of lenses of an optical system is destroyed. On this occasion, displacement $\Delta \delta$ of the center of gravity of light on the detection surface 90 can be expressed as follows:

$$\Delta \delta w = \Delta \sigma \times (bw/aw - 1)$$

Namely, the relative positional deviation is being magnified by "$bw/aw - 1$".

If, for example, the spacing $aw$ between the mark 3 and the point Q is equal to 0.5 mm and the interval $bw$ between the mark 4 and the detection surface is equal to 50 mm, then the magnification is "$\times 99$". It is clear from the equation that the displacement $\Delta \delta$ is in a proportional relationship to the deviation $\Delta \sigma$. If the sensor has a resolution of 0.1 micron, then for the positional deviation $\Delta \sigma$, a position resolving power of 0.001 micron is attainable.

Referring now to FIG. 6, description will be made of the displacement of the first and second alignment signal lights La and Lb on the respective sensors 38 and 39 in response to the positional deviation between the first and second objects.

FIG. 6 schematically illustrates optical paths for the light from the light projecting optical system 9 of the FIG. 4A embodiment, as defined by the positional deviation magnifying system provided by the grating lenses 3 and 4. In FIG. 6, the parallel light incident on the first physical optic element 3 is influenced by the diffracting function and, of the diffracted rays, positive first order diffraction light 31 provides a convergent light La which is convergent toward a point F1, while negative first order diffraction light provides a divergent light Lb having a virtual image point at a position F2.

In this manner, diffraction lights of the orders different in sign are used, and two functions (convex lens function and concave lens function) are effectively provided only by use of a single grating lens.

The convergent light La and the divergent light Lb are then influenced by negative first order diffraction by the grating lenses 4a and 4b, respectively, of the second physical optic element 4, such that the lights La and Lb are influenced by a concave lens function and a convex lens function, respectively. As a result, the image points F1 and F2 of these lights are imaged on the sensor 38 surface and the sensor 39 surface, respectively.

Actually, the lights La and Lb are those having been reflectively diffracted by the grating lenses 4a and 4b. However, for convenience, in FIG. 6 they are illustrated as being transmissively diffracted lights equivalent to the reflected ones.

When the spacing between the first and second objects is $g$; the distance between the second object 4 and the sensor is L; the first physical optic element 3 has focal lengths $f_1$ (for positive power) and $-f_1$ (for negative power); the grating lenses 4a and 4b of the second physical optic element 4 have focal lengths $-f_2$ and $f_3$ respectively; the relative positional deviation, if any, of the second object to the first object in the X direction is denoted by $\epsilon$; then from the foregoing it is seen that displacements S1 and S2 in the X direction of the positions of the gravity centers of the first and second alignment lights La and Lb on the respective sensor surfaces, with reference to those positions of them when the first and second objects have no relative positional deviation, can be expressed as follows:

$$S1 = (L - f_1 + g)/(f_1 - g) \cdot \epsilon \quad \text{(A)}$$

$$S2 = (L + f_1 + g)/(f_1 + g) \cdot \epsilon \quad \text{(B)}$$

The magnification in regard to each displacement S1 or S2 to the positional deviation, at this time, is dependent upon the focal lengths $f_1$ and $-f_1$ of the first physical optic element, the distance L from the second object surface to the sensor surface and the spacing $g$.

Also, the enlarging magnification is "negative" for the first alignment signal light La, while it is "positive" for the second alignment signal light Lb. The positions of the displacements S1 and S2 correspond geometooptically to the positions of intersection, with the detection surface, of straight lines connecting the image points F1 and F2 with the optical axis center of the second physical optic element 4, respectively.

The grating lenses 3, 4a and 4b may be designed so that, when the first and second objects 1 and 2 have no relative positional deviation, the X-axis coordinate of the point of incidence of the light La on the sensor surface 38 coincides with the X-axis coordinate of the point of incidence of the light Lb on the sensor surface 39. On that occasion, when the positions S1 and S2 of the gravity sensors of the first and second alignment signal lights La and Lb are detected by the sensors 38 and 39 and when the distance $\Delta S$ between these positions S1 and S2 in the X direction ($\Delta S = S1 - S2$) is calculated, then the distance $\Delta S$ corresponding to a positional deviation $\epsilon$ can be expressed as follows:

$$\Delta S = [-(L - f_1 + g)/(f_1 - g) + (L + f_1 + g)/(f_1 + g)]\epsilon \quad \text{(C)}$$

Thus, by detecting in preparation the value of the parenthesized part of equation (C) and by detecting, at the time of actual detection of the positional deviation, the distance in the X direction between the positions S1 and S2 of the lights La and Lb incident on the sensor surfaces on the basis of the outputs of the sensors 38 and 39, it is possible to determine the relative positional deviation between the first and second objects in accordance with equation (C). The CPU 10a calculates the positional deviation $\epsilon$ in this manner, by using the outputs of the sensors 38 and 39.

The light diffracted by the second physical optic element 4 and emanating from the surface of the second object 2, while being influenced by the lens function, goes out with inclination, in the Y-Z plane, of a predetermined angle $\beta$ with respect to a normal to the second object surface.

By projecting an alignment light to the first and second objects with inclination and by setting the physical optic elements of the alignment optical system, to be provided on the objects to be aligned, so that the light emanates with inclination and then is received, it becomes easier to arrange a light projecting optical system and a light receiving optical system as well as sensor means, for example, into a single casing (pickup head).

In this embodiment, in order to assure that both the first and second alignment signal lights La and Lb emanating from the second physical optic element 4 are diffracted at a negative first order and are influenced by the concave lens function and the convex lens function, respectively, and then are projected with inclination on the same side as the light projecting optical system, the pattern figure of the second physical optic element is set such as illustrated in FIG. 5A, for example.

FIGS. 5B–5F are schematic representations, showing examples of patterns of second physical optic elements (4) usable in this embodiment. Character 4a denotes a first alignment mark and character 4b denotes a second alignment mark, each being provided by a grating lens.

Figure 5B:
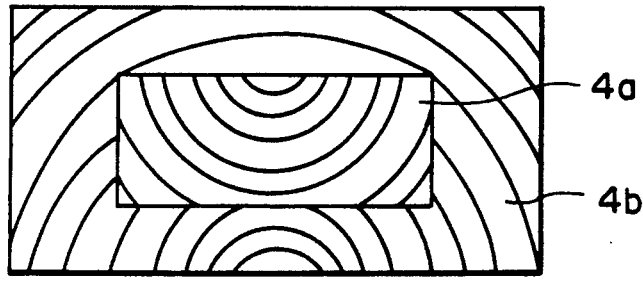
Figure 5C:
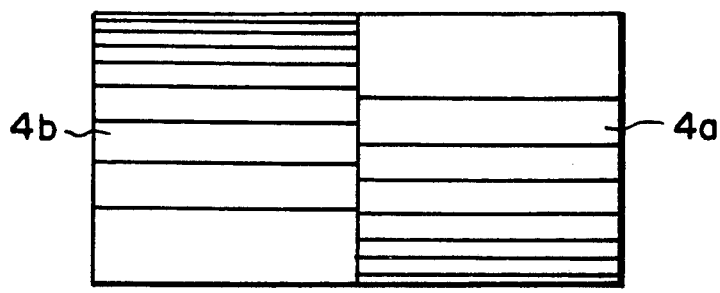
Figure 5D:
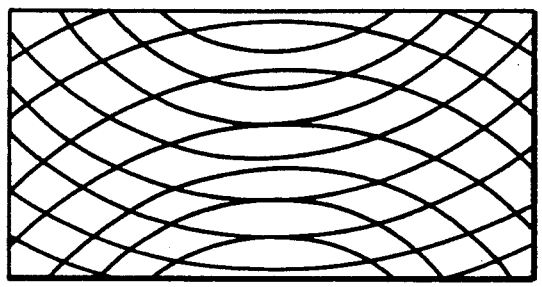

In these examples, FIG. 5D shows an example wherein a first alignment mark 4a and a second alignment mark 4b are superposed in the same region.

In accordance with the present embodiment, a mask is provided with a common alignment mark which is adapted to define two different systems, which are different in the sign of magnification. It is therefore possible to efficiently enhance the overall magnification. Additionally, it is possible to obtain an alignment signal with a sensitivity about twice as high as that attainable when each of the two systems has its own mark.

As an example, first and second physical optic elements 3 and 4 usable in this embodiment can be prepared in the following manner:

First, the mark 3 for a mask is designed so that, when a parallel light of a predetermined beam diameter is incident thereupon at a predetermined angle, the light is collected at a predetermined position. Usually, a pattern of a grating lens may be that of an interference fringe which can be formed on a lens surface on an occasion when mutually coherent light sources are disposed at a light source position (object point) and the position of an image point. Assumingly, a coordinate system is defined on a first object 1 surface, such as shown in FIG. 4A. The origin is at the middle of the width of the scribe line, the x axis is in the direction of the scribe line, the y axis is in the widthwise direction and the z axis is in the direction of the normal of the object 1 surface. Equations regarding a group of curved lines of such a grating lens by which a parallel light, having been incident thereon with an angle $\alpha$ with respect to the normal of the surface 1 and with the projection being perpendicular to the scribe line direction, is imaged after being transmissively diffracted by the mark of the first object, at the position of a converging point $(x_1, y_1, z_1)$, can be expressed in the following manner, with the position of each grating line being denoted by x and y:

$$y \sin\alpha + P1(x,y) - P2 = m\lambda/2 \qquad (1)$$

$$P1(x,y) = \sqrt{(x-x_1)^2 + (y-y_1)^2 + z_1^2}$$

$$P2 = \sqrt{x_1^2 + y_1^2 + z_1^2}$$

wherein $\lambda$ is the wavelength of the alignment light and m is an integral number.

Assuming now that a chief ray is such a ray being incident with an angle $\alpha$ and passing through the origin on the surface 1 and then impinging upon a convergent point $(x_1, y_1, z_1)$, then the right side of equation (1) shows that, depending on the value of m, the optical path length is "$\lambda \times m/2$" times longer (shorter) than that for the chief ray; and the left side denotes the difference in length, with respect to the optical path of the chief ray, of the optical path of such a ray that passes a point $(x, y, 0)$ on the first object and then impinges on the point $(x_1, y_1, z_1)$.

FIG. 5G exemplifies a first alignment mark 3 on a first object 1.

On the other hand, a grating lens to be provided on a second object 2 is designed so as to collect, at a predetermined position (on the sensor surface), a spherical wave emanating from a predetermined point light source. When the gap between first and second objects 1 and 2 at the time of exposure (pattern transfer) is denoted by g, then such a point light source can be expressed by:

$$(x_1, y_1, z_1 - g)$$

wherein y is a variable. This is the position of the imaging point defined by the first physical optic element.

Assuming now that the first and second objects 1 and 2 are to be aligned with respect to the x-axis direction and that, upon completion of alignment, the alignment light is focused at a point $(x_2, y_2, z_2)$ on the sensor surface, then equations regarding a group of curved lines of a grating lens of the second object can be expressed, in the coordinate system defined hereinbefore, as follows:

$$\sqrt{(x-x_2)^2 + (y-y_2)^2 + z_2^2} - \qquad (2)$$

$$\sqrt{(x-x_1)^2 + (y-y_1)^2 + (z_1-g)^2} =$$

$$\sqrt{x_2^2 + y_2^2 + z_2^2} - \sqrt{x_1^2 + y_1^2 + z_1^2}$$

Equation (2) is such an equation that satisfies a condition under which, assuming that the surface of the second object is "$z=-g$" and that the chief ray is such a ray that passes the origin on the first object surface and a point $(0, 0, -g)$ on the second object surface and additionally a point $(x_2, y_2, z_2)$ on the sensor surface, the difference in length between the path of the chief ray and the path of a ray passing the grating $(x, y, -g)$ on the second object surface becomes equal to a multiple, by an integral number, of a half wavelength.

The patterns of the grating lenses 4a and 4b of the second physical optic element 4 can be designed in accordance with equation (2). Of these patterns, pattern of the grating lens 4b is determined by the positions P $(0, 0, z_1+g)$ and Q $(x_2, -y_2, z_2)$ of the object point (light source) and the image point. Here, the position P of the object point corresponds to the position of the virtual image point of the light influenced by the concave lens function of the first physical optic element 3, whereas the position Q of the image point corresponds to a point which is symmetrical with the point $(x_2, y_2, z_2)$ on the sensor surface, with respect to the X-Z plane.

Setting the grating lens 4b while setting the coordinate of the image point Q in this manner makes it possible that a concave lens action is applied to the first alignment signal light La by the grating lens 4a and, on the other hand, a convex lens action is applied to the second alignment signal light Lb by the grating lens 4b, while it is of the same order and of the same sign as the diffraction made to the alignment signal light La by the pattern of the grating lens 4a.

As an alternative, use may be made, for the alignment purpose, of such a grating lens as having a lens function in respect to the positional deviation detecting direction while it has, in respect to a direction perpendicular to the deviation detecting direction, a function for deflecting with a certain angle the direction of advancement of a received light. Further explanation will be made below.

FIG. 5H shows a pattern which has the same lens function in respect to the X direction and the Y direction and, additionally, in respect to the Y direction it has a function for deflecting the direction of advancement of a received light at a predetermined angle.

FIG. 5G shows a pattern which has a sectional structure, in the X direction, the same as that of such a Fresnel zone plate having the same focal length, and which has a sectional structure in the Y direction the same as that of a regular-pitch grating. Generally, the curved lines of the pattern are shaped like a parabola or hyperbola. The pattern shown in FIG. 5H corresponds to the pattern of what can be called an "off-axis type Fresnel zone plate".

The alignment mark 3 of the first object 1 may be designed so that, when a parallel light of a predetermined diameter is incident thereupon at a predetermined angle, it is collected linearly at a predetermined position.

Usually, a pattern of a grating lens may be that of an interference fringe which can be formed on a lens surface on an occasion when mutually coherent light sources are disposed at a light source position (object point) and the position of an image point. Assumingly, a coordinate system is defined on the surface of the first object 1, such as shown in FIG. 5H. The origin is at the middle of the width of the scribe line, the x axis is in the direction of the scribe line, the y axis is in the widthwise direction and the z axis is in the direction of a normal to the object 1 surface. Equations regarding a group of curved lines of such a grating lens by which a parallel light, having been incident thereon with an angle $\alpha$ with respect to the normal to the surface 1 and with the projection being perpendicular to the scribe line direction, is imaged linearly after being transmissively diffracted by the mark 3 of the mask, at the position of a converging point $(x_1, y_1, z_1)$, can be expressed in the following manner, with the position of each grating line being denoted by x and y:

$$y \sin\alpha + P1(x) - P2 = m\lambda/2 \qquad (3)$$

$$P1(x) = \sqrt{(x - x_1)^2 + z_1^2}$$

$$P2 = \sqrt{x_1^2 + z_1^2}$$

wherein $\lambda$ is the wavelength of the alignment light and m is an integral number.

Assuming now that a chief ray is such a ray being incident with an angle $\alpha$ and passing through the origin on the first object surface 1 and then impinging upon a convergent point $(x_1, y_1, z_1)$, then the right side of equation (3) shows that, depending on the value of m, the optical path length is "$\lambda \times m/2$" times longer (shorter) than that for the chief ray; and the left side denotes the difference in length, with respect to the optical path of the chief ray, of the optical path of such a ray that passes a point (x, y, 0) on the object 1 and then impinges on the point $(x_1, y_1, z_1)$.

In equation (3), the light passed through the point y on the surface of the first object is not transformed, at the imaging point, in respect to the Y direction.

On the other hand, a grating lens 4 to be provided on the second object 2 is designed so as to collect, at a predetermined position (on the sensor surface), a cylindrical wave emanating from a predetermined linear light source. When the gap between first and second objects 1 and 2 at the time o exposure (pattern transfer) is denoted by g, then each point on the linear light source can be expressed by:

$$(x_1, y, z_1 - g)$$

Assuming now that the first and second objects 1 and 2 are to be aligned with respect to the x-axis direction and that, upon completion of alignment, the alignment light is focused at a point $(x_2, y, z_2)$ on the sensor 9 surface, then equations regarding a group of curved lines of a grating lens of the second object can be expressed, in the coordinate system defined hereinbefore, as follows:

$$\sqrt{(x - x_2)^2 + z_2^2} - \sqrt{(x - x_1)^2 + (z_1 - g)^2} + y\sin\beta = \qquad (4)$$

$$\sqrt{x_2^2 + z_2^2} - \sqrt{x_1^2 + z_1^2} + m\lambda/2$$

wherein $\beta$ is the angle of deflection in the Y direction (with respect to a normal to the surface of the second object).

Equation (4) is such an equation that satisfies a condition under which, assuming that the surface is of the second object "$z = -g$" and that the chief ray is such a ray that passes the origin on the first object surface and a point $(0, 0, -g)$ on the second object surface and additionally a point $(x_2, y, z_2)$ on the sensor surface, the difference in length between the path of the chief ray and the path of a ray passing the grating $(x, y, -g)$ on the surface of the second object becomes equal to a multiple, by an integral number, of a half wavelength.

Generally, a zone plate (grating lens) for the first object can be formed as an amplitude type grating element of "0 and 1" in which two regions, a region (transparent portion) that can transmit light and a region (light blocking portion) which does not transmit light, are formed alternately. On the other hand, a zone plate for the second object can be formed as a phase grating pattern having a rectangular section, for example. The fact that, in equations (3) and (4), each line of a grating is defined at a position which corresponds to a multiple, by an integral number, of a half wavelength with regard to the chief ray, means that the linewidth ratio of the transparent portion and the light blocking portion is 1:1 in the case of the grating lens on the first object 1, and that the line and space ratio of the rectangular grating is 1:1 in the case of the grating lens on the second object 2.

As a specific example, a grating lens on a first object 1 was formed by transferring, onto an organic thin film of polyimide, a grating lens pattern of a reticle prepared by the use of an electron beam exposure technique.

On the other hand, a mark on a second object was formed by preparing on a mask a pattern to be printed on a wafer and then by transferring the pattern by the use of a lithographic process.

Description will now be made of the relationship between first and second alignment light to be incident on a sensor (detecting means) which may comprise an accumulation type one-dimensional CCD sensor, for example.

In this embodiment, the second alignment signal light and the first alignment signal light emanate from the surface of the second object at angles 8 degrees and 5 degrees, respectively, with respect to the normal of the second object surface and with the projection, upon this surface, being orthogonal to the X-axis line direction when the positional deviation is equal to zero. The spatial disposition of the sensors 38 and 39 is so set that, upon completion of alignment, a light is incident on a corresponding sensor substantially at the middle position.

The sensors 38 and 39 have a spacing of 2 mm between their centers, and are mounted to a common base plate, made of Si, at a precision of about 0.1 micron. The Si base plate on which the sensors 38 and 39 are mounted, is disposed so that its normal extends substantially parallel to a bisector for the angle of emission of the first alignment signal light and the angle of emission of the second alignment signal light.

As regards the size of the sensors 38 and 39, the sensor 11 for the first signal light is 1 mm in width and 6 mm in length, whereas the sensor 12 for the second signal light is 1 mm in width and 1 mm in length Each picture element (pixel) has a size of 25×500 microns.

Each sensor is operable to measure the position of the center of gravity of incident light, and output signals from the sensor are processed so as to be standardized with regard to the total light quantity over the whole light-receiving region. By this, even if the output power of a light source for alignment changes slightly, the measured value as outputted from the sensor system exactly represents the position of the center of gravity. Although the resolution of the sensor, for the position of the center of gravity, may depend on the power of the alignment light, it was 0.2 micron when a semiconductor laser having a power of 50 mW and a wavelength 0.83 micron was used, by way of example.

In a design example for a grating lens of the first object and a grating lens of the second object, to be used in the present embodiment, the center of gravity of the signal light displaces along the sensor surface, with the positional deviation between the first and second objects being magnified by "X−100" in the case of the first alignment light and by "X100" in the case of the second alignment light. Therefore, a positional deviation of 0.01 micron between the first and second objects results in an effective displacement of the center of gravity on the sensor surface through −1 micron for the alignment light and through 1 micron for the second signal light. The sensor system can measure such a displacement with a resolution of 0.2 micron.

If, in this embodiment, the second object 2 surface is inclined within an x-z plane by an amount of 1 mrad, there occurs on the sensor 38 a displacement of about 20 microns of the center of gravity of the first signal light. On the other hand, the second signal light and the first signal light have symmetrical projections and, additionally, they travel along respective optical paths having the same length. Therefore, on the sensor 39, there occurs a displacement of the center of gravity of the second signal light exactly the same as that of the first signal light. Thus, by processing signals from the sensors so as to detect and output a difference between those signals representing the positions of the effective centers of the gravities, the output signal from the sensor system does not change even if the second object surface is inclined within the x-z plane.

If, on the other hand, the second object is inclined within a y-z plane, both the first and second signal lights cause displacement of the center of gravity in a direction (widthwise direction) perpendicular to the lengthwise direction (the direction of array of the elements) of the sensor (one-dimensional CCD sensor). However, such a displacement is in the direction which is perpendicular to the direction of displacement of the center of gravity of light resulting from the positional deviation (which is about to be detected). Therefore, without the second signal light, no practical alignment error occurs.

Further, when the alignment head which may contain an alignment light source, a light projecting lens system and sensors, is shifted relatively to a mask and wafer system (for example, if the head is displaced by 5 microns in the x direction relatively to the first object), there occurs an effective displacement of the center of gravity of the first signal light, on the sensor 38 surface, by an amount of 5 microns. In this connection, also the center of gravity of the second signal light displaces on the sensor 39 by an amount of 5 microns, as exactly the same as the first signal light. Similarly, a deviation of 10 microns between the first object 1 surface and the head, in the z direction, results in a displacement, through 10 microns, of the center of gravity of light upon each of the first signal-light sensing sensor 38 and the second signal-light sensing sensor 39.

Therefore, no change occurs in the final output of the sensor system, namely, in the differential signal representing the difference between an output concerning the position of the center of gravity of the first signal light and an output concerning the center of gravity of the second signal light.

It will be readily understood that any change in the position in respect to the x-axis direction does not result in an essential alignment error, even when the second signal light is not used.

In the present embodiment, in regard to the positional deviation "x" between the first and second objects in respect to the X direction, when the positions of gravity centers of the first and second signal lights (alignment lights) on the sensors, in respect to the X direction, are denoted by W1 and W2, when the angle of inclination of the surface of the second object relatively to the surface of the first object is denoted by $\Delta\theta$ and when the amount of change in the position of the alignment head is denoted by $\Delta 1r = \Delta x, \Delta y, \Delta z$), then the following relations are provided:

$$W1 = m \cdot x + c_1(\Delta\theta, \Delta 1r)$$

$$W2 = n \cdot x + c_2(\Delta\theta, \Delta 1r)$$

wherein m and n are enlarging magnifications of the first and second alignment systems, respectively, in regard to the amount of positional deviation, and $c_i(\Delta\theta, \Delta 1r)$ is the displacement of the center of gravity of the light upon the sensor resulting from $\Delta\theta$ and $\Delta 1r$. If the first and second signal lights are symmetrical with each other with respect to a normal to the sensor surface and if they have the same optical path length, then:

$$c_1(\Delta\theta, \Delta 1r) = c_2(\Delta\theta, \Delta 1r)$$

Finally, from the relative gravity center position of the two lights on the sensor, the amount of positional deviation can be determined as follows:

$$x = (w_1 - w_2)/(m - n)$$

In this manner, it is possible to accurately detect the positional deviation, while avoiding error factors at the time of measurement of the position of center of gravity of an alignment light, due to any inclination of the second object surface, any change in the position of the alignment head and the like.

In a particular example according to the present embodiment, the focal length $f_1$ of the first physical optic element was 217 microns, the spacing g was 30 microns, and the distance L from the second physical optic element to the sensor was 18.7 microns. As a result, the positional deviation enlarging magnifications $m_1$ and $m_2$ in regard to the first and second alignment signal lights were: $m_1 = -99.0$, and $m_2 = 76.7085$. Accordingly, by detecting the distance $\Delta S$ between these lights on the sensor in respect to the position detecting direction, it is possible to obtain a magnification sensitivity of "$|m_1| + |m_2|$", i.e. "$\times 75.7085$" to the positional deviation.

The focal lengths of the second physical optic element patterns 4a and 4b were set so that the diameter of the alignment light upon the sensor surface was not more than about 200 microns.

The basic algorithm of the alignment (detection and control of lateral deviation) of the first and second embodiment, in accordance with the present invention, is such as follows:

(a) First, a light quantity distribution of the first positional deviation signal light on the sensor 38 is measured and, subsequently, the position $x_s$ of the center of gravity of the light, as defined in the foregoing, in respect to the X direction is detected.

(b) Also, from the light quantity distribution of the second positional deviation signal light on the sensor 39, the position $x_R$ of the center of gravity of this light, in respect to the X direction, is detected.

(c) Then, the difference $\Delta\delta_S$ between $X_S$ and $X_R$ is calculated and, from the magnification as defined in equation (C), the relative positional deviation $\Delta\sigma_1$ between the first and second objects is determined.

(d) If the thus determined deviation $\Delta\sigma_1$ is not smaller than a tolerance, namely, if $\epsilon_1 \leq \Delta\delta_S \leq \epsilon_2$ is not satisfied (wherein $\epsilon_1$ and $\epsilon_2$ are lower and upper limits of a tolerance for $\Delta\delta_S$), then by means of the drive stage 12 the second object is moved by an amount corresponding to the relative positional deviation $\Delta\sigma_1$ to correct the same.

(e) The operations of the steps (a)-(c) are repeated and discrimination is made whether the relative positional deviation $\Delta\sigma_2$ between the first and second objects is within the tolerance (whether $\epsilon_1 \leq \Delta\delta_S \leq \epsilon_2$ is satisfied).

(f) Steps (a)-(e) are repeated until deviation $\Delta\sigma_2$ comes within the tolerance.

Figure 7:
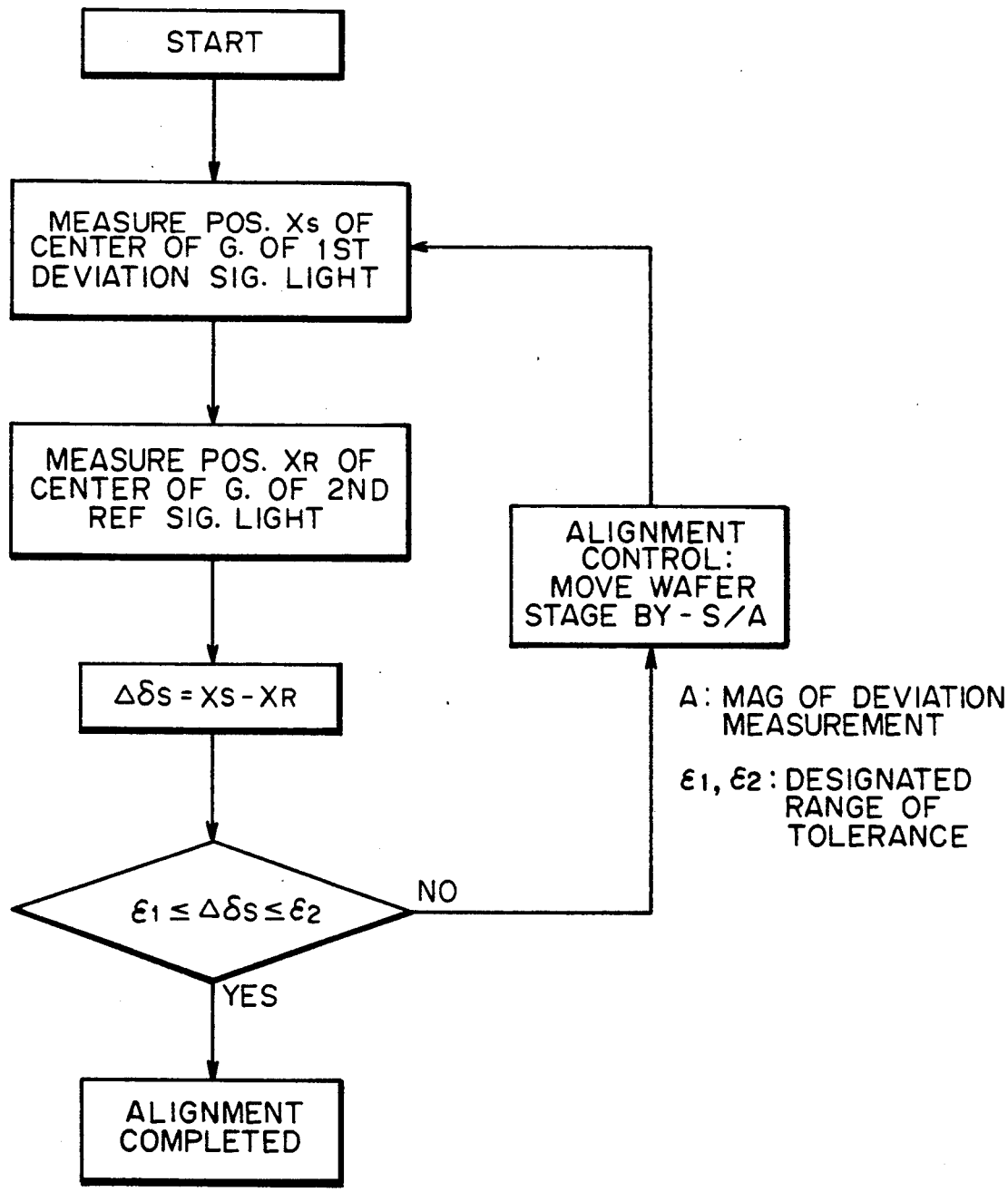
FIG. 7 is a flow chart showing the sequence of an alignment process.

FIG. 7 is a flow chart that shows a major part of the alignment process described above.

Figure 8A:
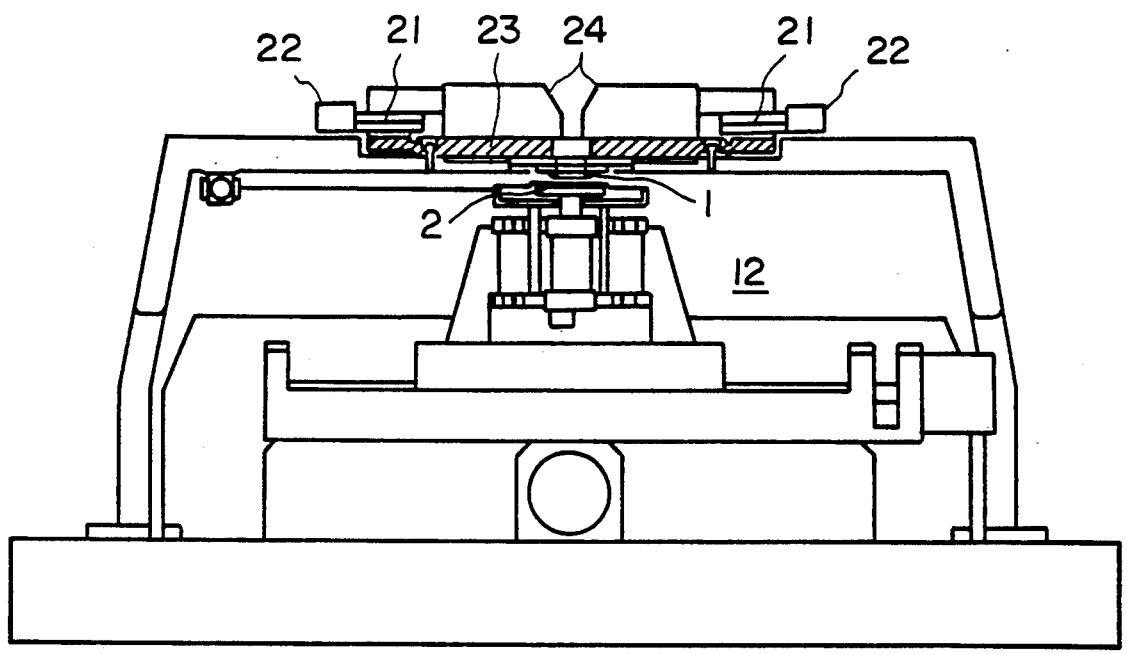
Figure 8B:
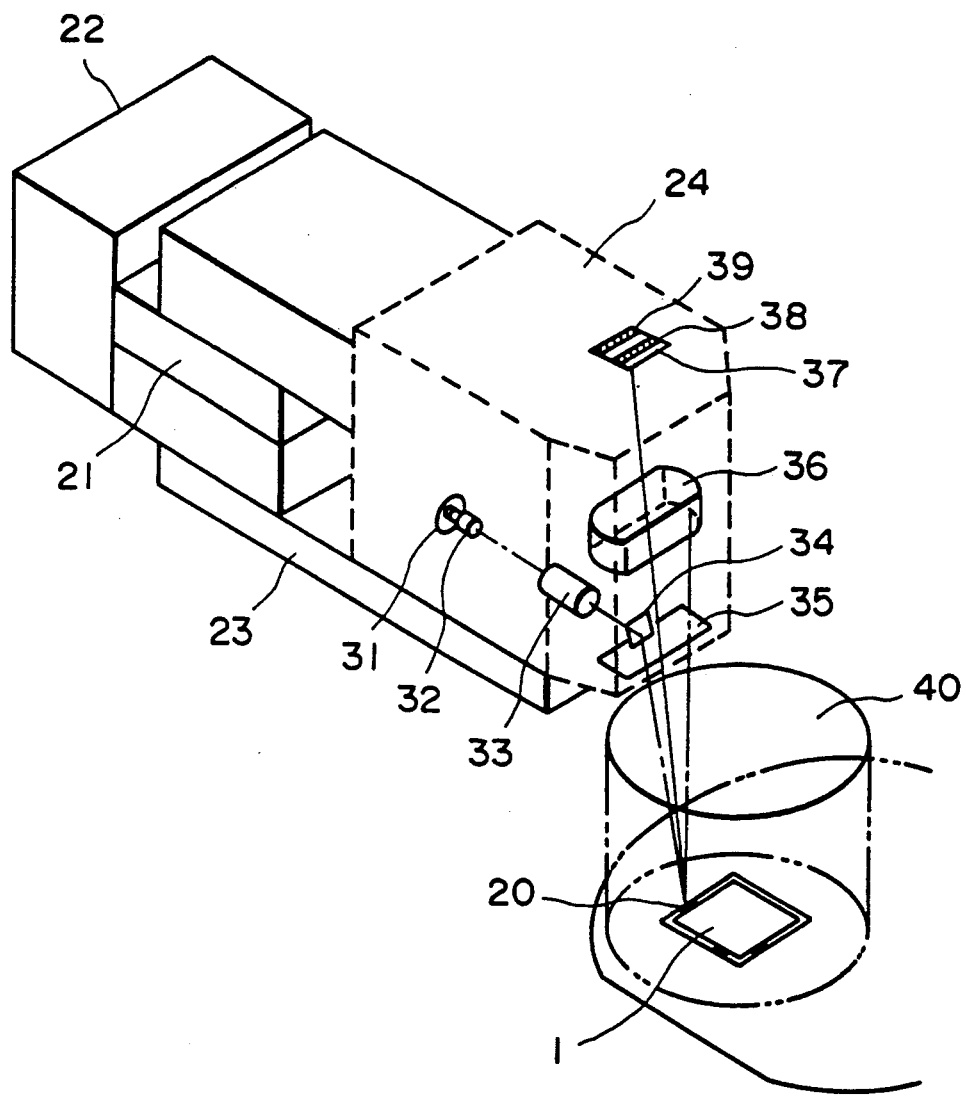
Figure 8C:
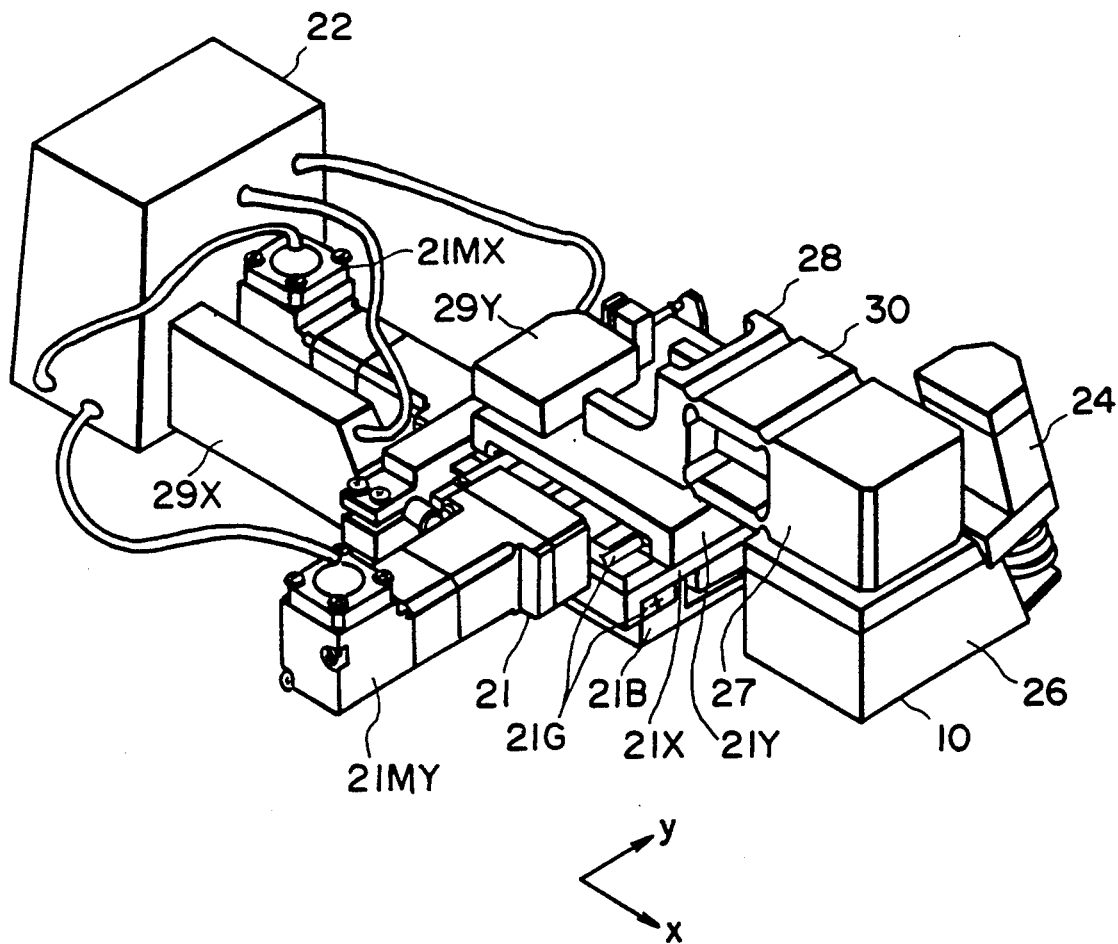

FIGS. 8A-8C are schematic representations, illustrating a major part of a semiconductor device manufacturing exposure apparatus into which the first embodiment shown in FIG. 4A is incorporated. Of these Figures, FIG. 8A is a side view and FIG. 8B shows a part including an alignment pickup device. FIG. 8C shows details of a stage and a stage controller.

The alignment pickup head 24 is attached to a clamper 27 which is provided to press, against a super-flat base plate 23 at a constant pressure, a super-flat surface 10 of a support 26. The pickup head 24 is mounted to the upper part of a main frame of the alignment device, through the super-flat base 23. The clamper 27 is coupled through a parallel leaf spring means 30 to a movable support 28 which is provided on a two-dimensionally movable stage 21. The stage 21 comprises a base 21b, an X-direction slider 21X, a Y-direction slider 21Y, a guide means 21G for guiding the X-direction and Y-direction sliders, and drive sources 21MX and 21MY provided on the base 21B, for moving the sliders 21X and 21Y in the X direction and Y direction, respectively. The operation of these drive sources MX and MY is controlled by a controller 22 so as to shift the head 24 in these directions, for positioning the same at a desired site. The amount of movement of each stage can be measured precisely by means of laser distance measuring devices 29X and 29Y, the data obtained by the measurement being inputted to the controller 22. In response, the controller 22 detects the current position of the head 24 and supplies an instruction signal to each of the drive sources MX and MY so that the head 24 is displaced to the desired site. In this manner, the position of the head 24 is controlled precisely. After the head is moved to the position for the detection, measurement of any lateral deviation as well as measurement of the mask-to-wafer interval (through an interval measuring means, not shown) are executed as described hereinbefore. In accordance with the result of the measurement, the wafer stage 25 is moved in an appropriate direction or directions to correct the lateral deviation and the error in the interval, whereby the alignment and interval control are accomplished. Thereafter, the head 24 returns to its initial position, so as not to interfere the exposure of the wafer to the mask. Since the interval measurement does not directly pertain to the present invention, explanation thereof will be omitted for simplicity.

The alignment pickup head 24 accommodates therein a lateral deviation detecting system, an interval detecting system, a light projecting system and the like. A light beam emitted by a light source 31 (more particularly, a semiconductor laser) is projected through a collimator lens 32, a projecting lens 33 and a projecting mirror 34, to an evaluating mark 20. The light beam emanating from the mark is directed by a detection lens 36 to the detection system and impinges on lateral deviation detecting light receiving elements 38 and 39, whereby respective signals are obtained. The alignment pickup head 24 is equipped with a light projecting and receiving window 35 to which a filter is attached to block any of the light from an exposure light source.

In this embodiment, the projected light is in the form of a parallel light, upon the evaluation mark, and illuminates, at the same time, a lateral deviation detecting mark and an interval measuring mark in a region to which the light is projected. Namely, only one light projecting means is used for the lateral deviation detection and the interval measurement.

Figure 9:
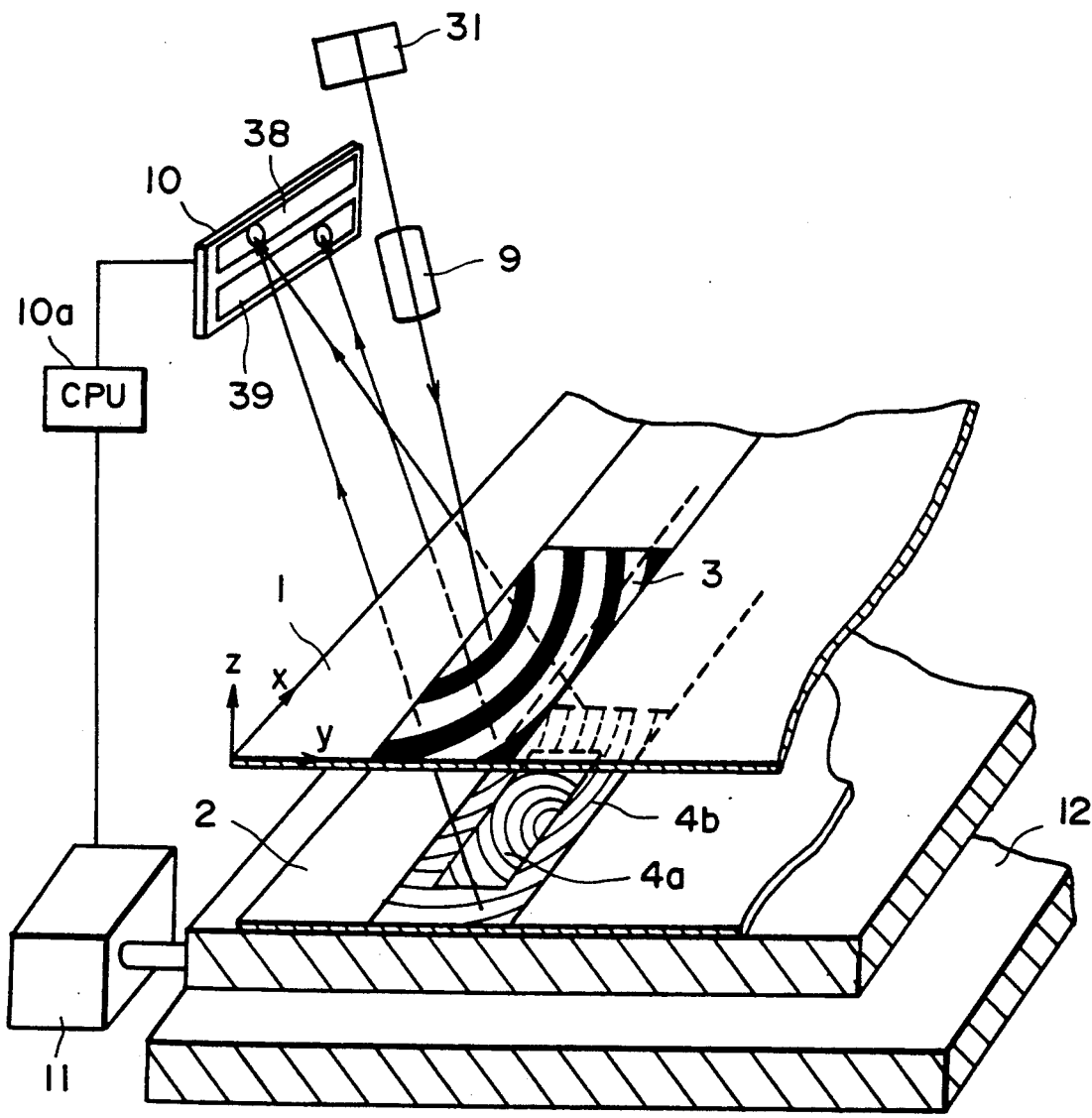
FIG. 9 is a schematic representation of a major part of a second embodiment of the present invention.

FIG. 9 is a schematic view of a major part of a second embodiment of the present invention. In this embodiment, the second object is provided with alignment marks 4a and 4b which are formed by patterns such as shown in FIG. 5B. Like the first embodiment, the alignment marks 4a and 4b show a concave lens function and a convex lens function, respectively, in terms of a negative first order diffraction light, to the first and second signal lights, respectively.

The present embodiment is conveniently usable in such case where, as a grating lens (first physical optic element 3), one having an isotropic lens function (light converging or diverging function), isotropic in the X-Y plane, not a cylindrical power, or, alternatively, a toric type lens element having different lens powers in respect to the X and Y directions is used.

Figure 10:
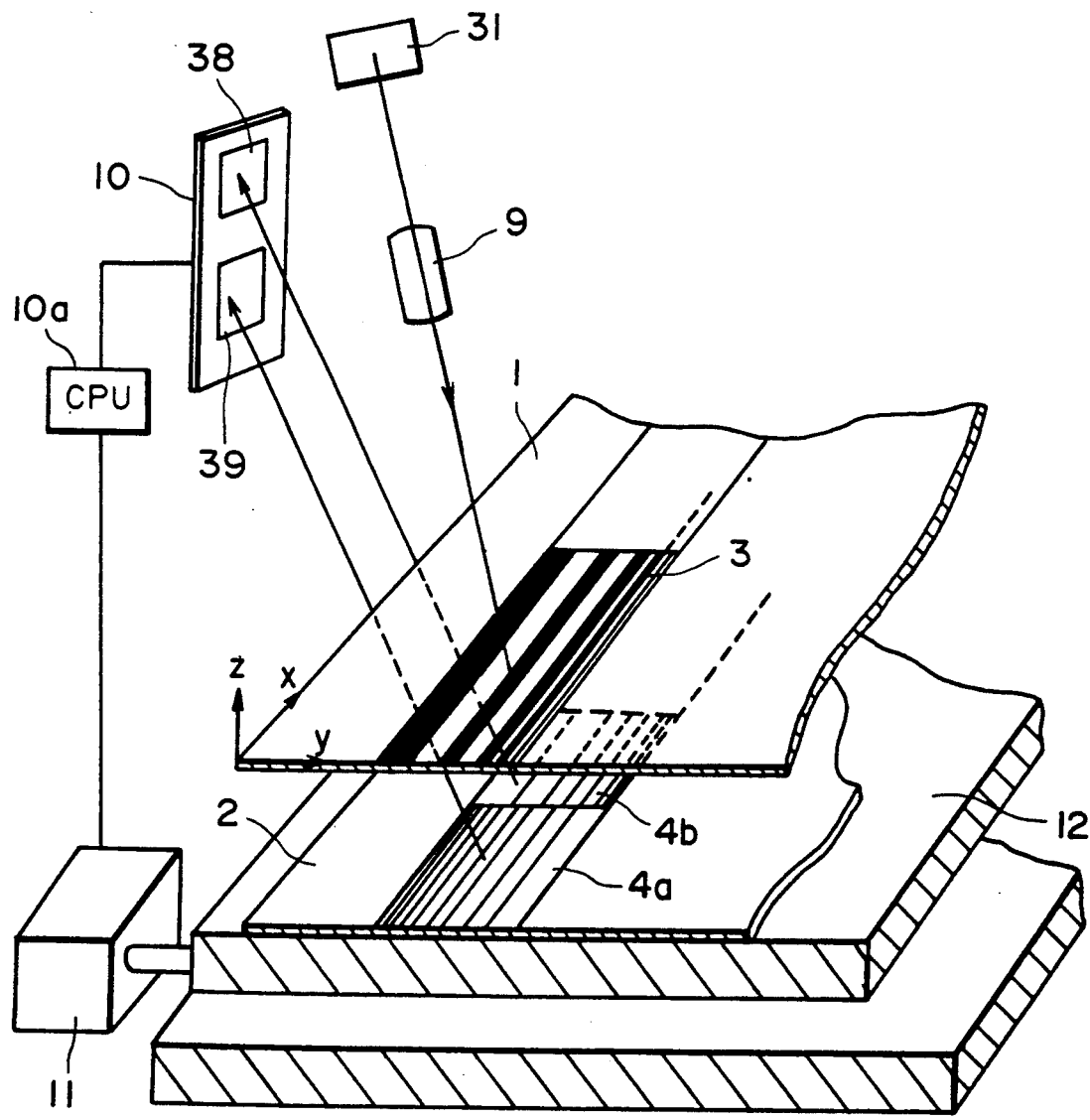
FIG. 10 is a schematic representation of a major part of a third embodiment of the present invention.

FIG. 10 is a schematic view of a major part of a third embodiment of the present invention. In this embodiment, each of first and second physical optic element is formed by an off-axis type one-dimensional grating lens (Fresnel lens) element. Like the first and second embodiments, light is projected to the first and second objects to be incident with inclination by a predetermined angle and the light emitted with inclination is received. As a result, an alignment pickup head in which a light projecting optical system, a light receiving optical system, sensor means, a light source and the like are accommodated in a single casing, is provided.

The detection of any positional deviation and the alignment are made in respect to the Y-axis direction in FIG. 10. The first physical optic element 3 is formed by a grating lens having a single pattern such as shown in FIG. 10, while the second physical optic element 4 is formed by two different grating lens patterns 4a and 4b as best seen in FIG. 5C.

Like the first and second embodiments, the second physical optic element 4a is designed so that, for the light of convex power having been diffracted by the first physical optic element 3, first order diffraction light is influenced by a concave lens function. On the other hand, the second physical optic element 4b is set so that, for the light of concave power having been diffracted by the first physical optic element 3, negative first order diffraction light is influenced by a convex lens function.

Figure 11:
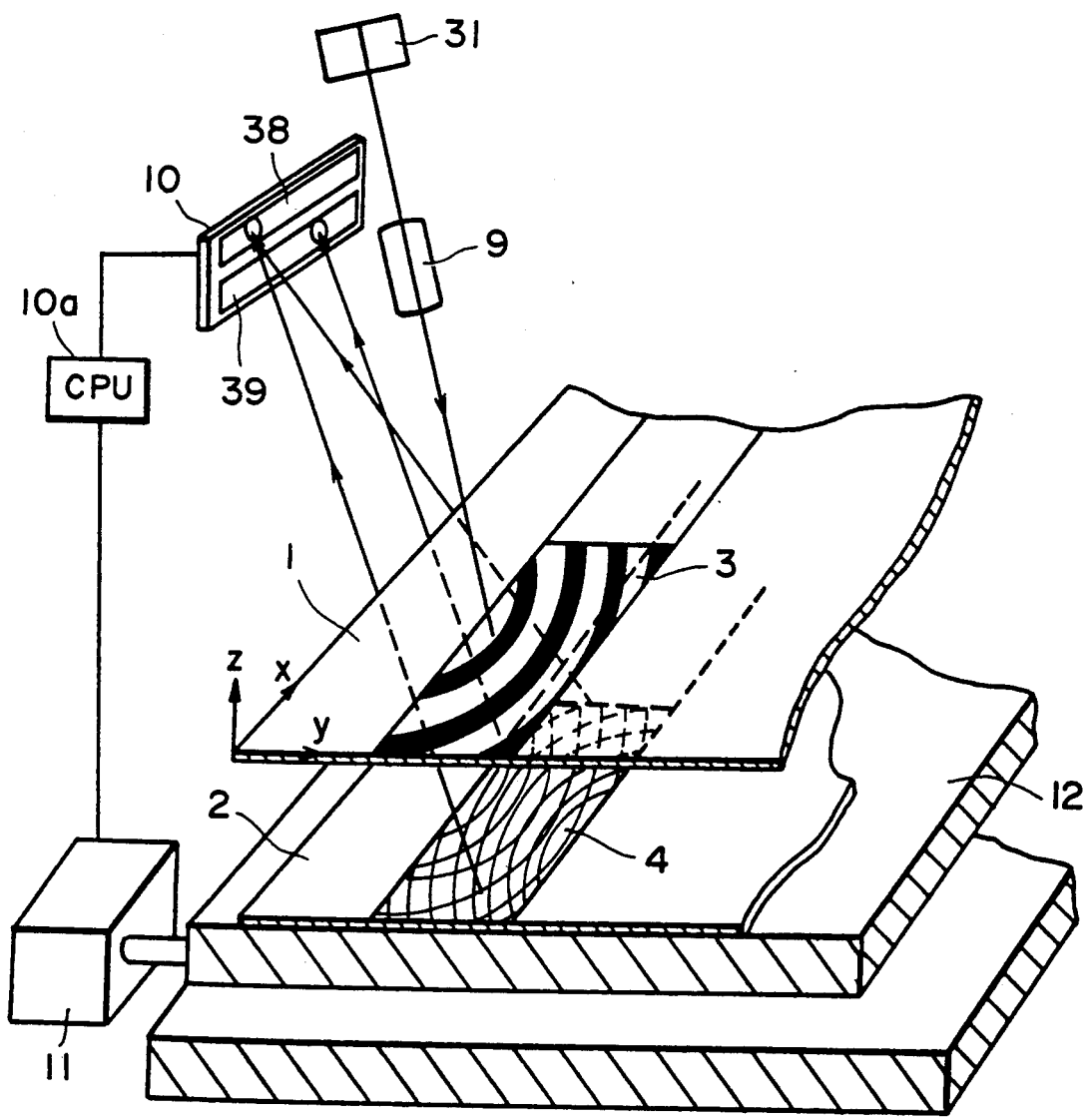
FIG. 11 is a schematic view of a major part of a fourth embodiment of the present invention.

FIG. 11 is a schematic view of a major part of a fourth embodiment of the present invention. As shown in this Figure, a second physical optic element 4 provided on a second object 2 has a pattern which can be formed by overlapping a pattern set to provide a concave lens function with respect to negative first order diffraction light, upon a pattern set to provide a convex lens function. As an example, the pattern is such as shown in FIG. 5D.

By providing and setting, in the same region of an object to be aligned, those marks having different functions to the alignment light, that is, a mark having a concave lens function and a mark having a convex lens function, it is possible to avoid any error in the detection of positional deviation, due to local inclination or warp of the surface of the object to be aligned.

Further, as in the first and second embodiments, it is possible to provide two alignment signal lights, at different positional deviation enlarging magnifications to the positional deviation, which magnifications are different in sign. Thus, by detecting the positions of the gravity centers of these lights on the sensor, it is possible to ensure high-gain and high-resolution detection of the positional deviation.

Additionally, even for an average or overall inclination of an object to be aligned, it is possible to avoid the error.

Figure 12:
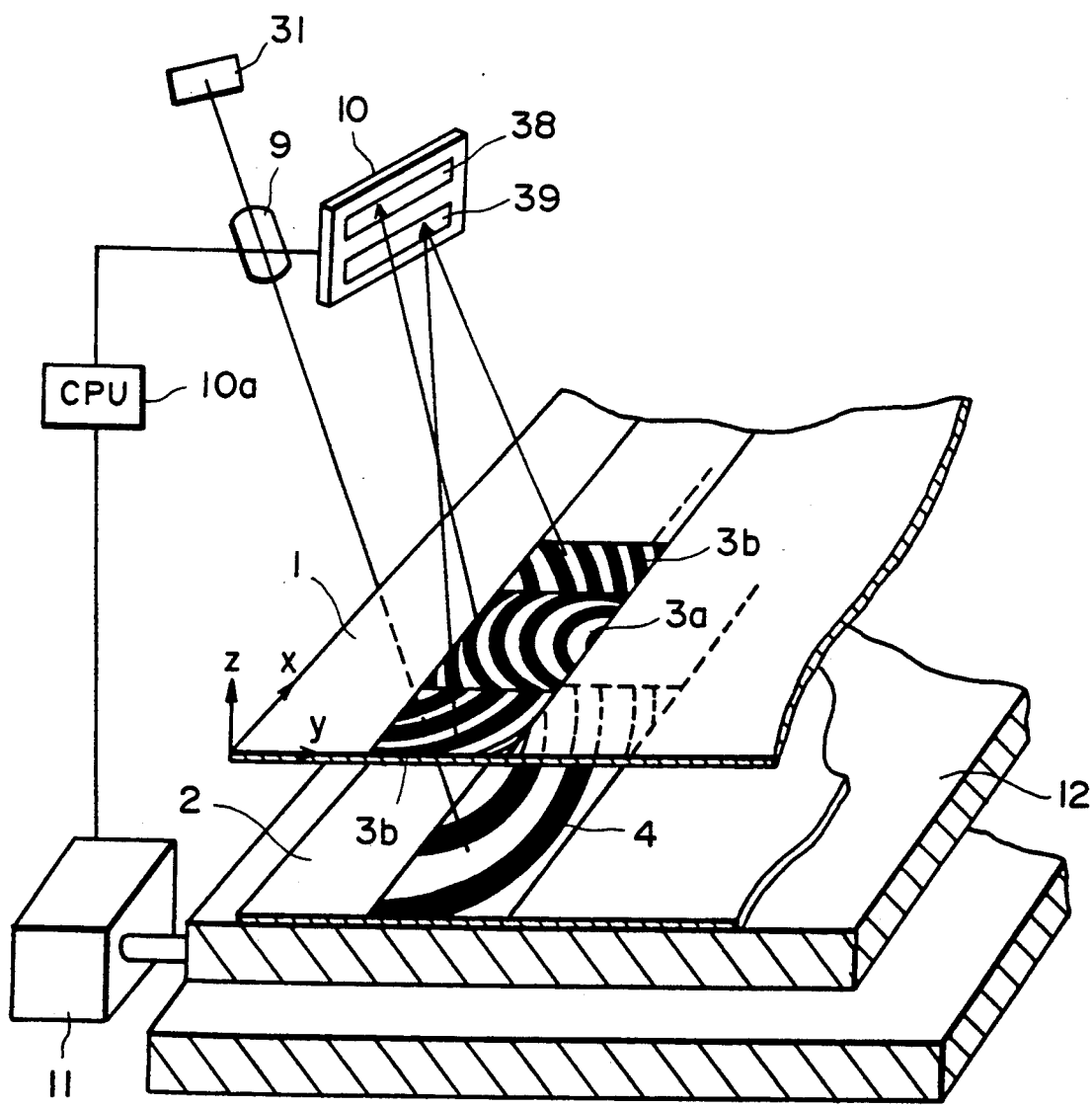
FIG. 12 is a schematic view of a fifth embodiment of the present invention.

FIG. 12 is a schematic view of a major part of a fifth embodiment of the present invention.

In this embodiment, alignment light emanating from a light source 31, after passing a light projecting optical system, impinges on a second physical optic element 4 of reflection type, provided on a second object, with inclination by a predetermined angle with respect to a normal to the surface of the second object. Here, the alignment light simply passes the first object, in the course of the travel thereof, and is not influenced by the diffraction function, for example, of the first object.

The second physical optic element 4 is provided by a combined amplitude and phase type grating element having a pattern figure similar to that of the first physical optic element of the first embodiment. The light incident on the second physical optic element 4 is diffracted thereby at positive n-th and negative m-th orders, whereby light of positive power and light of negative power are produced. In this embodiment, two lights diffracted at positive first order and negative first order are used as first and second alignment signal lights, respectively.

These two lights are diffracted again by the first physical optic elements 3a and 3b on the first object, at a predetermined order or orders and, after being influenced by the respective lens functions, they impinge on sensors 38 and 39, respectively. Then, the position of the center of gravity of each light is detected.

The present embodiment is set so that the positive power light as produced by the second physical optic element is diffracted at negative first order by the first physical optic element 3a and thus is influenced by the concave lens function, while the negative power light as produced by the second physical optic element is diffracted at negative first order by the first physical optic element 3b and thus is influenced by the convex lens function.

The angle of incidence as well as the angle of emission of the alignment light, in regard to the object to be aligned, are set in the same way as of the first embodiment.

Figure 13A:
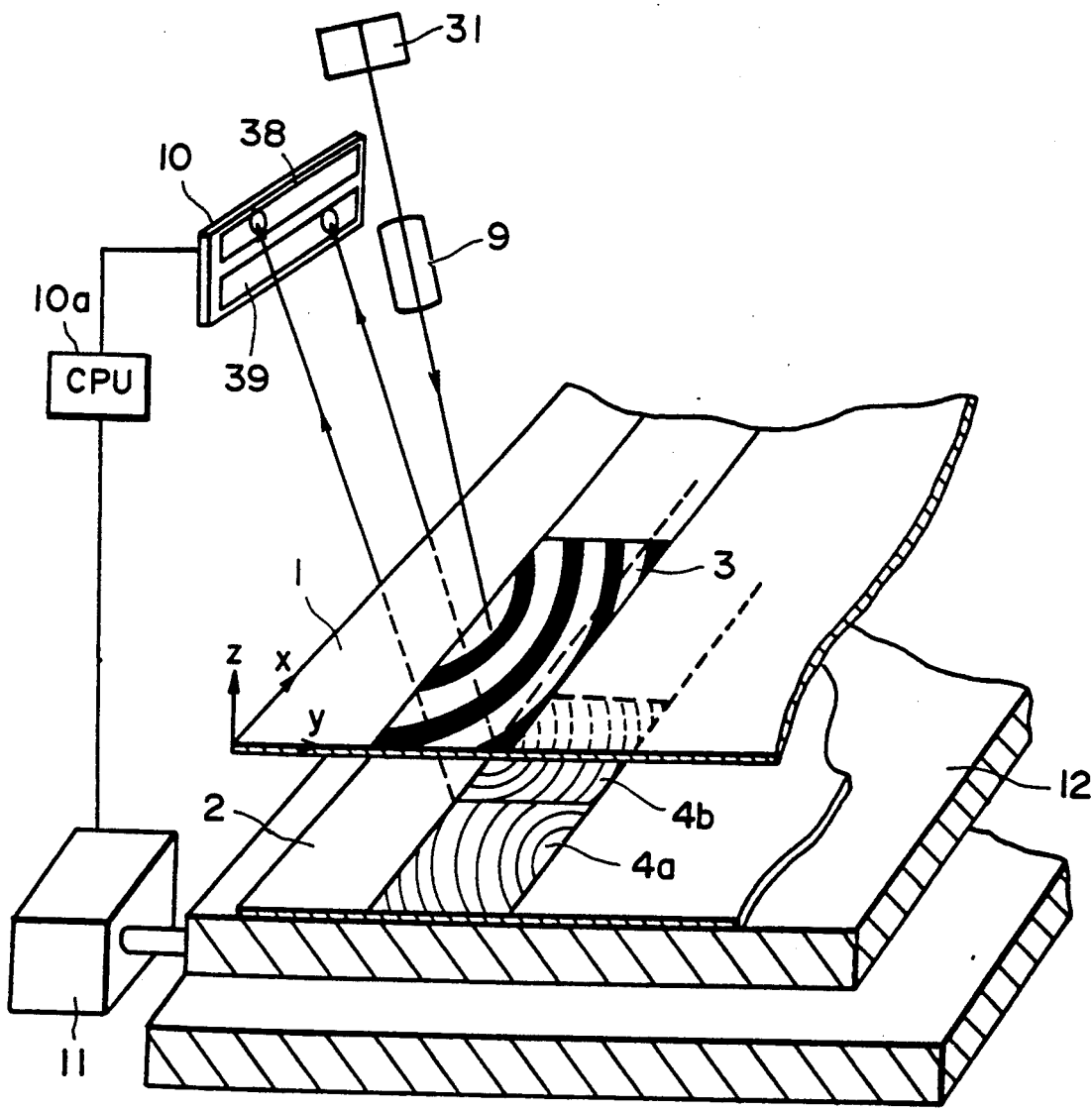
FIG. 13A is a schematic view of a major part of a sixth embodiment of the present invention.

FIG. 13A is a schematic view of a major part of a sixth embodiment of the present invention.

Figure 5E:
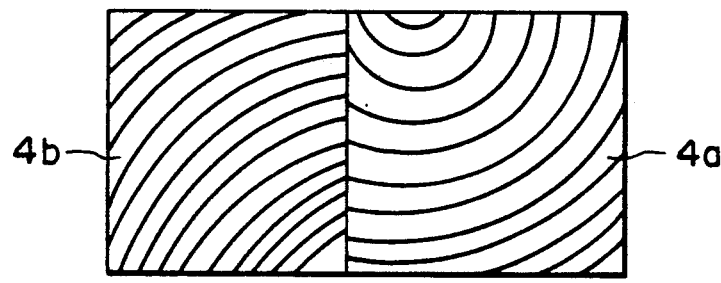

In this embodiment, a second physical optic element is provided by two asymmetric grating lens patterns 4a and 4b such as illustrated in FIG. 5E. Like the first embodiment, these patterns can function to provide a concave lens action and a convex lens action with respect to negative first order reflective diffraction light.

First physical optic element 3, like that of the first embodiment, is formed by a single-pattern grating lens element such as illustrated in FIG. 13A. Light emanating from a light source is transformed by a light projecting optical system 9 into a parallel light which impinges on the surface of a first object, with inclination with respect to a normal to the first object. In response, positive first order diffraction light emanates therefrom so as to be collected at a point $(0, 0, -z_1)$, while negative first order diffraction light emanates from the first physical optic element 3 in the form of a divergent wave like are emitted from a point $(0, 0, z_1)$.

The second physical optic element patterns 4a and 4b have optical axes which are parallel to the Z axis and which are at positions $(\delta_1, 0)$ and $(\delta_2, 0)$ in an X-Y coordinate system, wherein $\delta_1 < 0$ and $\delta_2 < 0$.

Figure 13B:
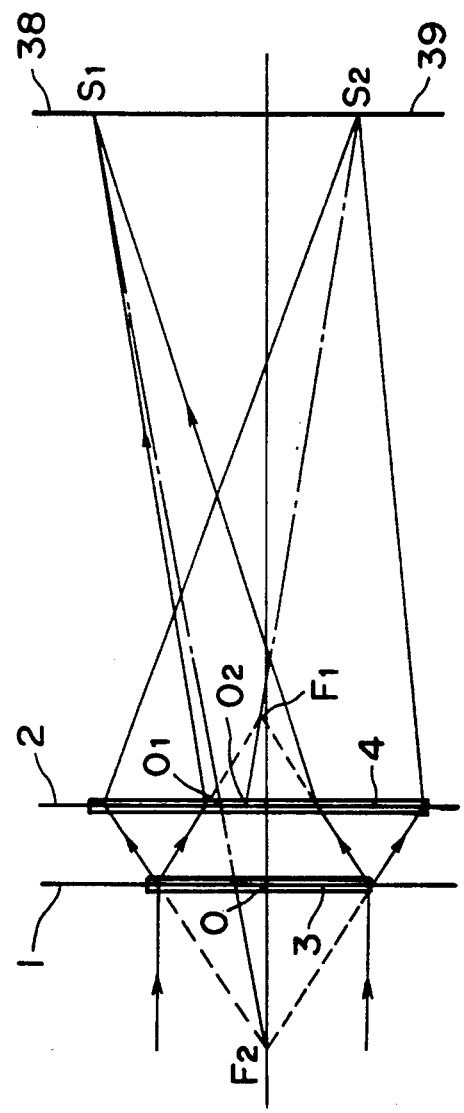
FIG. 13B is a schematic illustration, showing the power arrangement of a major part of a grating lens system of the FIG. 13A embodiment.

FIG. 13B shows the power arrangement of a major part of the grating lens system of the sixth embodiment shown in FIG. 13A. The parallel light incident on the first physical optic element 3 is influenced by the diffracting action thereof so that positive first order diffraction light provides a positive power (convergent) light which is convergent toward a point $F_1$ while on the other hand, negative first order diffraction light provides a divergent light (negative power light) having its virtual image point at a position $F_2$.

The positive power light and the negative power light are subjected to the negative first order diffraction light by the second physical optic element patterns $4a$ and $4b$, whereby their image points $F_1$ and $F_2$ are imaged at points S1 and S2 on the sensors 38 and 39, respectively, as the positions of the gravity centers of these lights. The positions of these points S1 and S2 correspond geometo-optically to the positions of intersection, with the detection surface, of straight lines connecting the image points $F_1$ and $F_2$ with the optical axis positions $O_1$ and $O_2$ of the second optic element.

In this embodiment, the optical axis position $O_1$ of the concave lens element $4a$ and the optical axis position $O_2$ of the convex lens element $4b$, of the second physical optic element 4, are shifted by $\delta_1$ and $\delta_2$, respectively, in the X-axis direction, with reference to the position 0 of the optical axis of the first physical optic element 3, wherein $\delta_1<0$ and $\delta_2<0$. With this arrangement, the distance in respect to the positional deviation detecting direction of the position of the center of gravity of each alignment signal light, when the first and second objects have no relative positional deviation, does not become equal to zero, but becomes to equal to a predetermined value. Therefore, the separation of these alignment signal lights is easier. The aforementioned predetermined value can be determined in accordance with design values, but it may be determined by trial printing.

Figure 14A:
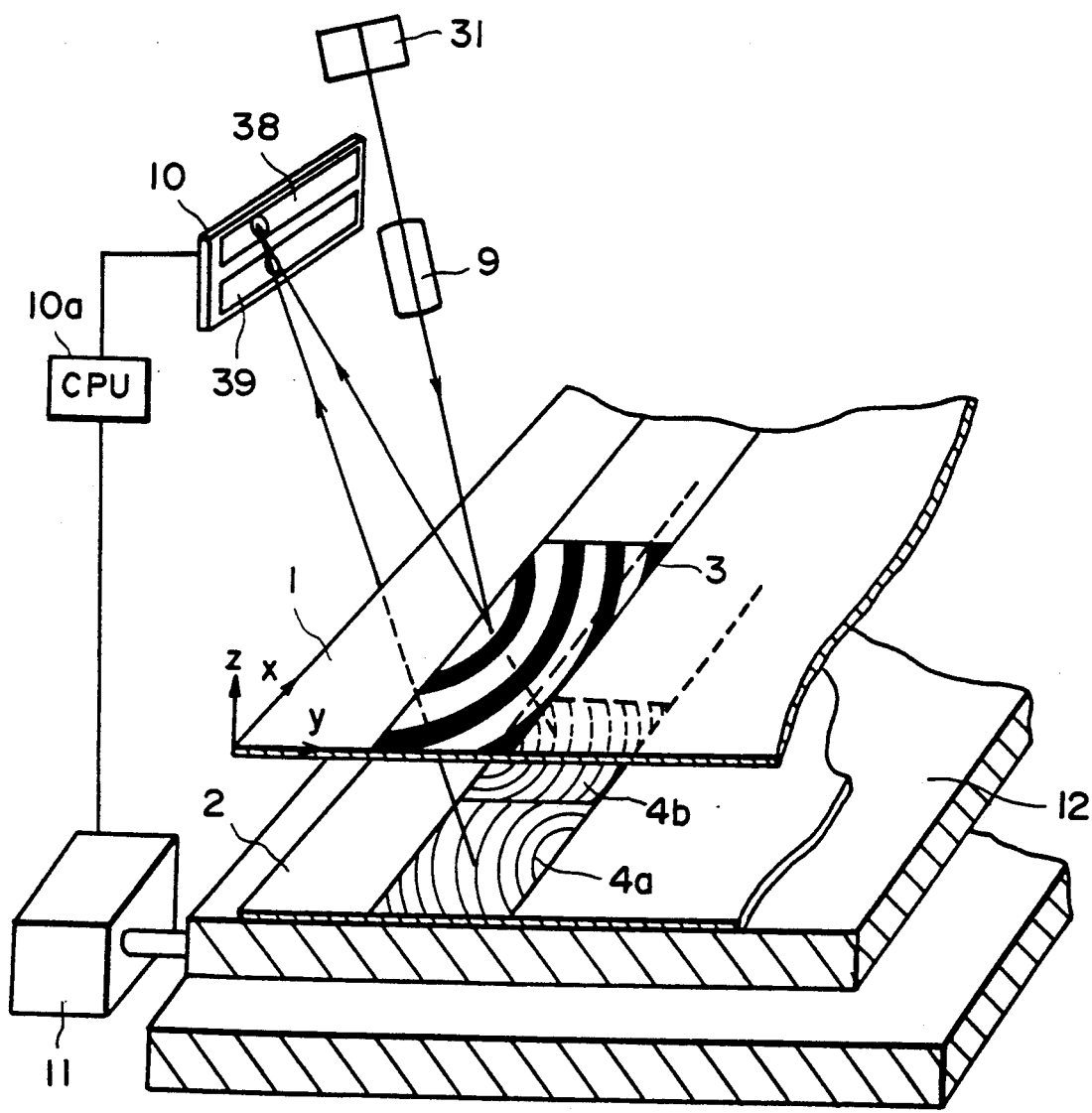
FIG. 14A is a schematic representation of a major part of a seventh embodiment of the present invention.

FIG. 14A is a schematic view of a major part of a seventh embodiment of the present invention.

Figure 5F:
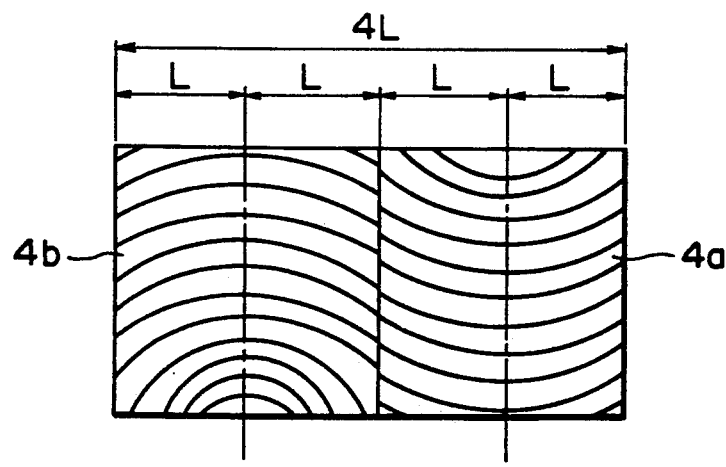

In this embodiment, a second physical optic element is provided by symmetrical grating lenses $4a$ and $4b$, such as illustrated in FIG. 5F.

The grating lenses $4a$ and $4b$ have their optical axis positions shifted positively and negatively from the central position of the second physical optic element 4, in respect to the lengthwise direction of the mark region. In this particular example, each at a quarter of the length.

Figure 14B:
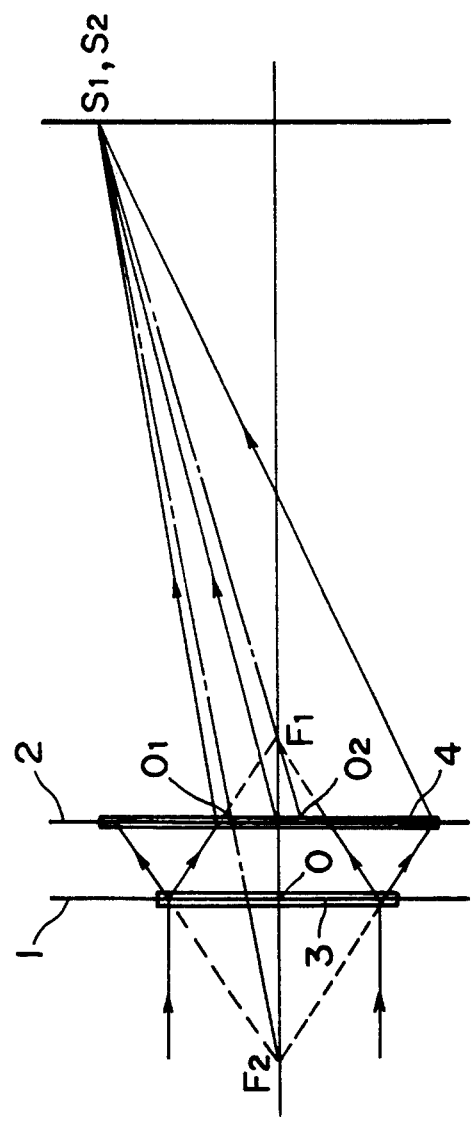
FIG. 14B is a schematic illustration, showing the power arrangement of a major part of a grating lens system of the FIG. 14A embodiment.

FIG. 14B shows the power arrangement of a positional deviation magnifying detection system provided by the grating lenses of the present embodiment. More specifically, the optical axis position of the concave lens element $4a$ and the optical axis position of the convex lens element $4b$, of the second physical optic element 4, are set to be shifted by $\delta_1$ and $\delta_2$ in the X-axis direction (wherein $\delta_1>0$ and $\delta_2<0$), with reference to the optical axis position of the first physical optic element 3, on an occasion when the first and second objects have no relative positional deviation.

Thus, even when no relative positional deviation is present, the positional deviation signal light goes along a path skewed outwardly of the plane of incidence on the first object. By this, it is possible to avoid undesirable crosstalk between the alignment signal light and unwanted diffraction light (e.g., Fraunhofer diffraction light from the first and second physical optic elements) produced within the plane of incidence. In addition thereto, even if the positional relationship between the mask-to-wafer system (first object versus second object) and the light projecting and receiving optical arrangement as well as sensors of the alignment optical system changes, it is possible to avoid any error in the detection of the positional deviation.

Figure 15:
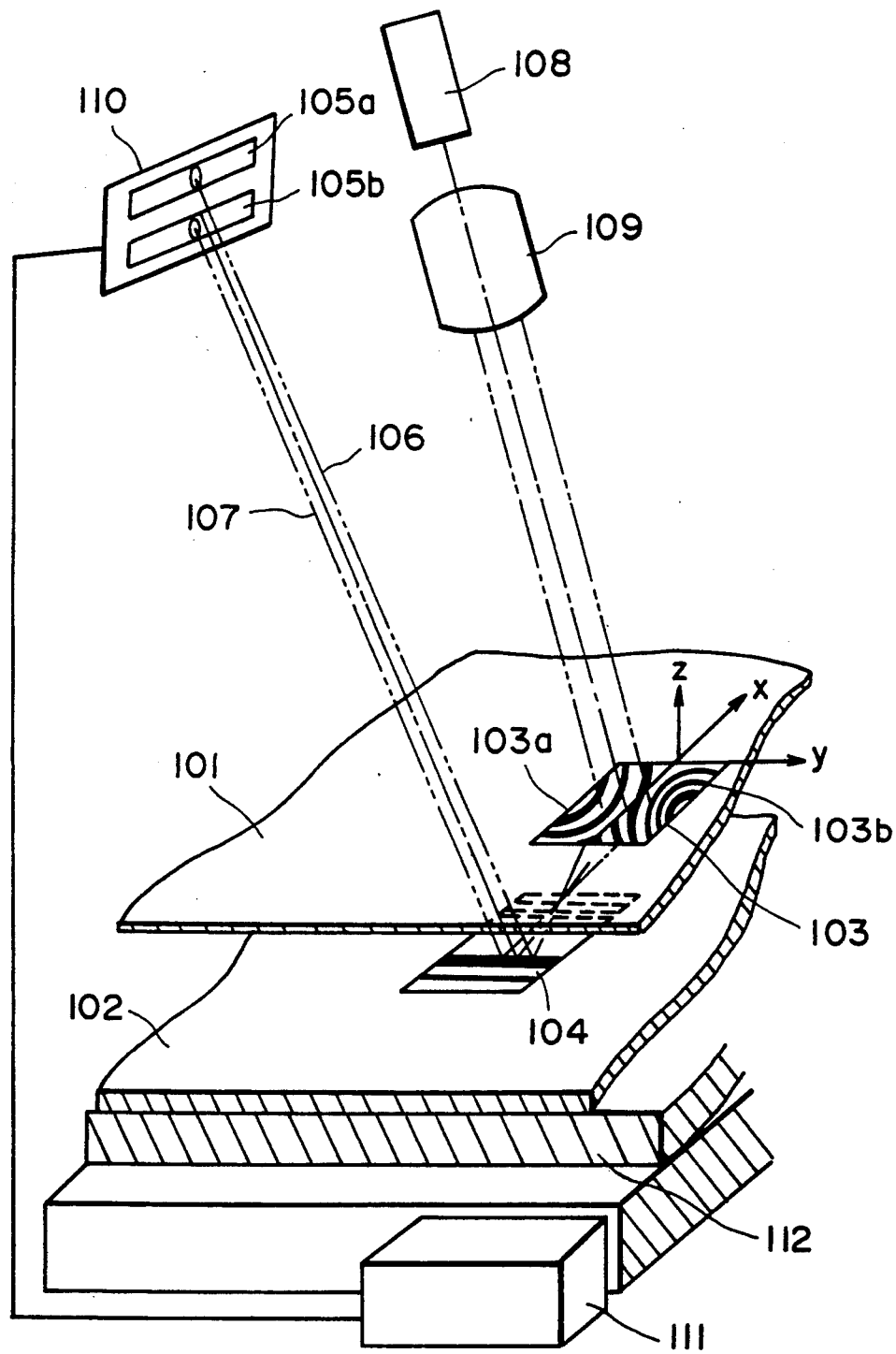
FIG. 15 is a schematic representation of a major part of an eighth embodiment of the present invention.
Figure 16:
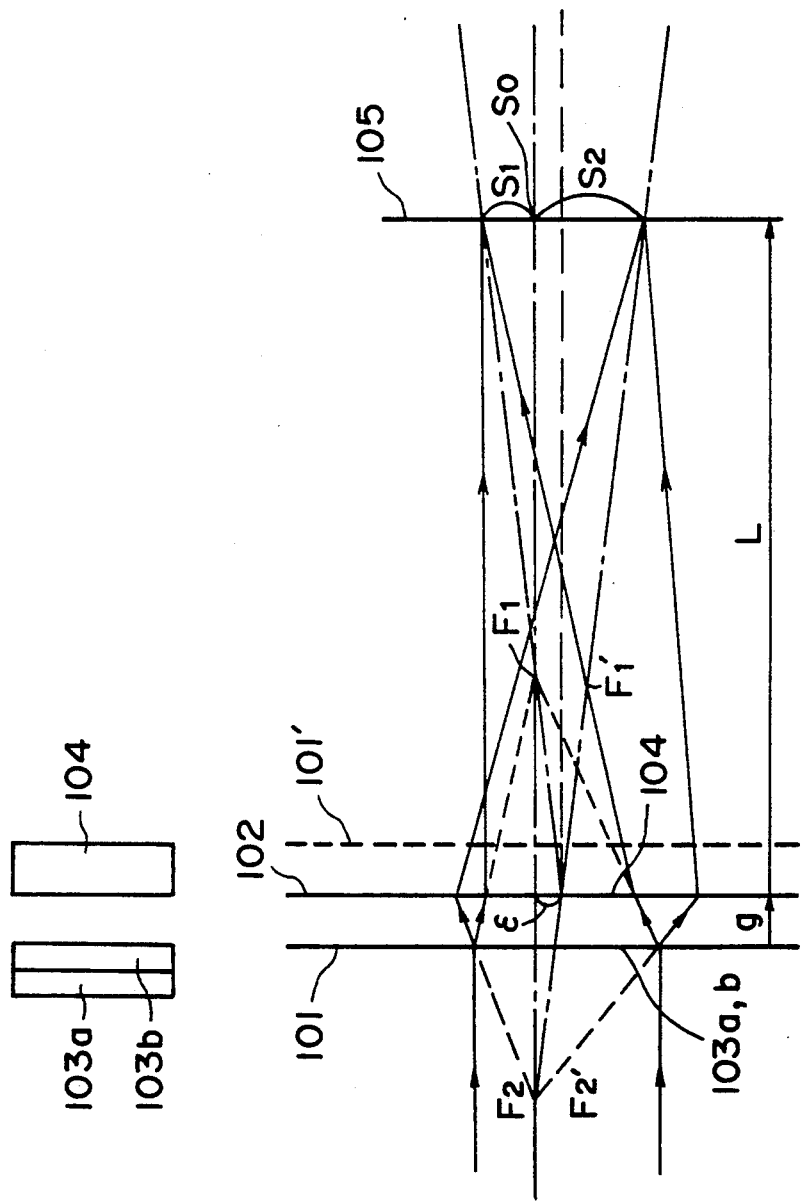
FIG. 16 is a schematic representation illustrating, in an unfolded view, optical paths of a portion of the FIG. 15 embodiment.

FIG. 15 is a schematic view of a major part of an eighth embodiment of the present invention, and FIG. 16 illustrates, in an unfolded view, optical paths in this embodiment.

First object 101 is a mask, for example, and a second object 102 is a wafer, for example, to be aligned with the mask 101. First and second physical optic elements 103 and 104 are provided, for the alignment purpose, on the first and second objects 101 and 102, respectively.

The first physical optic element 103 comprises first and second alignment marks $103a$ and $103b$ for first and second signals, respectively, while the second physical optic element 104 comprises a linear grating lens.

In FIG. 15, light from a light source 108 is transformed by a projecting lens 109 into a parallel light which in turn illuminates the first and second alignment marks $103a$ and $103b$. Diffraction light of a predetermined order or orders, diffracted by the alignment marks $103a$ and $103b$, is again diffracted by the alignment mark 104. Of the diffracted rays thus produced, negative first order diffraction light 106 goes to a sensor $105a$ and positive first order diffraction light 107 goes to a sensor $105b$. Then, information regarding the position of the spot of each diffraction light is processed by a processing system 110, including a processing circuit, whereby a positional deviation controlling signal for the first and second objects 101 and 102 is produced. On the basis of this signal, a stage 112 is moved under the influence of a controller 111 so that the first and second objects 101 and 102 can be set in a predetermined positional relationship. The alignment system of the present embodiment is structured as described.

In the FIG. 15 example, the alignment direction lies in the X direction and, only in respect to this direction, each of the first and second alignment marks $103a$ and $103b$ of the physical optic element 103 has a lens function. On the other hand, in the Y-Z plane which is perpendicular to the alignment direction, each alignment mark $103a$ or $103b$ has a function for deflecting the received light and, for this reason, each alignment mark $103a$ or $103b$ comprises a curved-line pattern. The first alignment mark $103a$ has a positive power and the second alignment mark $103b$ has a negative power, each in respect to the alignment direction, and in order to ensure this, the mark figures of these marks are opposite in the sign of curvature.

On the other hand, the alignment mark 104 (second physical optic element) is provided by a linear (straight) grating lens which has a positive or negative power determined in accordance with the positiveness or negativeness of the order. Here, each of the chief rays of the diffraction lights of different orders is in the same direction as of the inputted light.

In this embodiment, each physical optic element comprises a reflection type one and, in accordance with the directions of diffraction by the first and second alignment marks $103a$ and $103b$, alignment lights 106 and 107 are reflectively diffracted toward the sensors $105a$ and $105b$.

Referring to FIG. 16, the principle and structural features of the alignment system of the FIG. 15 embodiment will now be explained.

FIG. 16 shows lights in the FIG. 15 embodiment and illustrates the optical system being unfolded along light passing the center of each alignment mark, as well as the projection to a surface perpendicular to the plane of incidence. The disposition of the marks is schematically illustrated in an upper part of this Figure.

In FIG. 16, the first and second alignment marks 103a and 103b on the first object 101 surface and the alignment mark 104 on the second object 102 surface, each comprises a physical optic element having a one-dimensional lens function (i.e., having a power only in the sheet of the drawing). The alignment light is diffracted in the manner as illustrated. More specifically, a portion of the inputted parallel light is focused by the first alignment mark 103a at a point $F_1$, and another portion is focused by the second alignment mark 103b at a point $F_2$ (in other words, it has an origin of divergence at the point $F_2$). On the other hand, the alignment mark 104 has a lens function of different diffraction orders, different in sign (in this embodiment, positive first order and negative first order) and serves to image the points $F_1$ and $F_2$ on the surface of the sensor 105. The spacing between the first and second objects 101 and 102 is denoted by g, the distance from the second object 102 to the sensor 105 is denoted by L, and the focal lengths of the first and second alignment marks 103a and 103b are denoted by $f_1$ and $f_2$.

Also, the relative positional deviation between the first and second objects 101 and 102 is denoted by $\epsilon$, and displacements of the gravity centers of the two signal lights on that occasion, with reference to those positions as assumed at the time of correct alignment, are denoted by $S_1$ and $S_2$, respectively. These displacements $S_1$ and $S_2$ of the gravity centers of the signal lights are determined geometrically as the points of intersection, with the detection surface 105, of the straight lines connecting the focal points $F_1$ and $F_2$ of the alignment marks 103a and 103b with the optical axis center of the alignment mark 104. Accordingly, in order to assure that, for a relative positional deviation between the first and second objects 102, the produced displacements $S_1$ and $S_2$ of the gravity centers of the signal lights are in the opposite directions, the selection of diffraction order is made so that the alignment mark 104 provides opposite signs of imaging magnifications.

By way of example, the displacements $S_1$ and $S_2$ can be quantatively expressed as follows:

$$S_1 = -(L-f_1+g)/(f_1-g)\cdot\epsilon \quad (A')$$

$$S_2 = -(L-f_2+g)/(f_2-g)\cdot\epsilon \quad (B')$$

These equations are similar to equations (A) and (B) set forth in the foregoing. If, on this occasion, the focal lengths $f_1$ and $f_2$ are set so that $f_1$ is positive so as to provide a convex lens function while $f_2$ is negative so as to provide a concave lens function and if the distance L is sufficiently large (as compared with $f_1$ and $f_2$), the displacement of the center of gravity of each signal light is of an amount equal to the magnified amount of the positional deviation and, additionally, the displacements of the two signal lights are in the opposite directions.

When the difference $\Delta S$ between the positions of the light spots on the sensor 105 surface is expressed by $\Delta S = S_2 - S_1$, then the following relation is obtainable:

$$\Delta S = -[(L-f_2+g)/(f_2-g)+(L-f_1+g)/(f_1-g)]\cdot\epsilon$$

In a case when the alignment mark 104 is of reflection type, this can be obtained in a similar manner. Namely, on such on occasion, the part of FIG. 16 downstream of the alignment mark 104 can be considered as the light reflected by the alignment mark 104.

Next, description will be made of a case where the second object 102 is inclined by a small amount $\beta$. In this case, in accordance with the law of reflection, each light emanating from the alignment mark 104 is inclined by an angle $2\beta$. If the distance L is sufficiently large, the displacement of each spot resulting from such inclination can be given by $S\beta = 2\beta L$. Regardless of whether the alignment system is provided by a "convex-concave system" or "concave-convex system", the position of the light spot on the sensor 105 surface changes, and it follows that:

$$S_1' = S_1 + 2\beta L$$

$$S_2' = S_2 + 2\beta L$$

$$\Delta S' = S_2' - S_1' = S_2 - S_1 = \Delta S$$

It is seen therefrom that the difference $\Delta S$ between the positions of the light spots is not dependent upon the inclination.

In this embodiment, the displacements $S_1$ and $S_2$ of the signal lights, on the sensor 105 surface, can be expressed in accordance with equations (A') and (B') and, if:

$f_1 = 430$ microns $f_2 = -370$ microns $g = 30$ microns $L = 40000$ microns then, $S_1 = -(4000 - 430 + 30)/(430 - 30)\cdot\epsilon$
$= -99\epsilon$ $S_2 = -(4000 + 370 + 30)/(-370 - 30)\cdot\epsilon$
$= 101\epsilon$ Taking a differential signal $S_2 - S_1$, it can be expressed by:

$$S_2 - S_1 = (101 + 99)\epsilon = 200\epsilon$$

Therefore, it can be detected at a sensitivity two-hundred times higher than the positional deviation $\epsilon$ between the first and second objects 101 and 102.

When the sensor 105 has a resolution of 1 micron, it is possible to detect a positional deviation of 0.005 micron.

When the first object 101 is a mask and the second object 102 is a wafer and the alignment system is applied to the alignment in a proximity type exposure apparatus, it is preferable that as in the present embodiment, the alignment mark 104 of the wafer 102 comprises a a linear grating lens. This is desirable in consideration of deformation of a mark due to the process, for example. Also, if desired, the mark on the first object 101 side may be provided by a linear grating lens.

While in the present embodiment a linear grating lens is provided on the second object 102 surface, it may be provided on the first object 101 surface, rather than the second object surface, and first and second alignment marks for the first and second signal lights may be provided on the second object surface. On that occasion, substantially the same advantageous effects are attainable.

As regards the manner of disposition of the first and second alignment marks to be provided on the first or second object, for obtaining the first and second signals, these marks may be arrayed in the alignment direction (X direction) of the first and second objects, as in the example of FIGS. 15 and 16, or they may be arrayed in a direction perpendicular to the alignment direction or parallel thereto. Further, they may be superposed in the same region.

Figure 17:
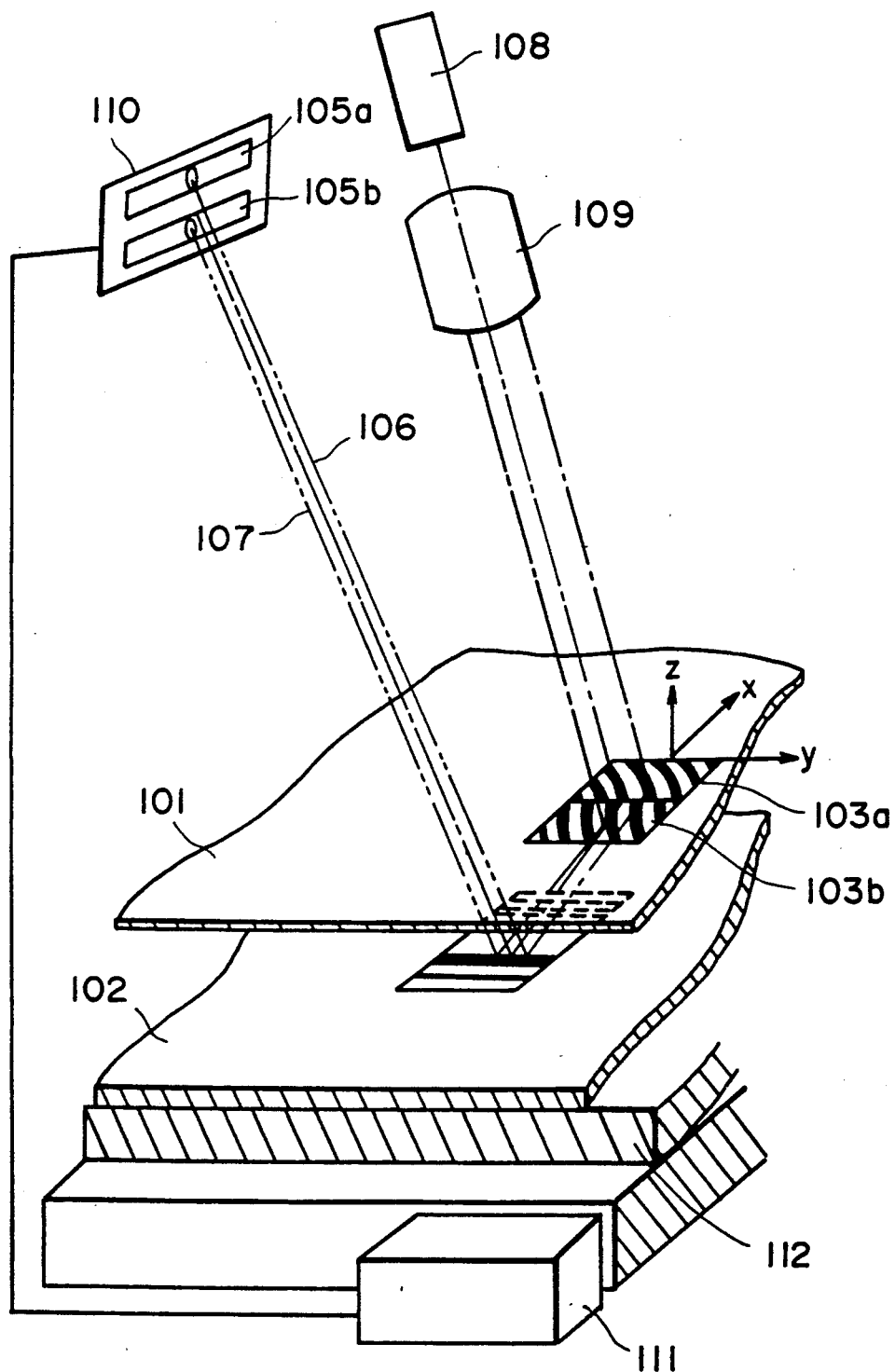
FIG. 17 is a schematic view of a major part of a ninth embodiment of the present invention.
Figure 18:
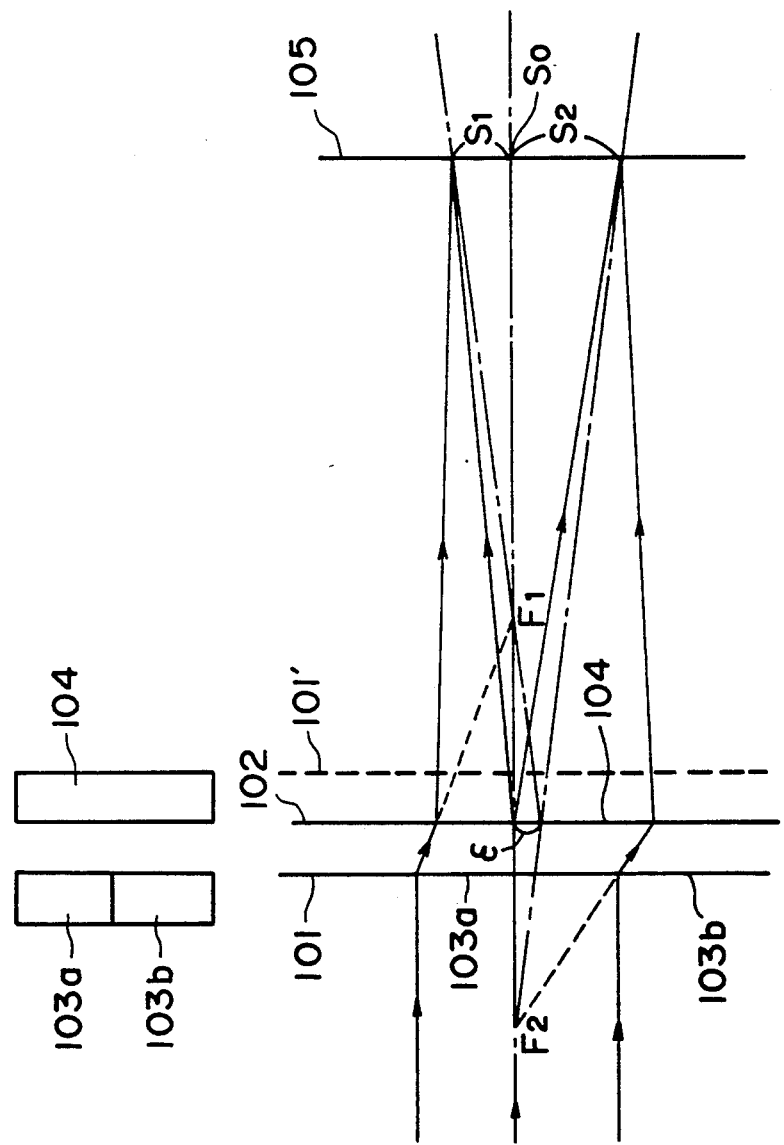
FIG. 18 is a schematic representation showing, in an unfolded view, optical paths of a portion of the FIG. 17 embodiment.

FIG. 17 is a schematic view of a major part of a ninth embodiment of the present invention, and FIG. 18 illustrates, in an unfolded view, optical paths in this embodiment.

In the present embodiment, first object 101 is provided with first and second alignment marks 103a and 103b which are juxtaposed with each other in the alignment direction (X direction, in this embodiment). As shown in FIG. 18, the optical axis of each of the first and second alignment marks 103a and 103b is at the mark boundary, and these marks are set so as to focus the light at the positions of points $F_1$ and $F_2$, respectively. The manner of displacements of the lights on the sensor 105 surface is substantially the same as that in the eighth embodiment.

Figure 19:
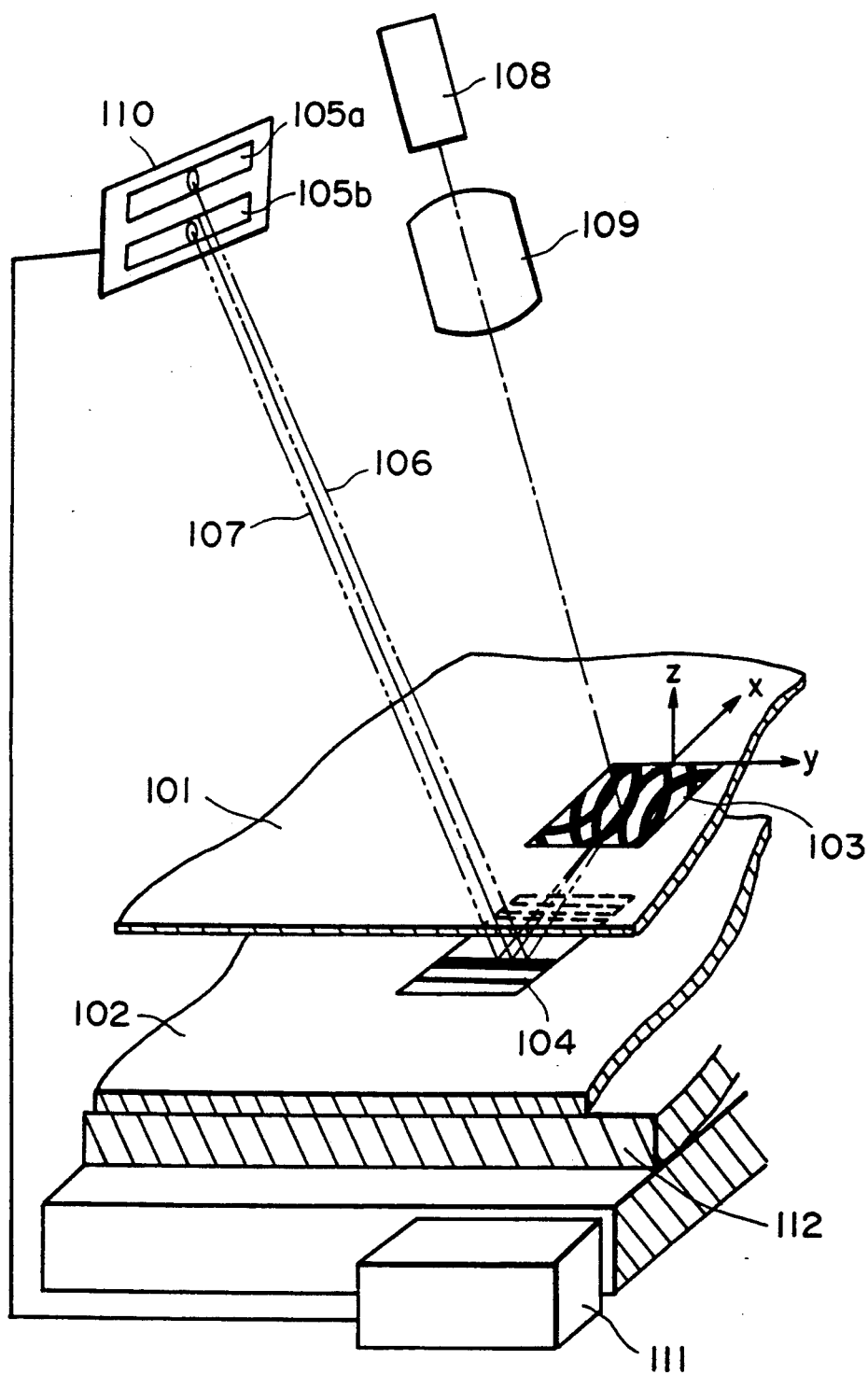
FIG. 19 is a schematic representation of a major part of a tenth embodiment of the present invention.
Figure 20:
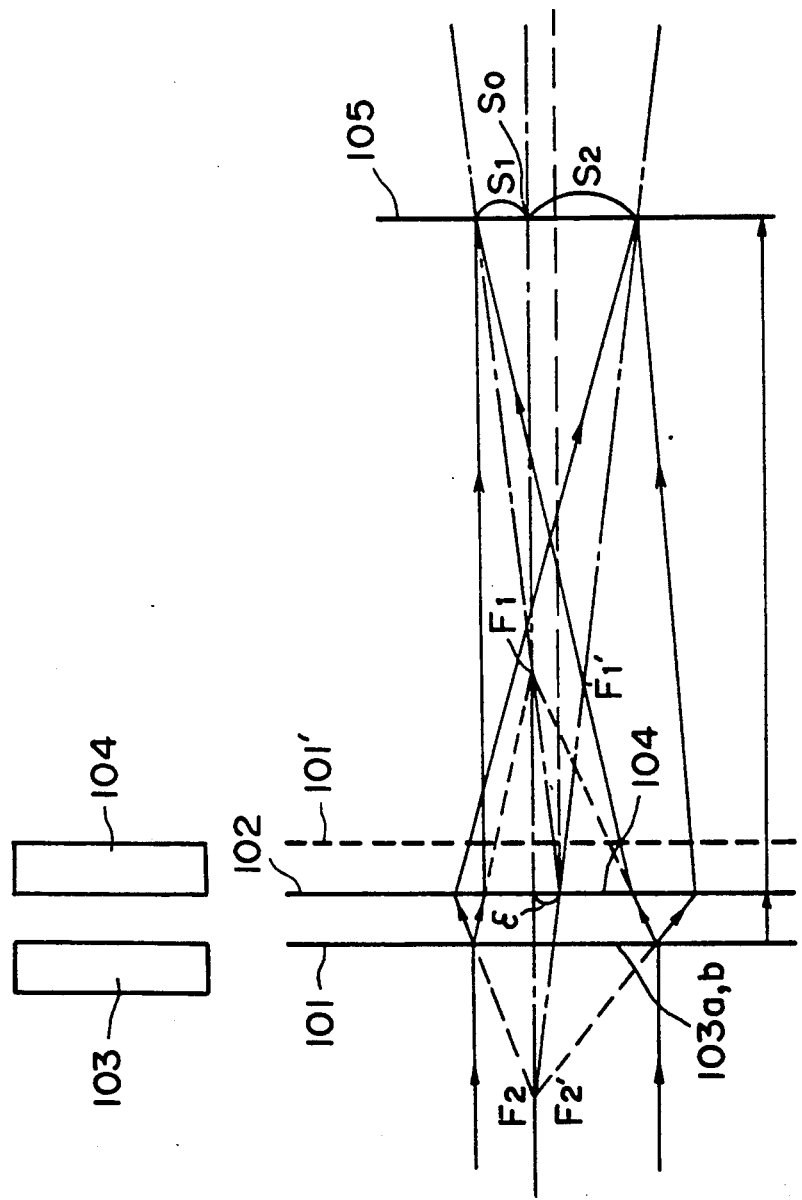
FIG. 20 is a schematic representation showing, in an unfolded view, optical paths of the FIG. 19 embodiment.

FIG. 19 is a schematic view of a major part of a tenth embodiment of the present invention, and FIG. 20 illustrates, in an unfolded view, optical paths in the FIG. 19 embodiment.

In this embodiment, first object 101 is provided with a physical optic element 103 which is formed by superposing a first alignment mark 103a having a convex lens function and a second alignment mark 103b having a concave lens function, one upon another.

As shown in FIG. 20, the optical axis of each of the first and second alignment marks is at the mark center, and these marks are set so as to provide a convex lens function and a concave lens function, respectively, such that lights are focused at points $F_1$ and $F_2$, respectively. The motion of lights on the sensor 105 surface is essentially in the same manner as of the eighth embodiment.

Figure 21:
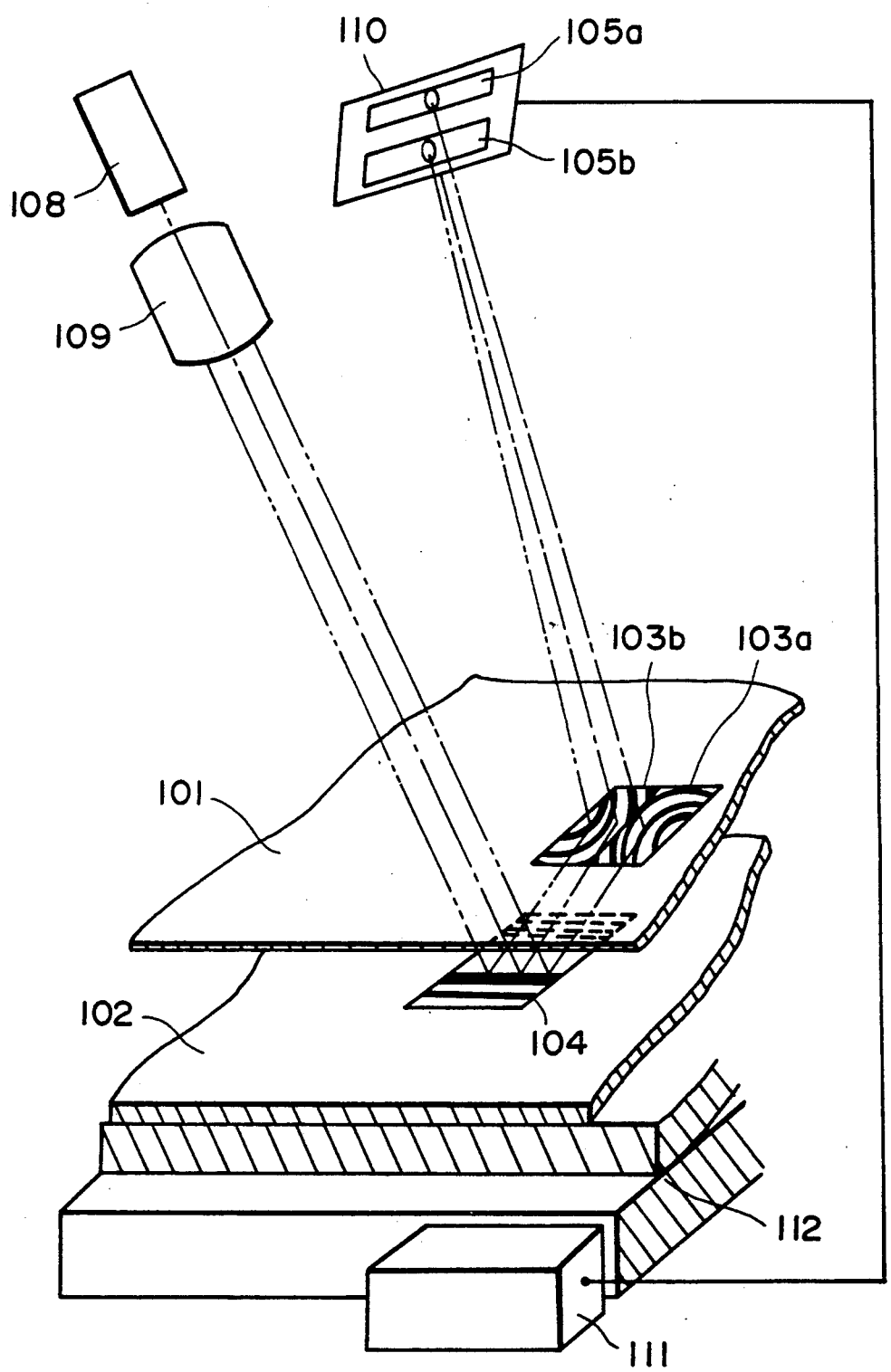
FIG. 21 is a schematic view of a major part of an eleventh embodiment of the present invention.
Figure 22:
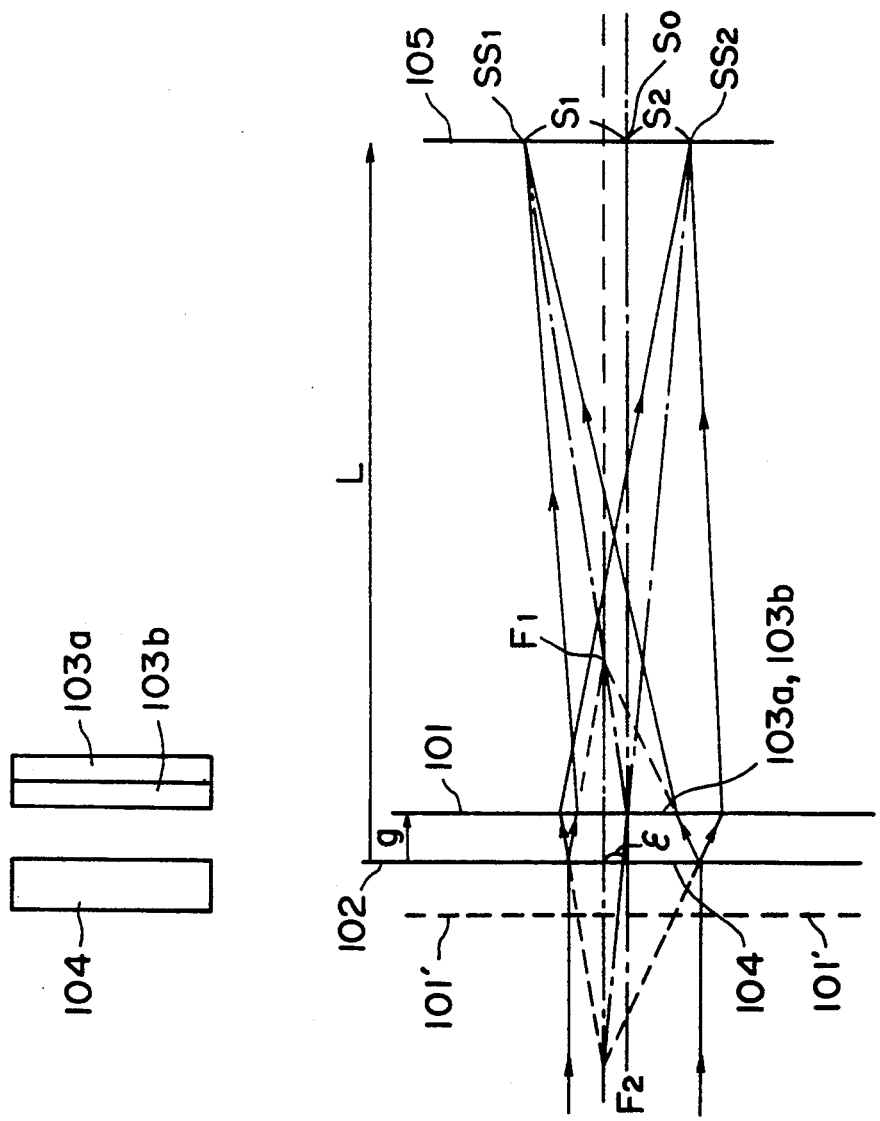
FIG. 22 illustrates, in an unfolded view, optical paths of a portion of the FIG. 21 embodiment.

FIG. 21 is a schematic view of a major part of an eleventh embodiment of the present invention, and FIG. 22 illustrates, in an unfolded view, optical paths in the FIG. 21 embodiment.

In the present embodiment, light from a light source 108 is transformed by a projecting lens 109 into a parallel light which first illuminates a second physical optic element 104 provided on a second object 102. Reflective diffraction light from the second physical optic element 104 is inputted to first and second alignment marks 103a and 103b, providing a first physical optic element on a first object 101. Diffraction lights of predetermined orders from these marks 103a and 103b are detected by sensors 105a and 105b. The second physical optic element 104 of the second object 102 is formed by a linear grating lens, and the inputted parallel light is diffracted thereby. Of the diffracted rays, positive first order diffraction light is focused at a focal point $F_1$ while negative first order diffraction light is focused at a focal point $F_2$. The focal lengths in this case are $f_1$ and $-f_1$, respectively. The first alignment mark 103a of the first object 101 has a concave lens function for imaging on the sensor 105a surface the light focused at the point $F_1$. The second alignment mark 103b has a convex lens function for imaging on the sensor 105b surface the light focused at the point $F_2$.

Assuming now that the relative positional deviation between the first and second objects 101 and 102 is denoted by $-\epsilon$ and that the imaging points on the sensor 105 surface of the points $F_1$ and $F_2$ are denoted by $SS_1$ and $SS_2$, the displacements $S_1$ and $S_2$ of the positions of the signal lights corresponding to the positional deviation, which displacements can be geometo-optically determined as the points of intersection with the detection surface 105 of the straight lines connecting the points $F_1$ and $F_2$ with the optical axis centers of the first and second alignment marks 103a and 103b, are quantatively expressed in the following manner:

$$S_1 = (L-g)/(f_1-g) \cdot \epsilon \qquad (2)$$

$$S_2 = (L-g)/(-f_1-g) \cdot \epsilon \qquad (3)$$

If, $f_1 = 400$ microns $L = 40000$ microns $g = 30$ microns then, $S_1 = (40000 - 30)/(400 - 30) \cdot \epsilon = 3997/37 \cdot \epsilon$
$\phantom{S_1} = 108\epsilon$ $S_2 = (40000 - 30)/(-400 - 30) \cdot \epsilon = -3997/43 \cdot \epsilon$
$\phantom{S_2} = -93\epsilon$ Taking a differential signal $S_2 - S_1$, then the following relation is obtainable.

$$S_2 - S_1 = -93\epsilon - 108\epsilon = -201\epsilon$$

Therefore, it can be detected at a sensitivity two-hundred-one (201) times larger than the positional deviation $\epsilon$ between the first and second objects 101 and 102.

Figure 23:
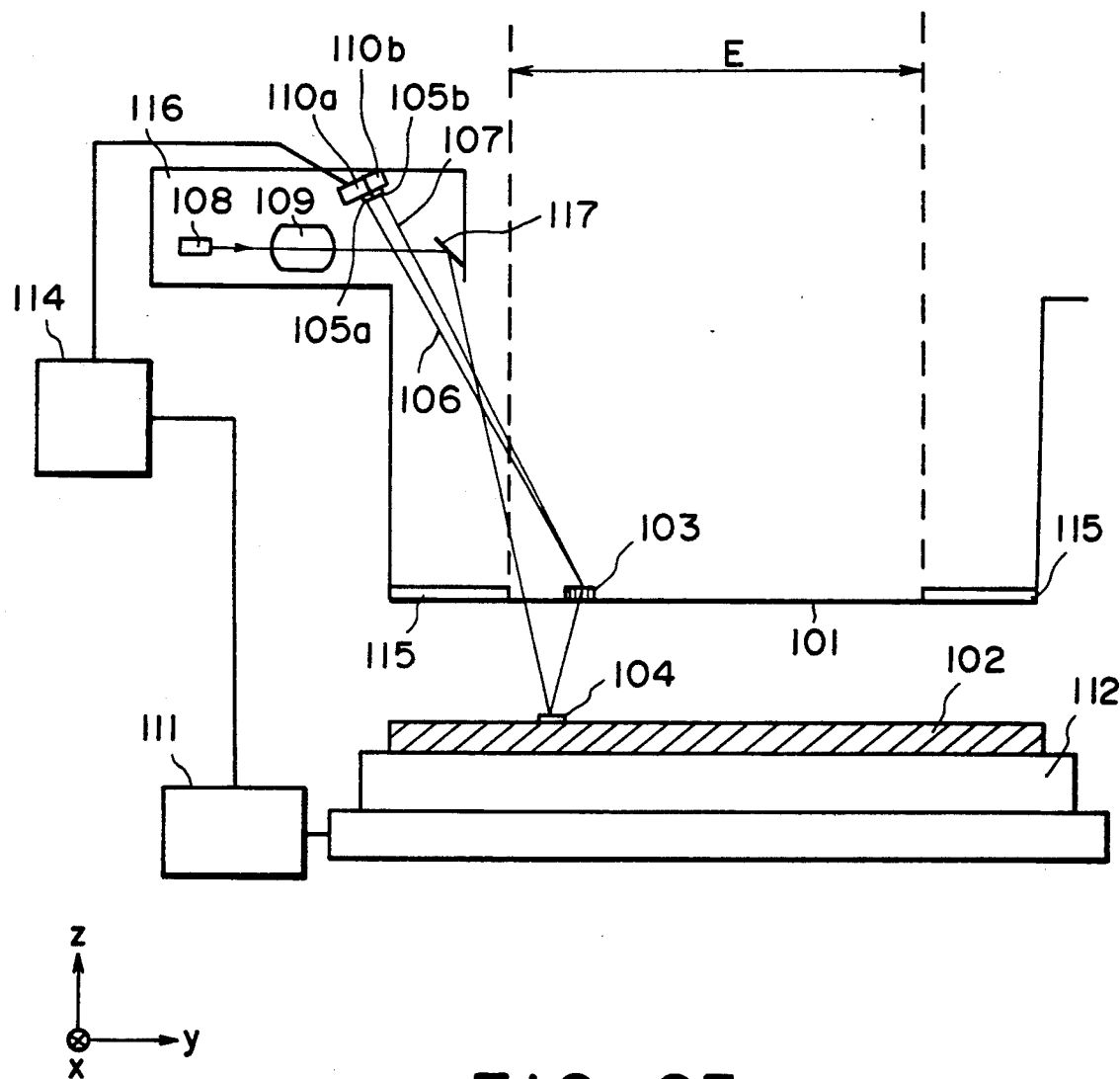
FIG. 23 is a schematic view of a major part of a proximity type exposure apparatus, into which the eleventh embodiment is incorporated.

FIG. 23 is a schematic representation of a major part of an embodiment wherein the alignment system according to the eleventh element, shown in FIG. 21, is incorporated into a semiconductor device manufacturing exposure apparatus of proximity type.

In FIG. 23, a light projecting system and a light receiving system are accommodated in a pick-up head 116 wherein an alignment light source 108, a light projecting lens 109, a projecting mirror 117, sensors 105a and 105b and processing circuits 110a and 110b are mounted into an integral structure, and the alignment device as a whole can be moved to the alignment mark position by means of a movable stage, not shown. The alignment light projected from the pick-up head 116 passes a mask (first object) 101 supported by a mask holder 115 and then is diffracted by an alignment mark 104 provided on a wafer (second object) 102 supported by a wafer stage 112. Thereafter, the light is diffracted by an exit side alignment mark 103 provided on the mask (first object) 101, and goes back to the pick-up head 116 so that it is received by the sensors 105 and 105a. The information regarding the spots of diffraction lights received by the sensors 105a and 105b, is processed by the processing circuits 110a and 110b and, thereafter, it is recognized by an exposure system controller 114 as the alignment information related to the mask 101 and the wafer 102. In response, a movement signal is supplied to a stage controller 111 so as to cause the wafer stage 112 to move to a correct position for the exposure and, in this manner, the wafer stage 112 is positioned.

After completion of the alignment, an exposure beam is projected through an exposure region denoted at E, whereby the printing is made. Here, the alignment light goes and comes back in the manner providing an inclined light projection system and an inclined light reception system and, therefore, no retracting motion is necessary.

Figure 24:
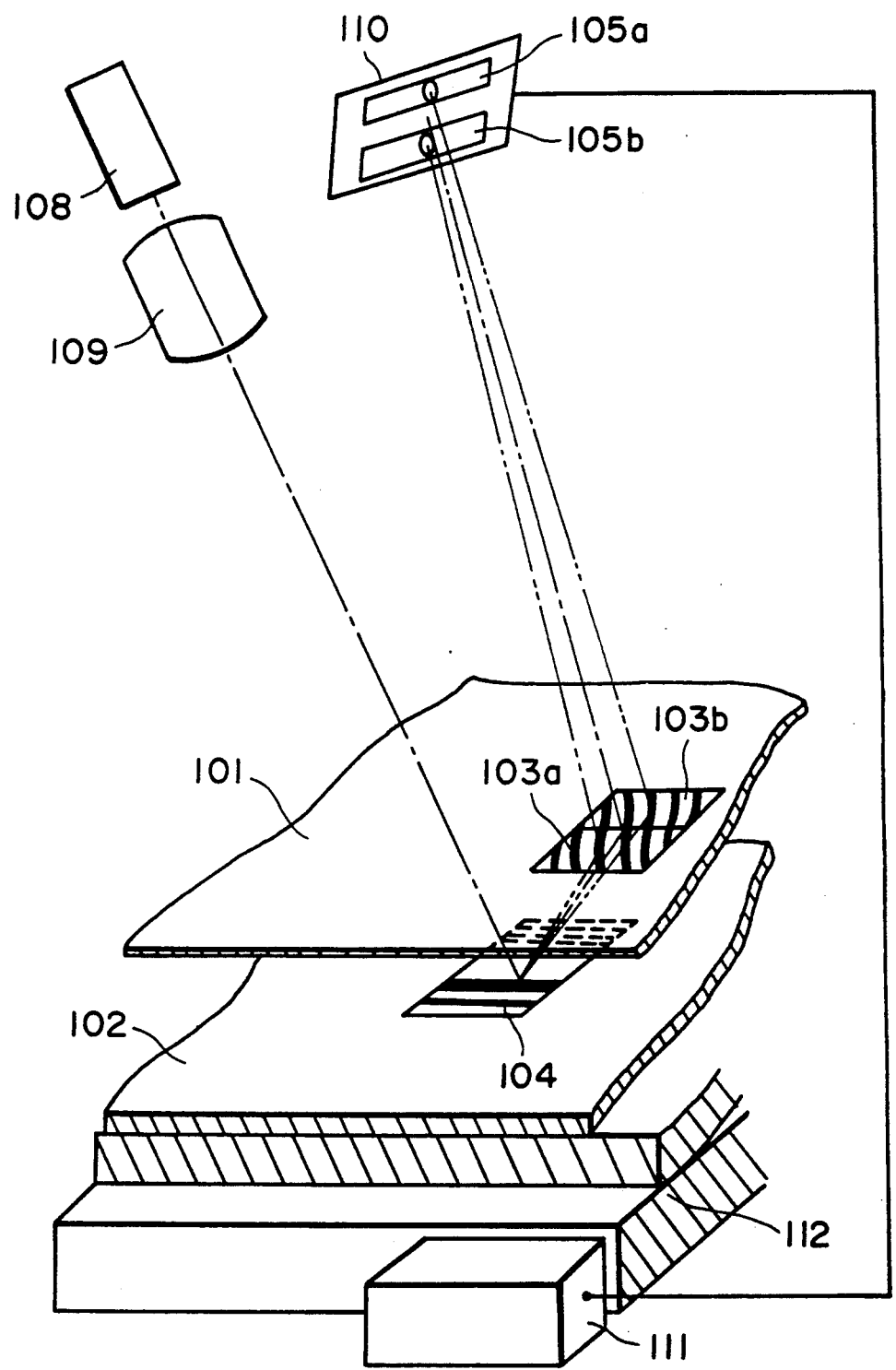
FIG. 24 is a schematic view of a major part of a twelfth embodiment of the present invention.
Figure 25:
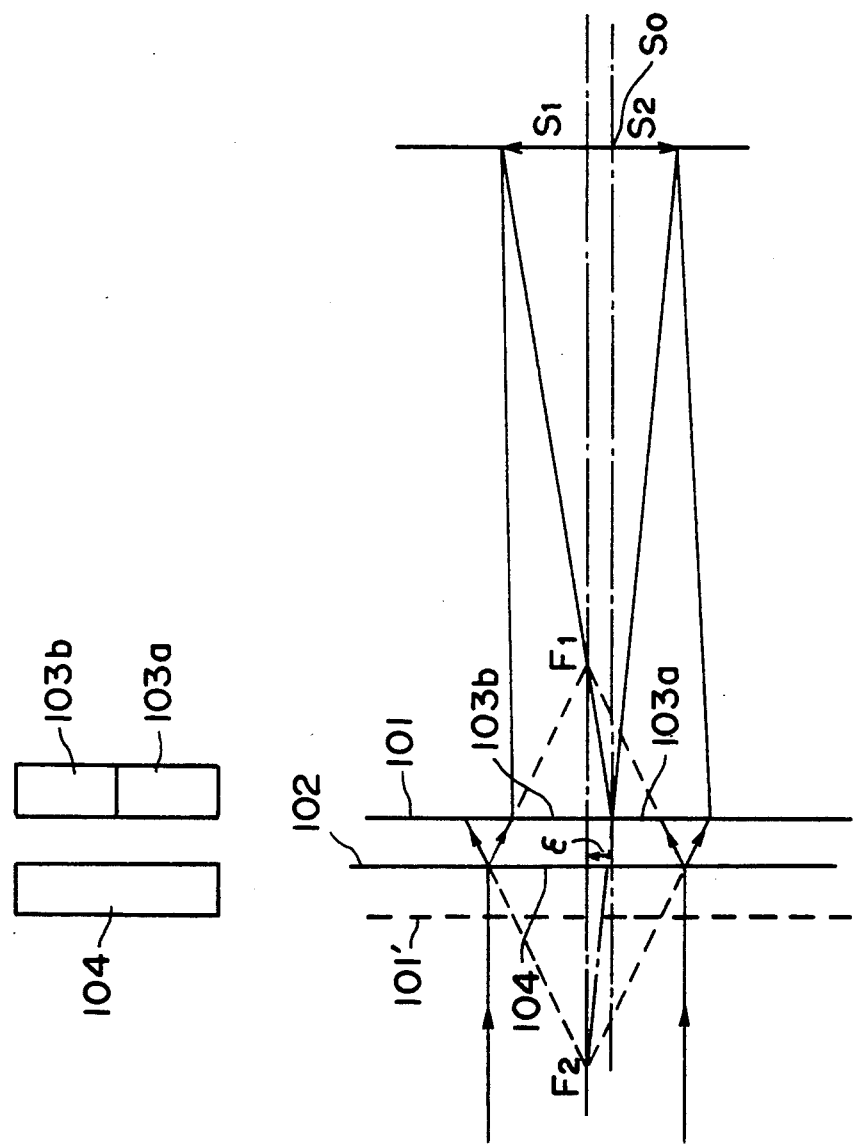
FIG. 25 illustrates, in an unfolded view, optical paths of a portion of the FIG. 24 embodiment.

FIG. 24 is a schematic view of a major part of a twelfth embodiment of the present invention, and FIG. 25 illustrates, in an unfolded view, optical paths in the FIG. 24 embodiment.

In the present embodiment, like the eleventh embodiment shown in FIG. 21, alignment light is projected first on an alignment mark 104 of a second object 102, and the reflective diffraction light therefrom is inputted to first and second alignment marks 103a and 103b of a first object 101, and finally diffraction lights from these marks are received by sensors 105a and 105b. The first and second alignment marks 103a and 103b of the first object 101 are disposed to be juxtaposed with each other in the alignment direction.

As shown in FIG. 25, the optical axis of each of the first and second alignment marks 103a and 103b is at the mark boundary, and these marks are so set as to focus the lights at points $F_1$ and $F_2$, respectively. The motion of the light spots on the sensor 105 surface is in the same manner as of the eleventh embodiment.

Figure 26:
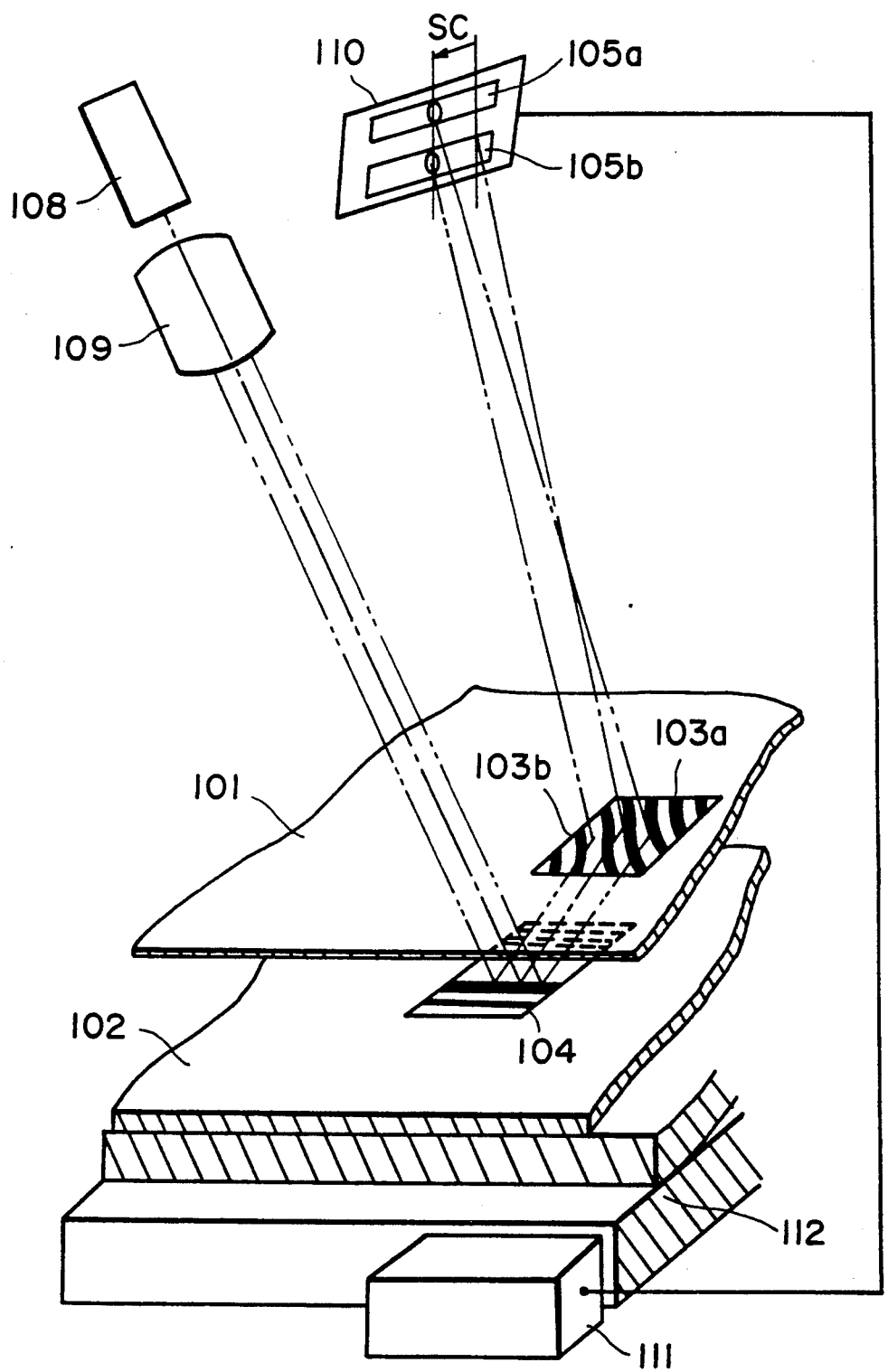
FIG. 26 is a schematic view of a major part of a thirteenth embodiment of the present invention.
Figure 27:
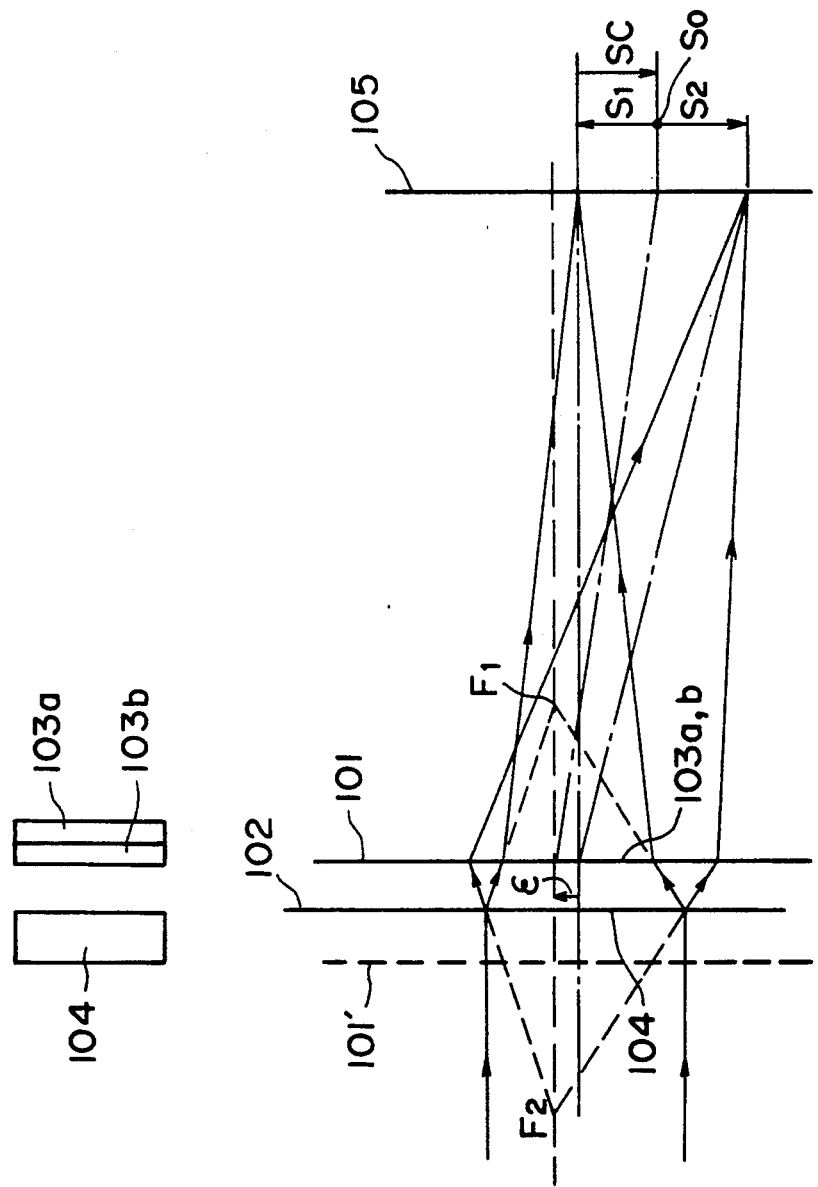
FIG. 27 illustrates, in an unfolded view, optical paths of a portion of the FIG. 26 embodiment.

FIG. 26 is a schematic view of a major part of a thirteenth embodiment of the present invention, and FIG. 27 illustrates, in an unfolded view, optical paths in the FIG. 26 embodiment.

The alignment system of the present embodiment is arranged so that the position of incidence of the alignment light on the sensor 105 surface, when the first and second objects 101 and 102 have no relative positional deviation, is shifted through a length Sc from the line of intersection between the sensor surface and a sectional plane perpendicular to the alignment direction and passing the center of the alignment mark.

Alignment mark 104 provided on the second object 102 as well as the state of focus of diffraction light therefrom are the same as those in the eleventh embodiment, but alignment marks 103a and 103b on the first object 101 are provided additionally with deflecting function, such that in a state where no positional deviation is present between the first and second objects 101 and 102, the signal light comes to a position So on the sensor 105 surface, shifted through the distance Sc.

As a result of a positional deviation $\epsilon$ between the first and second objects 101 and 102, two signal lights displaces in the opposite directions, from the point $S_0$ through distances $S_1$ and $S_2$, similar to those in the eleventh embodiment.

Figure 28:
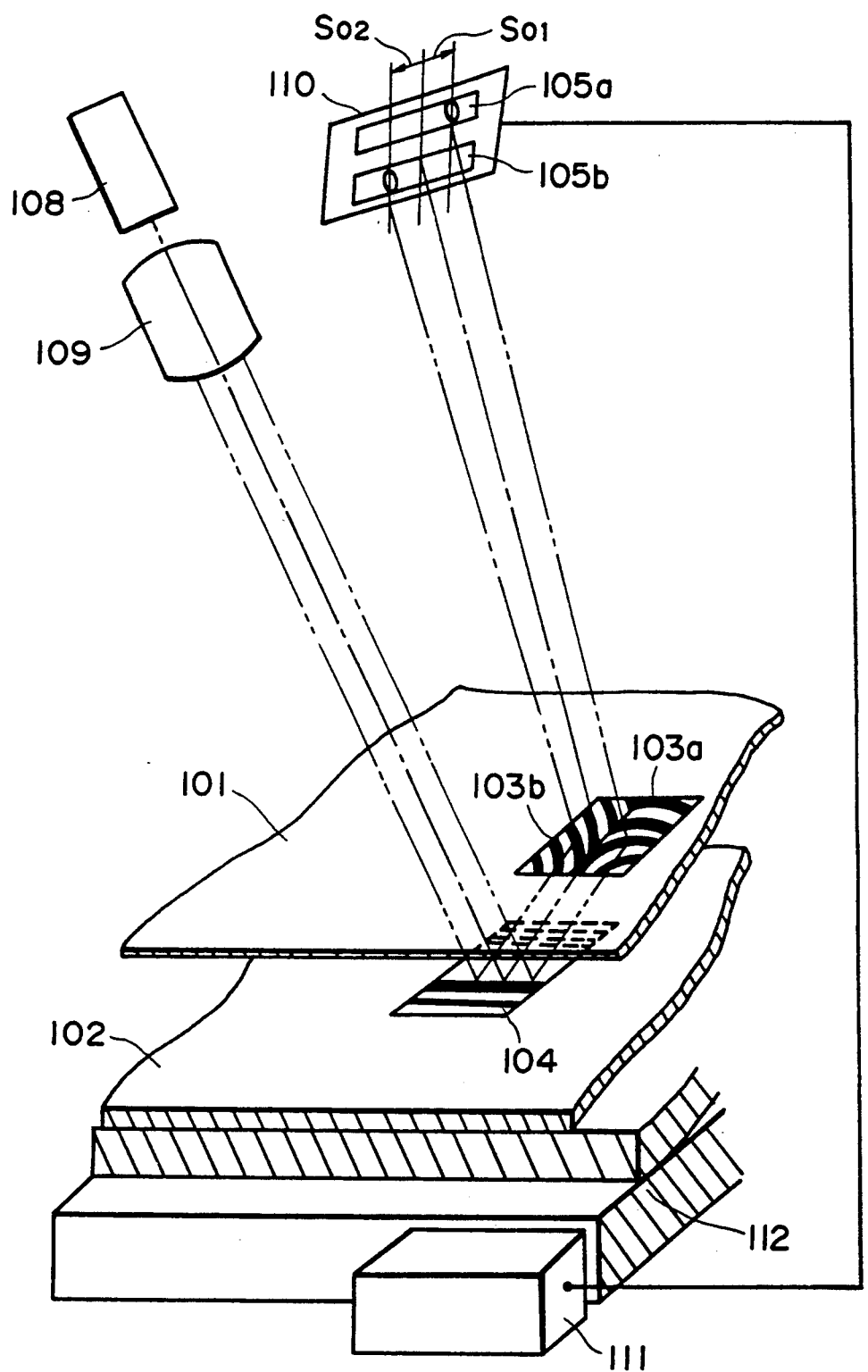
FIG. 28 is a schematic view of a major part of a fourteenth embodiment of the present invention.
Figure 29:
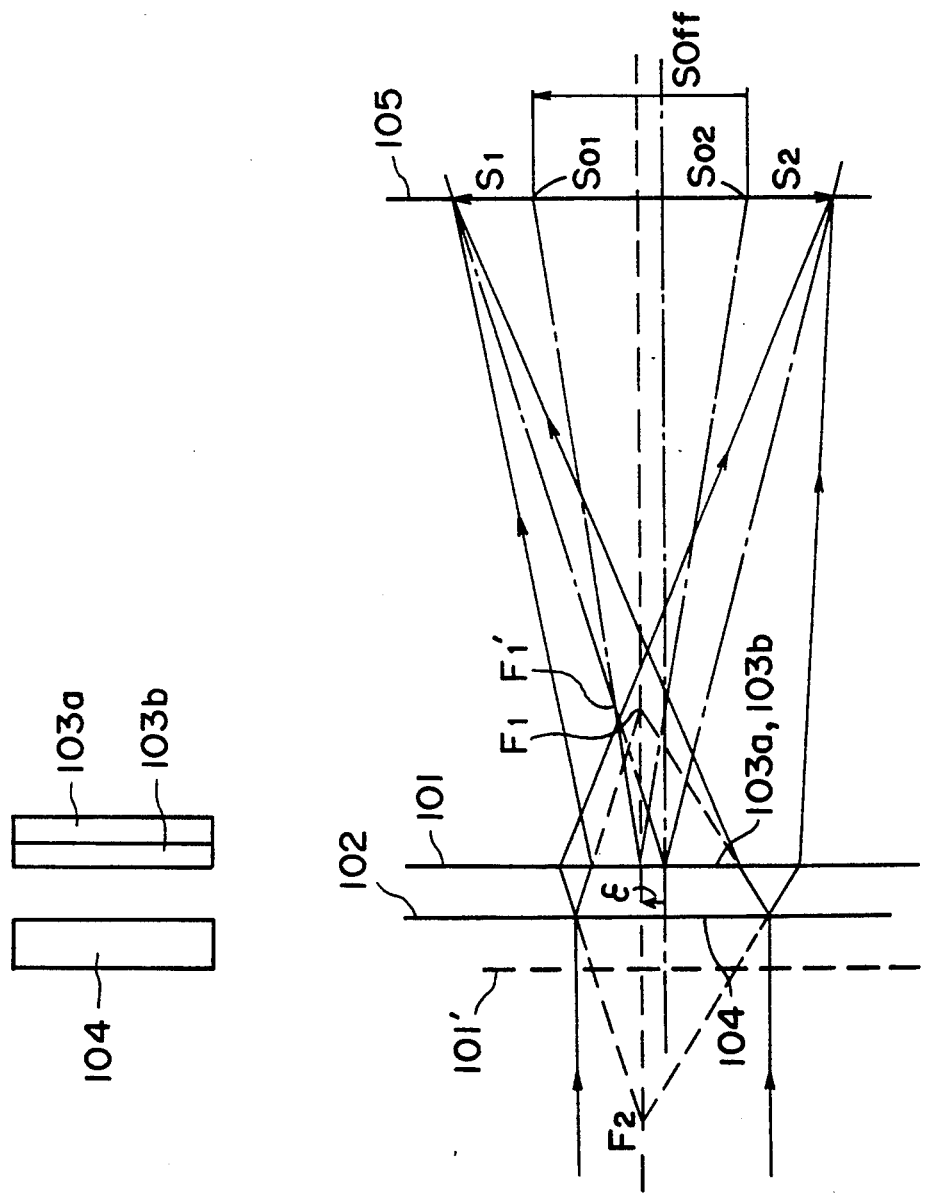
FIG. 29 illustrates, in an unfolded view, optical paths in a portion of the FIG. 28 embodiment.

FIG. 28 is a schematic view of a major part of a fourteenth embodiment of the present invention, and FIG. 29 illustrates, in an unfolded view, the optical paths in the FIG. 28 embodiment.

In the present embodiment, the arrangement is such that the positions of incidence of alignment lights on the sensor 105 surface, when no positional deviation is present between the first and second objects 101 and 102, are shifted by different amounts, in two systems (convex-concave systems and concave-convex system), through distances $S_{01}$ and $S_{02}$ from the line of intersection between the sensor surface and a sectional plane perpendicular to the alignment direction, passing the center of the alignment mark, and an offset $S_{off} = S_{02} - S_{01}$ is added. The alignment mark 104 of the second object 102 as well as the state of convergence of the diffraction light therefrom are substantially the same as those of the eleventh embodiment, but alignment marks 103a and 103b of the first object 101 are provided, additionally, with deflecting function such that, when no positional deviation is present between the first and second objects 101 and 102, signal lights come to positions $S_{01}$ and $S_{02}$ on the sensor 105 surface, shifted by distances $Sc_1$ and $Sc_2$, respectively.

As a result of a positional deviation $\epsilon$ between the first and second objects 101 and 102, the signal lights displace in these opposite directions from the points $S_{01}$ and $S_{02}$ through distances $S_1$ and $S_2$, in the same manner as of the eleventh embodiment.

Figure 30:
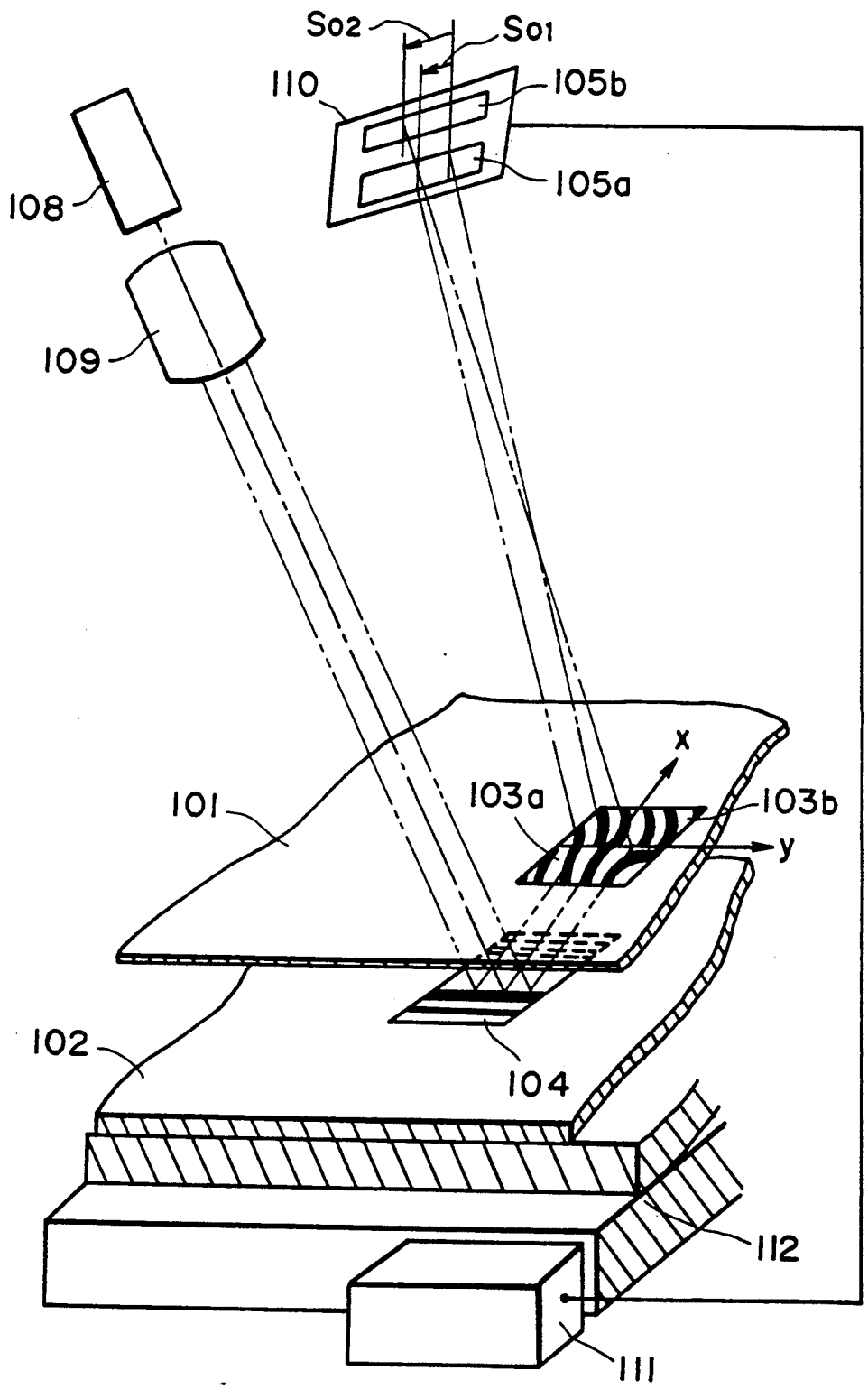
FIG. 30 is a schematic view of a major part of a fifteenth embodiment of the present invention.
Figure 31:
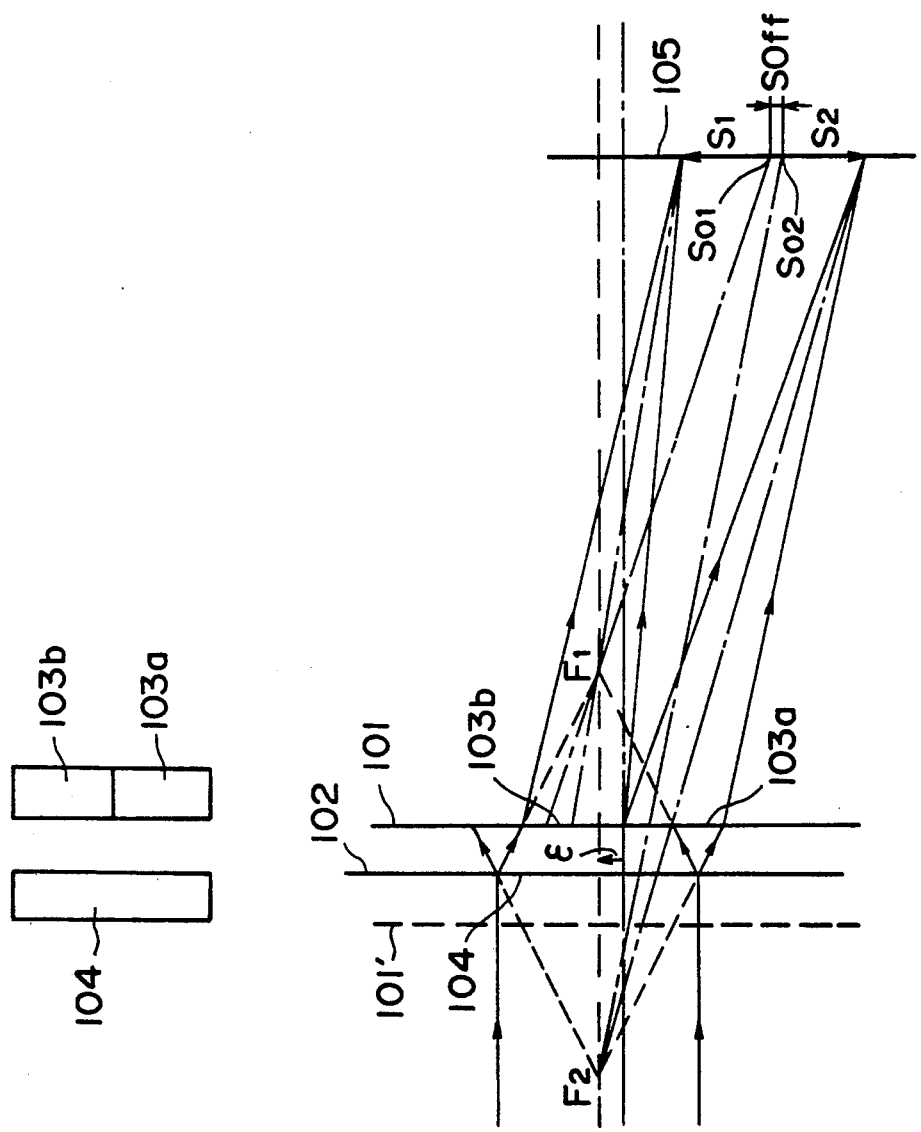
FIG. 31 illustrates, in an unfolded view, optical paths in a portion of the FIG. 30 embodiment.

FIG. 30 is a schematic view of a major part of a fifteenth embodiment of the present invention, and FIG. 31 illustrates, in an unfolded view, the optical paths in the FIG. 30 embodiment.

In this embodiment, first object 101 is provided with first and second alignment marks 103a and 103b which are juxtaposed with each other in respect to the alignment direction (X direction).

The optical axis of each of the first and second alignment marks 103a and 103b is at the corresponding mark center and, by an amount corresponding to the deviation thereof with respect to the optical axis of an alignment mark 104 of the second object 102, there occurs a deviation on the sensor 105 surface. Thus, when the first and second objects 101 and 102 have no relative positional deviation, the signal lights come to points $S_{01}$ and $S_{02}$ on the sensor 105.

As a result of a positional deviation $\epsilon$ between the first and second objects 101 and 102, these signal lights displace in the opposite directions from the points $S_{01}$ and $S_{02}$, respectively, through distances $S_1$ and $S_2$ in the same manner as the eleventh embodiment.

Figure 32:
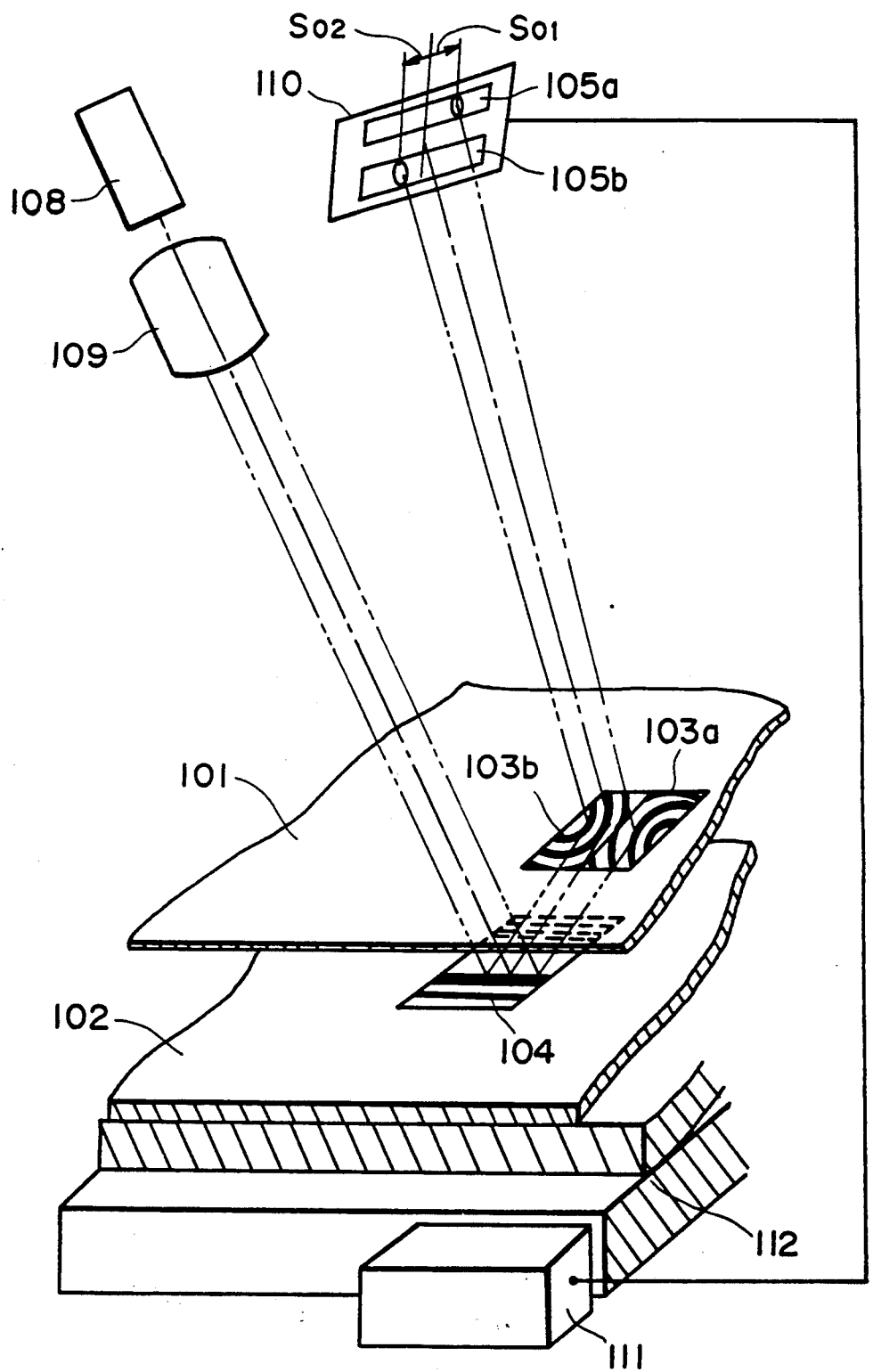
FIG. 32 is a schematic view of a major part of a sixteenth embodiment of the present invention.
Figure 33:
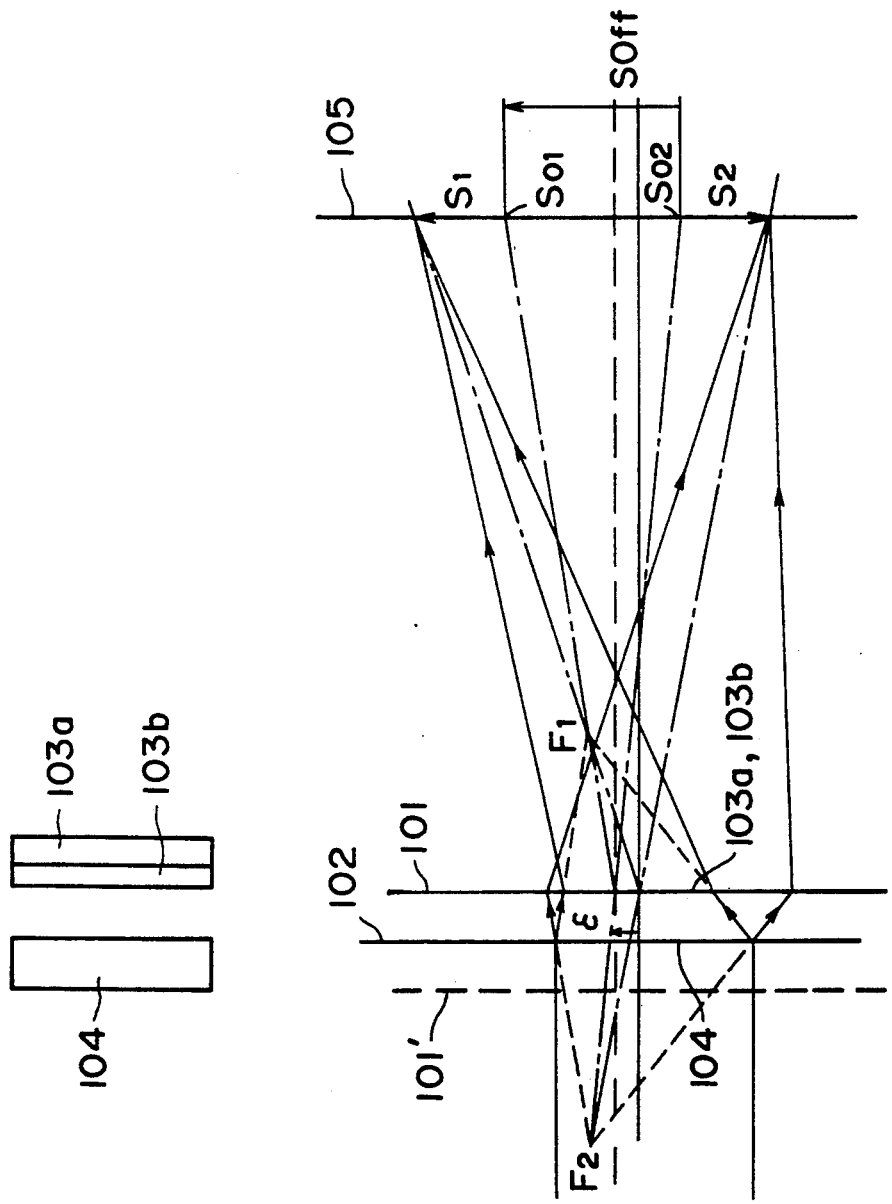
FIG. 33 illustrates, in an unfolded view, optical paths in a portion of the FIG. 32 embodiment.

FIG. 32 is a schematic view of a major part of a sixteenth embodiment of the present invention, and FIG. 33 illustrates, in an unfolded view, the optical paths in the FIG. 32 embodiment.

The present embodiment is arranged such that a first physical optic element 103 on the first object 101 and a second physical optic element 104 on the second object 102 provides two systems (convex-concave system and a concave-convex system), and an offset therefor is provided by the alignment mark 104 on the second object 102 which is formed by a linear grating lens. Light incident on the alignment mark 104 of the second object 102 is diffracted to produce two lights having wave surfaces to be focused at points $F_1$ and $F_2$. These positions $F_1$ and $F_2$ are at those points skewed with respect to a normal to the center of the alignment mark, and the signal lights which are in the directions connecting these points with the optical axis centers of the first and second alignment marks 103a and 103b of the first object 101, come to different positions of the sensor 105 surface, such as at points $S_{01}$ and $S_{02}$.

As a result of a positional deviation $\epsilon$ between the first and second objects 101 and 102, the signal lights displace in opposite directions from these points $S_{01}$ and $S_{02}$, respectively, through distances $S_1$ and $S_2$, as in the eleventh embodiment.

Figure 34:
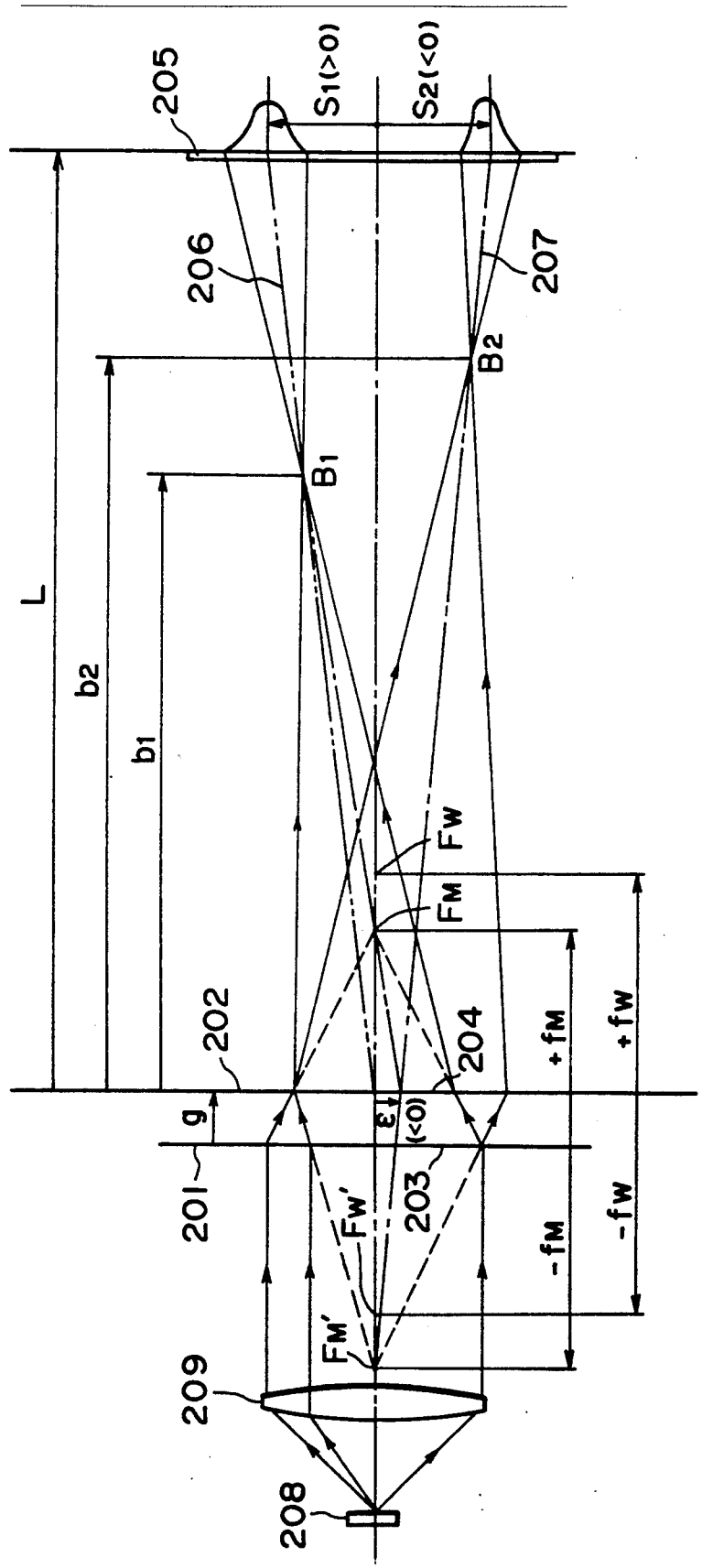
FIG. 34 is a schematic representation showing, in an unfolded view, optical paths in a major part of a seventeenth embodiment of the present invention.

FIG. 34 is a schematic representation of the optical paths in a seventeenth embodiment, for explaining the optical principle of an alignment system of the present invention. In FIG. 34, denoted at 201 and 202 are first and second objects with respect to which any relative positional deviation is to be detected. Denoted at 203 and 204 are first and second physical optic elements which are provided on the first and second objects 201 and 202, respectively.

In this embodiment, light from a light source 208 is transformed by a light projecting lens system 209 into a parallel light which is inputted to the first physical optic element (first alignment mark) 203 on the first object 201. Hereinafter, the first physical optic element will be referred to also as a "first alignment mark". The first physical optic element 203 may comprise, for example, a Fresnel zone plate or a grating lens having a function as a physical optic element providing a one-dimensional or two-dimensional lens action. Two diffraction lights of different orders from the first physical optic element 203, which provide first and second signal lights, are inputted to the second physical optic element (second alignment mark) 204. Hereinafter, the second physical optic element will be referred to also as a "second alignment mark".

The second physical optic element 204 has optical characteristics similar to those of the first physical optic element 203. Two diffraction lights 206 and 207 emanating from the second physical optic element 205 and providing the first and second signal lights, are directed to a detecting means 205 which includes first and second detecting portions 205a and 205b.

In FIG. 34, the optical distance from the second object 202 to the detecting means 205 is denoted by L, the spacing (gap) between the first and second objects 201 and 202 is denoted by g, and focal lengths of the first and second alignment marks 203 and 204 are denoted by $\pm f_M$ and $\pm f_W$. Also, the relative positional deviation between the first and second objects 201 and 0 202 in this case is denoted by $\epsilon$, and the displacements of the gravity centers of the first and second signal lights 206 and 207 on this occasion, with reference to the positions as assumed when the first and second objects are aligned correctly, are denoted by $S_1$ and $S_2$, respectively. For convenience, the light inputted to the first object 201 is of a plane wave, and the sign is such as illustrated.

The displacements $S_1$ and $S_2$ of the gravity centers of the first and second signal lights 206 and 207 can be determined geometrically as the intersection, with the surface of the detecting means 205, of the straight lines connecting the focal points $F_M$ and $F'_M$ of the first alignment mark 203 with the optical axis center of the second alignment mark 204.

Accordingly, in order to assure that, for a relative positional deviation between the first and second objects 201 and 202, the resultant displacements $S_1$ and $S_2$ of the gravity centers of the signal lights are in the opposite directions, the refraction power arrangement of the first and second alignment marks may be set so as to provide a combination of what can be called a "convex-concave system", providing convergence and divergence, with what can be called a "concave-convex system", providing divergence and convergence.

The following explanation will be made by using two systems of a "convex-concave system" and a "concave-convex system".

When the refracting power arrangement of the first and second alignment marks 203 and 204 provides a "convex-concave system", then the displacement $S_1$ can be given by:

$$S1 = (b1 - f_M)/(f_M - g) \cdot L/b1 \cdot \epsilon \tag{5}$$

$$b1 = [f_W(g - f_M)/(-g + f_M - f_W)]$$

If the power arrangement provides a "concave-convex system", then the displacement S2 can be given by:

$$S2 = L/(f_M + g) \cdot \epsilon \tag{6}$$

In these equations, $$f_M << b1, f_M >> g$$

Namely, in a case where the detection is made at a far position and the gap g is small, $$S1 \approx -L/f_M \cdot \epsilon$$

$$S2 \approx L/f_M \cdot \epsilon$$

Thus, the spot positions corresponding to the gravity centers of the lights displace in the opposite directions by the same amount.

Generally, a convex-concave system and a concave-convex system are slightly different in magnification but, for execution of the alignment, evaluation of the difference between the spot positions on the surface of the detecting means 205, i.e., $\Delta S = S2 - S1$, is sufficient. The difference $\Delta S$ in regard to the displacement can be expressed as follows:

$$\Delta S = [1/(f_M + g) + (b1 - f_M)/(f_M - g) \times 1/b1] L\epsilon \tag{7}$$

If $f_M << b1, f_M >> g$, then it follows that: $\Delta S \approx 2L/f_M \cdot \epsilon$ Therefore, it is possible to obtain a sensitivity twice as high as that attainable when one of the convex-concave system and the concave-convex system is used.

This is obtainable essentially in the same manner, even when the second alignment mark 204 is of reflection type. That is, the part of FIG. 34, downstream of the second alignment mark 204, may be considered as the light reflected by the second alignment mark 204.

Next, description will be made of a case where the second object 202 is inclined, for example, by a small amount $\beta$.

In accordance with the law of reflection, all the lights emanating from the second alignment mark 204 are inclined by an angle $2\beta$. If the distance L is sufficiently large, the displacement $S\beta$ of the spot resulting from this inclination can be expressed by $S\beta = 2\beta L$. In each of the convex-concave system and the concave-convex system, the spot position on the surface of the detecting means changes, the displacements $S1'$ and $S2'$ being given by:

$$S1' = S1 + 2\beta L$$

$$S2' = S2 + 2\beta L$$

Here, the difference $\Delta S'$ between these displacements can be expressed by:

$$\Delta S' = S2' - S1' = S2 - S1 = \Delta S$$

It is seen therefrom that the difference $\Delta S'$ between the displacements is not dependent on the inclination, but is constant.

Figure 35:
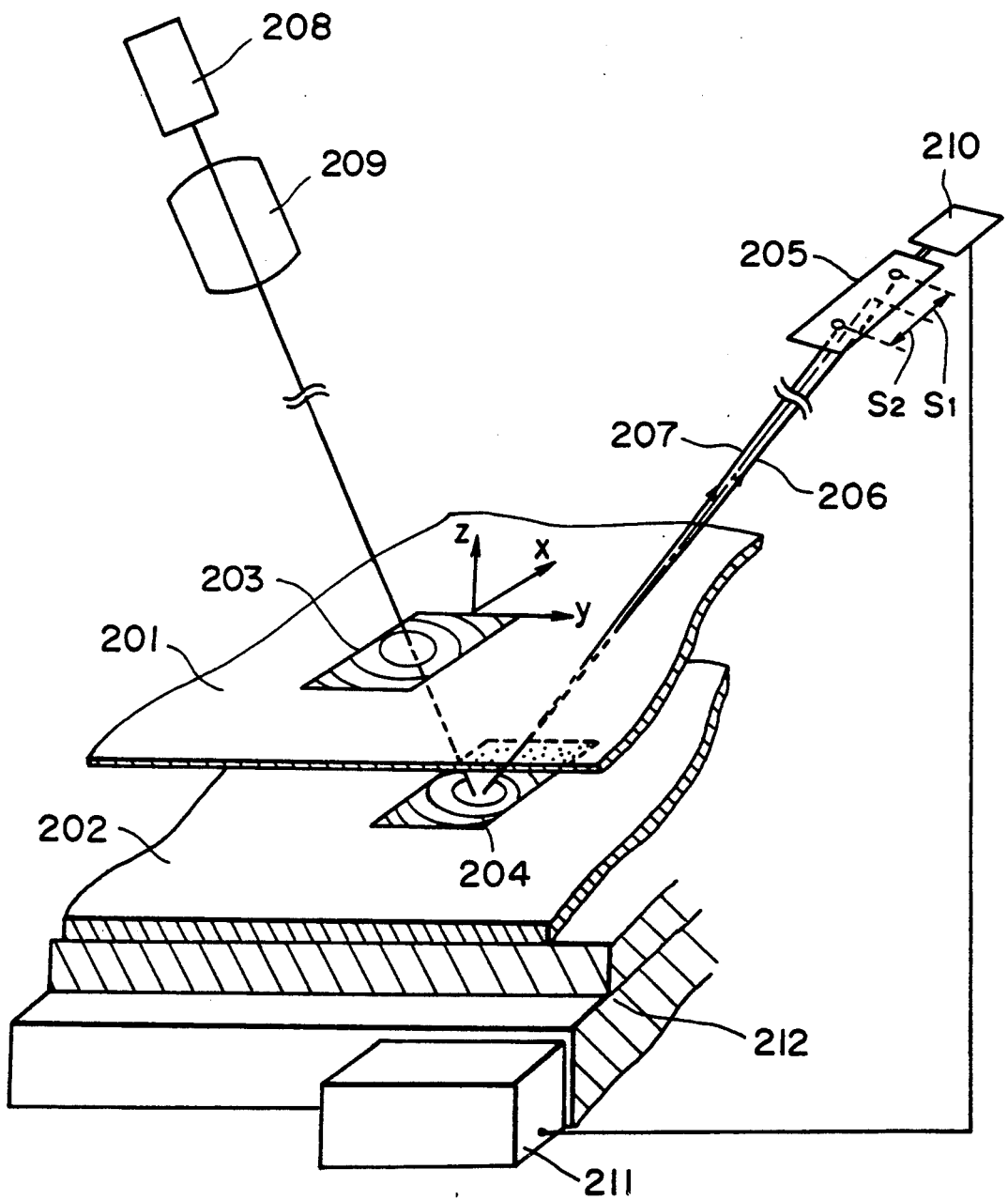
FIG. 35 is a perspective view schematically showing a major part of the FIG. 34 embodiment.

FIG. 35 is a perspective view showing a major part of a seventeenth embodiment of the present invention. In this Figure, a first object 201 is provided with a first alignment mark 203 and a second object 202 is provided with a second alignment mark 204, each of these marks being formed by a two-dimensional Fresnel zone plate. Light from a light source 208 is collimated by a projecting lens 209 into a parallel light which illuminates the first alignment mark 203. The light diffracted by the first alignment mark 203 is again diffracted by the second alignment mark 204, whereby those which correspond to a convex-concave system emanate to provide light 206 (first signal light) while those which correspond to a concave-convex system emanate to provide light 207 (second signal light), both being received by a detecting means 205. A positional deviation signal based on the lights 206 and 207 incident on the detecting means 205, is supplied through a processing circuit 210 to a controller 211. In response, a stage 212 is moved so as to bring the first and second objects 201 and 202 into a predetermined positional relationship, whereby the alignment of them is accomplished.

In this embodiment, when the optical system is unfolded along the inputted light as well as zero-th order transmission light and zero-th order reflection light from the alignment marks and when the path has been projected on a surface perpendicular to the plane of incidence, the path is the same as that shown in FIG. 34. The displacements S1 and S2 of the positions of the light spots on the detecting means 205 can be expressed in accordance with equations (5) and (6).

Assuming now that the focal lengths of the Fresnel zone plates (first and second alignment marks), for $\pm$ first order diffraction lights, as denoted by $\pm f_M$ and $\pm f_W$ are equal to $\pm 400$ microns, the gap $g=30$ microns and the distance L from the second object 202 to the detecting means 205 is L=40000 microns, then, $S1 = -[400/-30 \cdot (30 - 400) - 400]/(400 - 30) \times$ $[-30(30 - 400)]/[400 \times (30 - 400)] \times 40000\epsilon \approx -92\epsilon$ $S2 = 40000/(400 + 30)\epsilon \approx 93\epsilon$ It follows therefrom that the differential signal $\Delta S$ in regard to the displacement is:

$\Delta S = S2 - S1 = [93 - (-92)]\epsilon = 185\epsilon$

Thus, it can be detected at a sensitivity one-hundred and eighty-five (185) times larger than the positional deviation $\epsilon$ between the first and second objects.

Namely, if the detecting means 205 has a resolution of 1 micron, it is possible to detect a positional deviation of 0.0054 micron.

Here, the spot diameters of the lights 206 and 207 are approximately such as follows:

Assuming now that expanded diameters of point images of the lights 206 and 207 due to geometo-optic defocus are denoted by $\phi 1$ and $\phi 2$, respectively, and that expanded diameters due to the diffraction are denoted by $\phi 1'$ and $\phi 2'$, in each system the evaluation results in that:

$\phi 1 = D_M \times (f_m - g)/f_M \times (L - b1)/b1$
$= 100 \times (400 - 30)/400 \times$ -continued
$\{40000 - [(30 - 400)/(-30 + 400 - 400)] \times 400\}$
$\overline{\{[(30 - 400) \times 400]/(-30 + 400 - 400)\}}$
$= 658$ (microns)

$\phi 2 = D_W \times (L - b2)/b2$
$= 100 \times [400 \times (30 + 400)]/(30 + 400 - 400)$
$= 597$ (microns)

$\phi 1' = 2 \times 1.22 \times \lambda \times FNo$
$= 2.44 \times 0.83 \times (40000 \times 400)/[100 \times (400 - 30)]$
$= 876$ (microns)

$\phi 2' = 2 \times 1.22 \times \lambda \times FNo$
$= 2.44 \times 0.83 \times 40000/100$
$= 810$ (microns)

From the foregoing, it follows that in the convex-concave system (first system) the spot diameter is approximately equal to 900 microns whereas, in the concave-convex system (second system), it is approximately equal to 850 microns.

While the spot diameters of these systems are slightly different, it raises substantially no difficulty in arranging a detecting system to allow detection of the center of gravity of each light, independently of the other. As an example, the gravity center can be detected by using a CCD array sensor having a sufficiently fine pitch and by providing divided evaluation zones to these spots, respectively.

Figure 36:
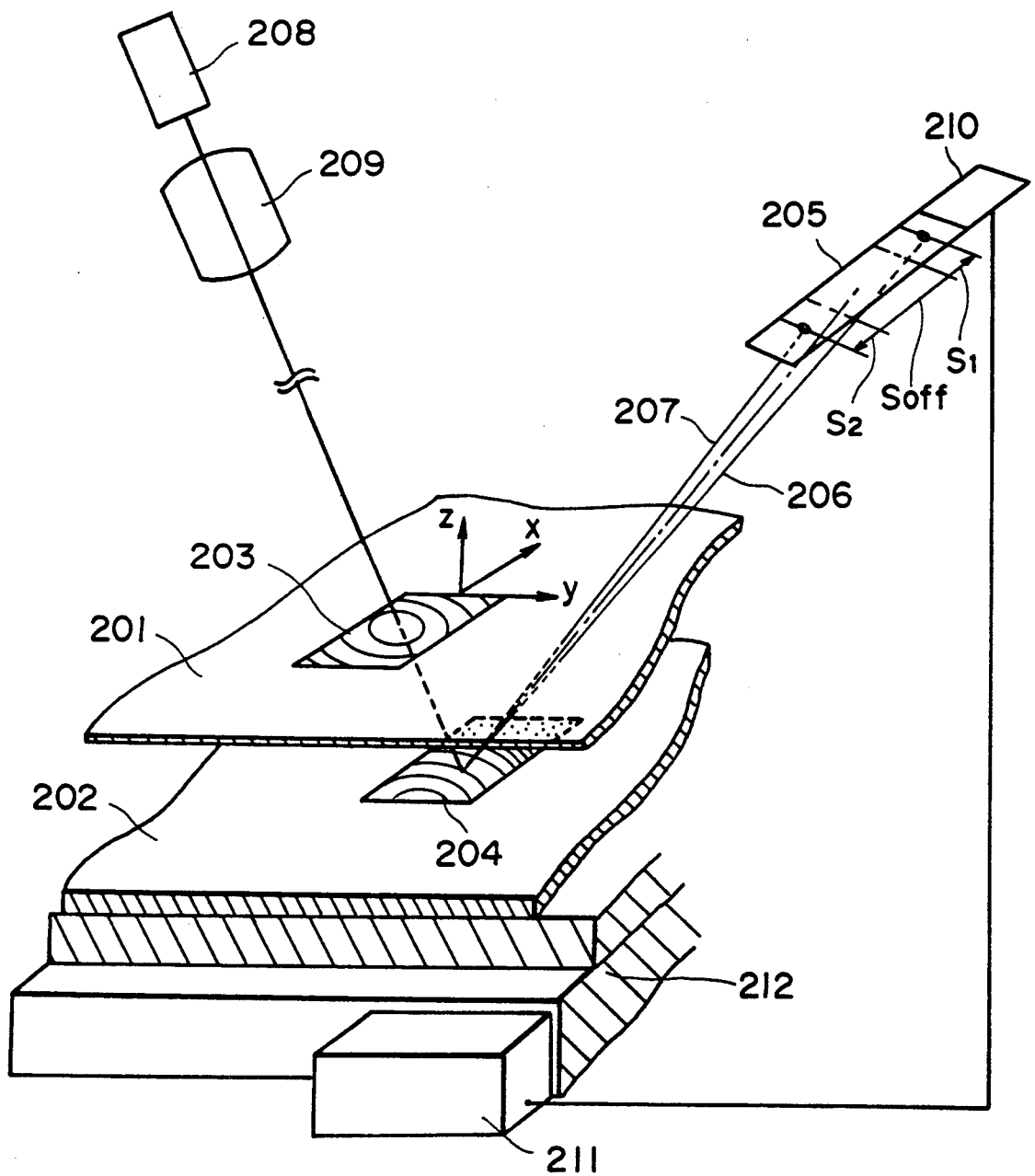
FIG. 36 is a perspective view schematically showing a major part of an eighteenth embodiment of the present invention.

FIG. 36 is a perspective view schematically showing a major part of an eighteenth embodiment of the present invention. In this embodiment, first and second objects 201 and 202 are provided with first and second alignment marks 203 and 204, respectively, which are designed so that, when the centers of the first and second alignment marks 203 and 204 are aligned with respect to the alignment direction, the positions $S_{01}$ and $S_{02}$ of the spots of focused lights on the surface of detecting means 205 include an offset of a certain amount $S_{off}$, in a convex-concave system and a concave-convex system.

Figure 37:
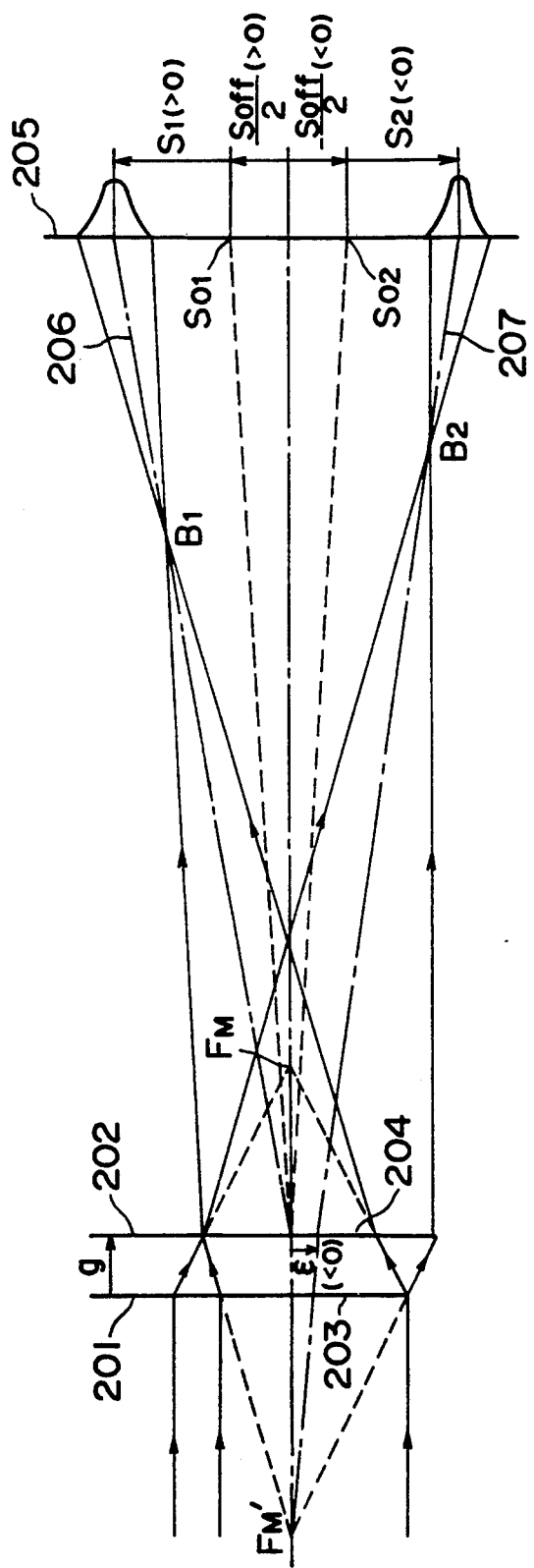
FIG. 37 illustrates, in an unfolded view, optical paths in a portion of the FIG. 36 embodiment.
Figure 38A:
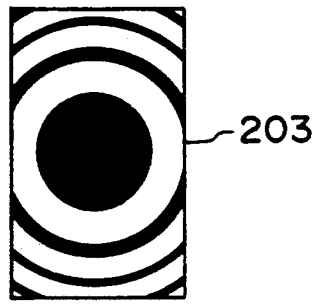
FIGS. 38A and 38B illustrate first and second alignment marks, respectively, usable in the present invention.
Figure 38B:
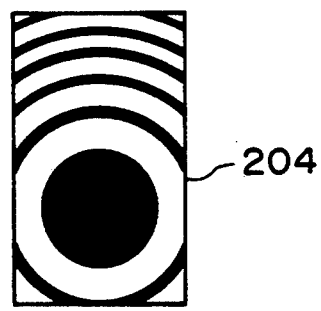

FIG. 37 is a schematic representation wherein the optical paths in the FIG. 36 embodiment are unfolded. FIG. 38A shows the first alignment mark and FIG. 38B shows the second alignment mark, of the FIG. 36 embodiment.

As illustrated in FIG. 38A, the first alignment mark 203 of the first object 201 in the eighteenth embodiment has the same structure as that of the first embodiment. However, as shown in FIG. 38B, the second alignment mark 204 of the second object 202 is set to be eccentric by a degree corresponding to the amount of offset. As best seen in FIG. 37, the alignment mark 204 serves to deflect the light in different directions, the direction being different as the mark functions as a convex lens and as the mark functions as a concave lens.

The spot position on the surface of the detecting means 205 and the positional deviation $\epsilon$ between the first and second objects 201 and 202 can be expressed by:

$S1 = S_{01} + S1$
$= S_{off}/2 - (b1 - f_M)/(f_M - g) \times 1/b1 \times L \times \epsilon$ $S2 = S_{02} + S2$
$= -S_{off}/2 + L/(f_M + g)\epsilon$ The difference $\Delta S$ between the spot positions can be given by:

$$\begin{aligned}\Delta S &= S2 - S1 \\ &= S_{off} + [1/(f_M + g) + \\ &\quad (b - f_M)/(f_M - g) \times 1/b1] \, L \times \epsilon\end{aligned}$$

Accordingly, by subtracting the offset amount $S_{off}$ from the thus determined signal $\Delta S$, it is possible to obtain a signal which is proportional to the positional deviation $\epsilon$.

The provision of such an offset ensures separation of zero-th order transmission light, zero-th reflection light and measurement light on the surface 0 of the detecting means 205 and, therefore, makes the signal processing easier.

Figure 39:
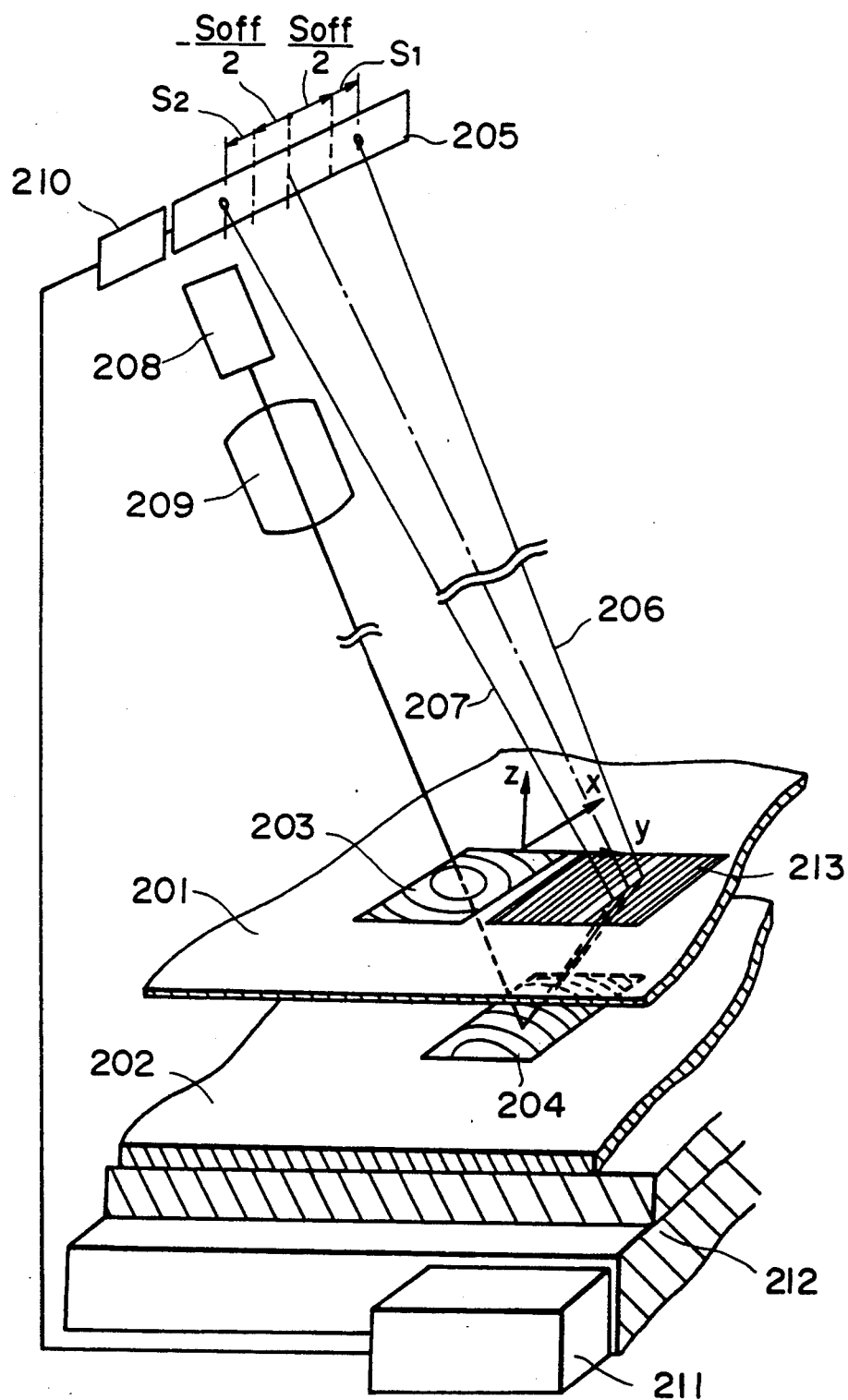
FIG. 39 is a perspective view schematically showing a major part of a nineteenth embodiment of the present invention.

FIG. 39 is a perspective view of a major part of a nineteenth embodiment of the present invention. In this embodiment, the invention is applied to a semiconductor device manufacturing printing apparatus. In FIG. 39, a mask (first object) 201 is provided with a first alignment mark 203 for light reception and an additional alignment mark 213 for light emission, while a wafer (second object) 202 is provided with a second alignment mark 204. The light from the second alignment mark 204 is returned substantially along the direction in which it has been projected. Thus, the arrangement allows light projection and light reception by using a single pick-up head.

The structure of the present embodiment is the same as that of the eighteenth embodiment, in respect to the portion up to the second alignment mark 204 of the wafer. However, it is different in the point that the optical system is arranged so that the light after it emanating from the second alignment mark 204 of the wafer is deflected, toward the detecting means 205, by a straight grating that forms the alignment mark 213 of the mask.

The sensitivity in regard to the positional deviation between the mask 201 and the wafer 202 as well as the effect of inclination of the wafer 202, are substantially the same as in the foregoing embodiment.

Figure 40:
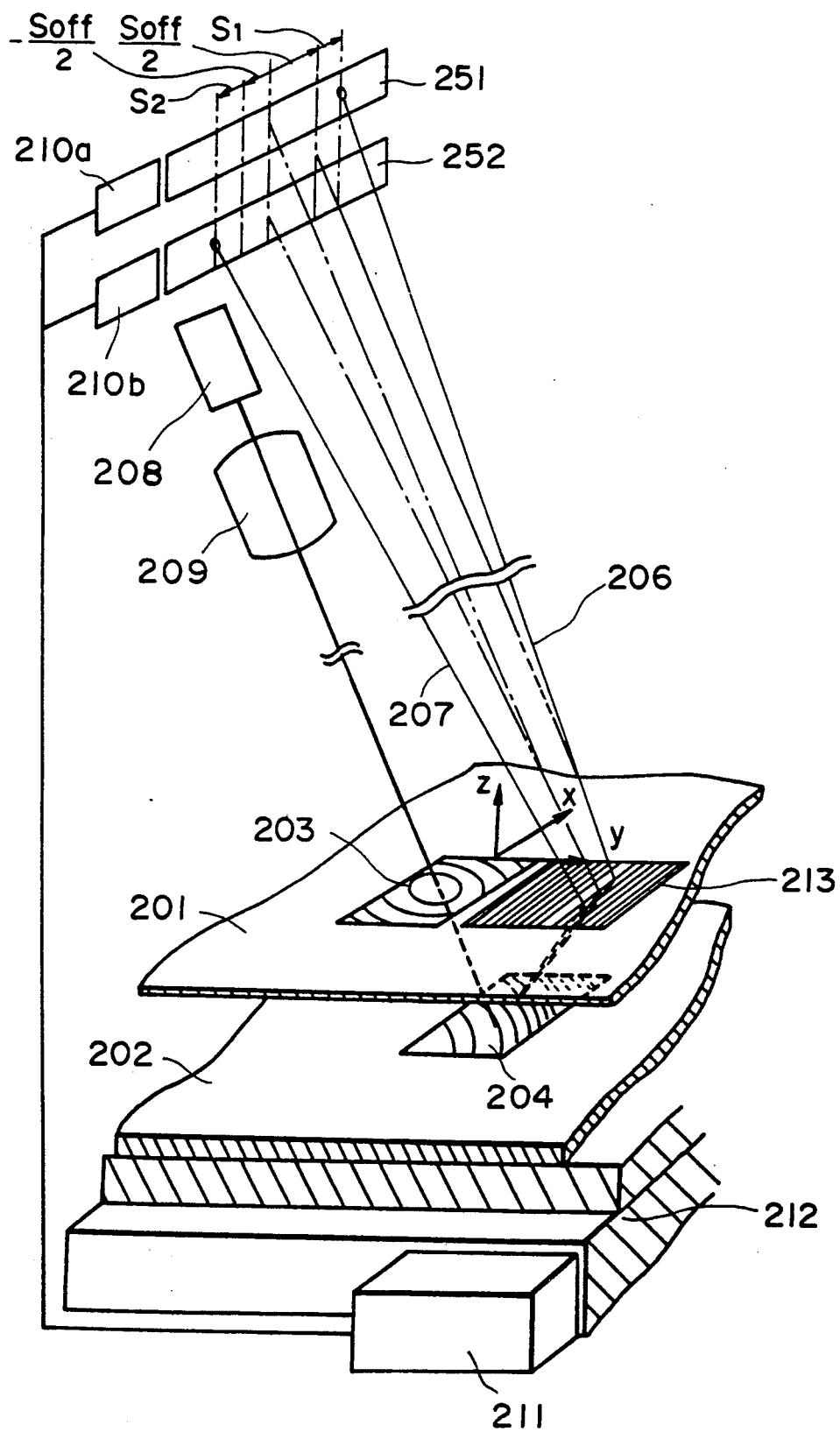
FIG. 40 is a perspective view schematically showing a major part of a twentieth embodiment of the present invention.

FIG. 40 is a perspective view of a major part of a twentieth embodiment of the present invention. In this embodiment, first and second alignment marks 203 and 204 provides a convex-concave system and a concave-convex system which produce alignment lights 206 and 207. These alignment lights are received separately by two detecting means 251 and 252, respectively, which are deviated in a direction perpendicular to the X direction (alignment direction).

In regard to the alignment direction, the present embodiment is the same as the eighteenth and nineteenth embodiments. However, in regard to the direction perpendicular to the alignment direction, the two systems have a difference corresponding to the difference in their light receiving portions. Namely, the sensitivity in regard to the positional deviation between the mask (first object) 201 and the wafer (second object) 202 is substantially the same as those in these embodiments, and if the deviation between the two systems is small, the effect of the inclination of the wafer 202 is substantially the same as in the foregoing embodiments.

Figure 41A:
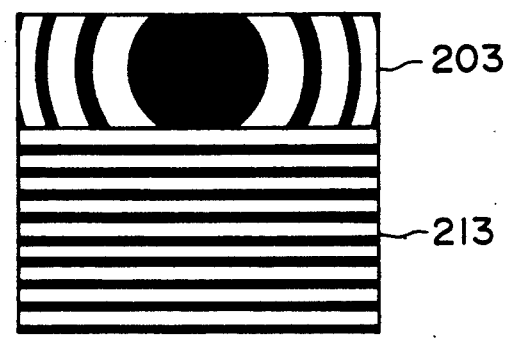
FIGS. 41A and 41B illustrate first and second alignment marks, respectively, usable in the present embodiment.
Figure 41B:
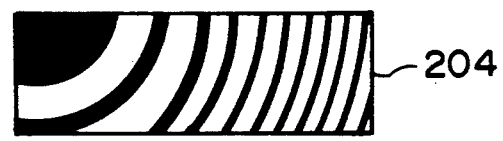
Figure 42:
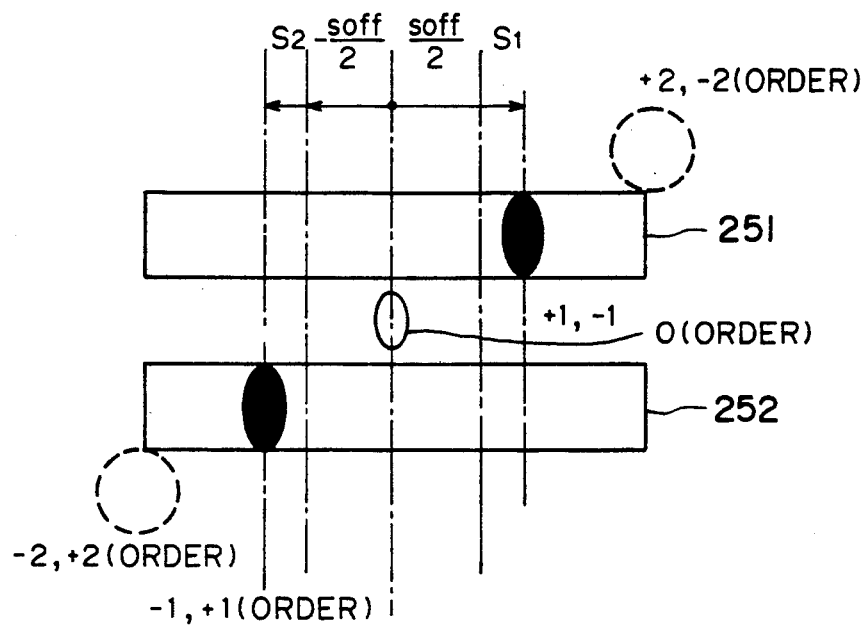
FIG. 42 is a schematic representation, showing a distribution of light spots formed on or to be formed on a detection surface.

FIG. 41A and 41B show examples of first and second alignment marks, and FIG. 42 illustrates an example of the distribution of lights on the surfaces of the detecting means 251 and 252. As shown in FIG. 42, in this embodiment, only those lights of a desired combination of orders can impinge on the respective detecting means 251 and 252. This makes the sensor processing easier.

Figure 43:
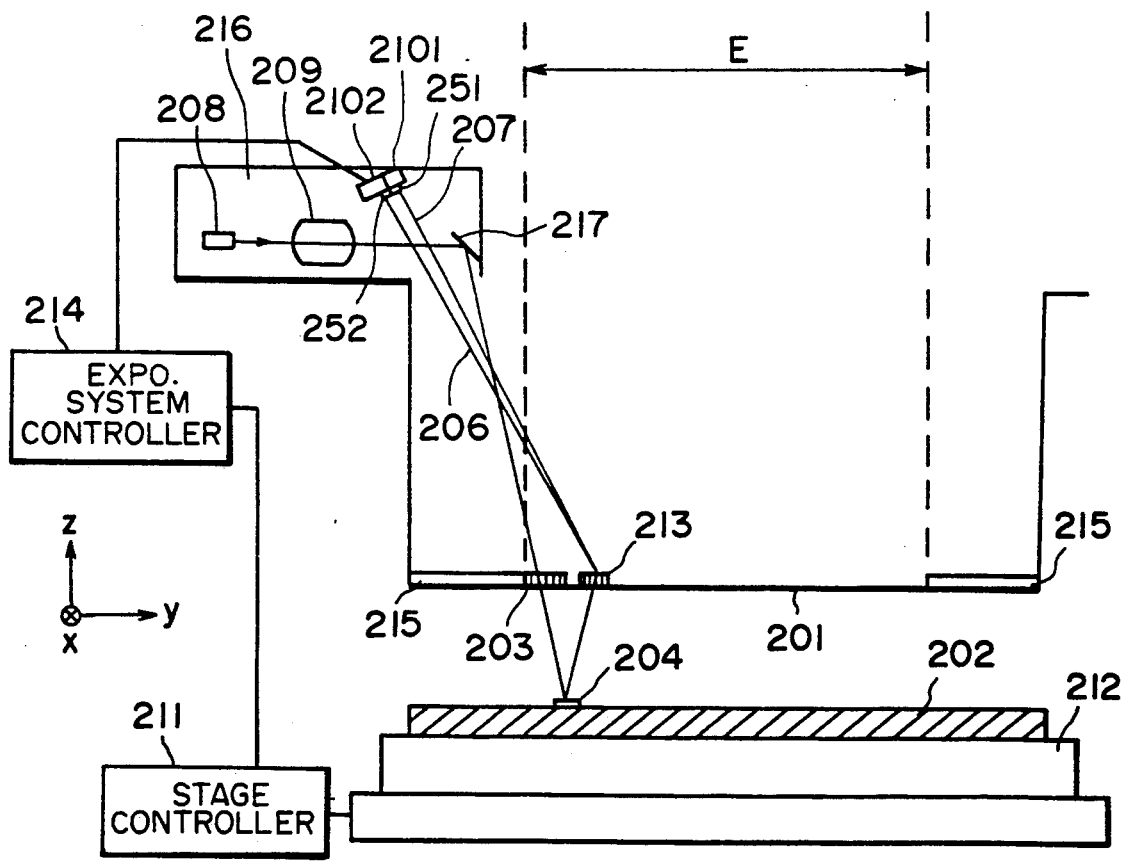
FIG. 43 is a schematic illustration of a major part of a proximity type exposure apparatus, to which the twentieth embodiment shown in FIG. 40 is incorporated.

FIG. 43 is a schematic representation of a major part of a semiconductor device manufacturing exposure apparatus of proximity type, into which the alignment device of the twentieth embodiment shown in FIG. 40 is incorporated. FIG. 43 illustrates the structure as a whole and shows a light projecting system and a light receiving system in a central section. The light projecting and light receiving systems are accommodated in a pick-up head 216 in which an alignment light source 208, a light projecting lens 209, a projecting mirror 217 and detecting means 251 and 252 as well as processing circuits 2101 and 2102 are mounted as a unit, whereby the structure as a whole can be moved to the alignment mark position by means of a movable stage, not shown. The alignment light projected from the pick-up head 216 is diffracted by a first alignment mark 203 of a mask 201 supported by a mask holder 215, and is again diffracted by a second alignment mark 204 on a wafer 202 supported by a wafer stage 212 and, subsequently, it is diffracted by an alignment mark 213 for light emission as provided on the mask 201, and it goes again into the pick-up head 216 to be received by the detecting means 251 and 252. The information concerning the spot of lights as received by the detecting means 251 and 252 is transmitted by way of the processing circuits 2101 and 2102 to an exposure system controller 214 and is recognized thereby as alignment information related to the mask 201 and the wafer 202. In response, a movement signal is supplied to a stage controller 211 for moving the wafer stage to a correct position for exposure, whereby the wafer stage 212 is moved.

After the alignment is completed, an exposure beam is projected through an exposure region as denoted at E, whereby the printing is made. At this time, since the alignment light is effective to define an inclined light projection system and an inclined light reception system, no retracting motion is necessary.

While the invention has been described with reference to the structures disclosed herein, it is not confined to the details set forth and this application is intended to cover such modifications or changes as may come within the purposes of the improvements or the scope of the following claims.

What is claimed is:

1. A device, usable with first and second opposed objects each having at least one diffraction grating, for detecting a positional relationship between the first and second objects in a direction perpendicular to the direction in which the objects are opposed, said device comprising:

light source means for projecting light to a diffraction grating of one of the first and second objects;

first detecting means for detecting a first light spot diffracted by diffraction gratings of the first and second objects, wherein the position of incidence of the first light spot changes with a change in the relative position of the first and second objects in the perpendicular direction;

second detecting means for detecting a second light spot diffracted by diffraction gratings of the first and second objects, wherein the position of incidence of the second light spot changes with a change in the relative position of the first and second objects in the perpendicular direction, the change in the position of incidence of the first and second light spots being different from one another; and position detecting means for detecting the relative position of the first and second objects, in accordance with the detection by said first and second detecting means;

wherein said first and second light spots are produced by light diffracted, at different orders, by the same diffraction grating of one of the first and second objects and by light diffracted, at the same order, by different portions of the other one of the first and second objects.

2. A device according to claim 1, wherein the first and second light spots are produced by light further diffracted, at different orders, by the same linear grating lens provided on one of the first and second objects.

3. A device according to claim 1, wherein the first and second light spots are produced by light further diffracted, at different orders, on the same diffraction grating of the first object and on the same diffraction grating of the second object.

4. A method of detecting a positional relationship between opposed first and second objects, in a direction perpendicular to the direction in which the objects are opposed, said method comprising the steps of:

providing the first and second objects with diffraction gratings;

projecting light to a diffraction grating of one of the first and second objects;

detecting, by a first sensor, a first light spot diffracted by diffraction gratings of one of the first and second objects, wherein the position of incidence of the first light spot changes with a change in the relative position of the first and second objects in the perpendicular direction;

detecting, by a second sensor, a second light spot diffracted by diffraction gratings of the first and second objects, wherein the position of incidence of the second light spot changes with a change in the relative position of the first and second objects in the perpendicular direction, the change in the position of incidence of the first and second light spots being different from one another; and detecting the relative position of the first and second objects in accordance with the detection of the first and second light spots by the first and second sensors;

wherein the first and second light spots are produced by light diffracted, at different orders, by the same diffraction grating of one of the first and second objects and by light diffracted, at the same order, by different portions of the other one of the first and second objects.

5. A method according to claim 4, wherein the first and second light spots are produced by light further diffracted, at different orders, by the same linear grating lens of one of the first and second objects.

6. A method according to claim 4, wherein the first and second light spots are produced by light further diffracted, at different orders, by the same diffraction grating of the first object and the same diffraction grating of the second object.

7. A device, usable with first and second objects opposed to each other in a first direction and each having at least one diffraction grating, for detecting a positional relationship between the objects in a second direction perpendicular to the first direction, said device comprising:

a light source for projecting light to the first and second objects;

photodetecting means comprising a light receiving surface for detecting a first light pattern produced by light diffracted by diffraction gratings of the first and second objects, wherein the position of incidence of the first light pattern on said light receiving surface changes with a change in the relative position of the first and second objects in the second direction, said photodetecting means further comprising means for detecting a second light pattern produced by light diffracted by diffraction gratings of the first and second objects, wherein the position of incidence of the second light pattern on said light receiving surface changes with a change in the relative position of the first and second objects in the second direction, the change in the position of incidence of the first and second light patterns being different from one another; and position detecting means for detecting the relative position of the first and second objects in accordance with the detection of the first and second light patterns by said photodetecting means;

wherein the first and second light patterns are produced by light diffracted, at different orders, by the same diffraction grating of at least one of the first and second objects.

8. A method, usable with a first substrate including a first mark having an optical power and a second substrate including a second mark having an optical power, for detecting a positional deviation between the first and second substrates by using the first and second marks, wherein the first mark comprises a single grating pattern while the second mark comprises first and second different grating patterns, said method comprising the steps of:

projecting a radiation beam to each of the first and second substrates to produce first and second diffraction beams, wherein the first diffraction beam includes a beam resulting from diffraction of the radiation beam by the grating pattern of the first mark and the first grating pattern of the second mark and wherein the second diffraction beam includes a beam resulting from diffraction of the radiation beam by the grating pattern of the first mark and the second grating pattern of the second mark;

detecting positions of beam patterns respectively formed on a predetermined plane by the first and second diffraction beams; and determining the positional deviation between the first and second substrates on the basis of the detection in said detecting step, wherein the first and second marks are arranged so that the beam pattern formed by the first diffraction beam and the beam pattern formed by the second diffraction beam are shiftable relative to each other in substantially opposite directions in response to a detected positional deviation between the first and second substrates.

9. A method according to claim 8, wherein the first and second grating patterns of the second mark at least partially overlap one another.

10. A method according to claim 8, wherein the first and second grating patterns of the second mark are formed at different positions on the second substrate.

11. A method according to claim 8, wherein the grating pattern of the first mark and the first and second grating patterns of the second mark each comprise a zone plate.

12. An exposure apparatus, usable with a mask including a first mark having an optical power and a wafer including a second mark having an optical power, said apparatus being operable to (i) detect a positional deviation between the mask and the wafer by using the first and second marks, (ii) align the mask and the wafer on the basis of the detection, and (iii) expose the wafer to a circuit pattern of the mask, wherein the first mark comprises a single grating pattern while the second mark comprises first and second different grating patterns, said apparatus comprising:

positional deviation detecting means for detecting a positional deviation between the mask and the wafer, said detecting means comprising means for projecting a radiation beam to each of the mask and the wafer to respectively produce first and second diffraction beams, wherein the first diffraction beam includes a beam resulting from diffraction of the radiation beam by the grating pattern of the first mark and the first grating pattern of the second mark and the second diffraction beam includes a beam resulting from diffraction of the radiation beam by the grating pattern of the first mark and the second grating pattern of the second mark, said detecting means further comprising means for detecting positions of beam patterns respectively formed on a predetermined plane by the first and second diffraction beams and means for determining the positional deviation of the mask and the wafer on the basis of the detected beam pattern positions; and aligning means for correcting the positional deviation of the mask and the wafer as determined by said detecting means to align the mask and the wafer with each other, wherein the first and second marks are arranged so that the beam pattern formed by the first diffraction beam and the beam pattern formed by the second diffraction beam are shiftable relative to each other in substantially opposite directions in response to a detected positional deviation between the first and second substrates.

13. An exposure apparatus, usable with a mask including a first mark having an optical power and a wafer including a second mark having an optical power, said apparatus being operable to (i) detect a positional deviation between the mask and the wafer by using the first and second marks, (ii) align the mask and the wafer on the basis of the detection, and (iii) expose the wafer to a circuit pattern of the mask, wherein the first mark comprises first and second different grating patterns while the second mark comprises a single grating pattern, said apparatus comprising:

positional deviation detecting means for detecting a positional deviation between the mask and the wafer, said detecting means comprising means for projecting a radiation beam to each of the mask and the wafer to respectively produce first and second diffraction beams, wherein the first diffraction beam includes a beam resulting from diffraction of the radiation beam by the grating pattern of the first mark and the first grating pattern of the second mark and the second diffraction beam includes a beam resulting from diffraction of the radiation beam by the grating pattern of the first mark and the second grating pattern of the first mark, said detecting means further comprising means for detecting positions of beam patterns respectively formed on a predetermined plane by the first and second diffraction beams and means for determining the positional deviation of the mask and the wafer on the basis of the detected beam pattern positions; and aligning means for correcting the positional deviation of the mask and the wafer as determined by said detecting means to align the mask and the wafer with each other, wherein the first and second marks are arranged so that the beam pattern formed by the first diffraction beam and the beam pattern formed by the second diffraction beam are shiftable relative to each other in substantially opposite directions in response to a positional deviation between the first and second substrates.

14. A deviation detecting method, comprising:

providing a first object with a first grating pattern and a second object with second and third grating patterns;

generating a first light spot on the basis of a light beam diffracted by the first and second grating patterns and a second light spot on the basis of a light beam diffracted by the first and third grating patterns, wherein the first and second light spots have a positional relationship that changes with the relative position of the first and second objects; and detecting the positional relationship between the first and second light spots.

15. A method according to claim 14, further comprising providing the second and third grating patterns at different positions on the second object.

16. A method according to claim 14, wherein the second and third grating patterns have different shapes.

17. A method according to claim 14, further comprising diffracting the light beam for forming the first light spot and the light beam for forming the second light spot by the first grating pattern at different diffraction orders.

18. A method according to claim 17, further comprising diffracting in light beam forming the first light spot by the first grating pattern in a positive first order direction and diffracting the light beam forming the second light spot by the first grating pattern in a negative first order direction.

19. A method according to claim 17, further comprising providing the second and third grating patterns at different positions on the second object.

20. A method according to claim 17, wherein the second and third grating patterns have different shapes.

21. A method according to claim 14, further comprising adjusting the relative position of the first and second objects on the basis of the detection in said detecting step.

* * * * *

UNITED STATES PATENT AND TRADEMARK OFFICE
CERTIFICATE OF CORRECTION

PATENT NO. : 5,160,848
DATED : November 3, 1992
INVENTOR(S) : Kenji Saitoh, et al.

It is certified that error appears in the above-identified patent and that said Letters Patent is hereby corrected as shown below:

COLUMN 1

Line 7, "Jun. 12, 1981," should read --Jun. 12, 1991,--.

COLUMN 8

Line 20, "geometo-" should read --geometro- --.

COLUMN 12

Line 11, "o" should read --of--.

COLUMN 15

Line 25, " "x75.7085" " should read --"x175.7085"--.

COLUMN 19

Line 15, "geometo-optically" should read --geometro-optically--.

COLUMN 21

Line 68, "on" (second occurrence) should read --an--.

UNITED STATES PATENT AND TRADEMARK OFFICE
CERTIFICATE OF CORRECTION

PATENT NO. : 5,160,848

DATED : November 3, 1992

INVENTOR(S) : Kenji Saitoh, et al.

Page 2 of 3

It is certified that error appears in the above-identified patent and that said Letters Patent is hereby corrected as shown below:

COLUMN 22

Line 18, "$S_2-S_2$" should read --$S_2-S_1$--; and
Line 59, "a" (second occurrence) should be deleted.

COLUMN 27

Line 39, "0 202" should read --202--.

COLUMN 28

Line 3, "$S_1$" should read --S1--; and
Line 7, "$b1=[f_W(g-f_M)/(-g+f_M-f_W)$" should read
--$b1=[f_W(g-f_M)]/(-g+f_M-f_W)$--.

COLUMN 29

Line 61, "geometo-optic" should read
--geometro-optic--.

COLUMN 31

Line 33, "it" should be deleted.

UNITED STATES PATENT AND TRADEMARK OFFICE
CERTIFICATE OF CORRECTION

PATENT NO. : 5,160,848
DATED : November 3, 1992
INVENTOR(S) : Kenji Saitoh, et al.

It is certified that error appears in the above-identified patent and that said Letters Patent is hereby corrected as shown below:

COLUMN 36

Line 3, "first mark" should read --second mark-- and "second" should read --first--;
    Line 6, "first" should read --second--; and
    Line 49, "in" should read --the--.

Signed and Sealed this

Thirtieth Day of November, 1993

Attest:

BRUCE LEHMAN

Attesting Officer    Commissioner of Patents and Trademarks